(12) United States Patent
Huang et al.

(10) Patent No.: US 11,527,649 B1
(45) Date of Patent: Dec. 13, 2022

(54) FERROELECTRIC FIELD EFFECT TRANSISTOR DEVICES AND METHODS FOR FORMING THE SAME

(71) Applicant: Taiwan Semiconductor Manufacturing Company Limited, Hsinchu (TW)

(72) Inventors: Yen-Chieh Huang, Hsinchu (TW); Po-Ting Lin, Hsinchu (TW); Hai-Ching Chen, Hsinchu (TW); Song-Fu Liao, Hsinchu (TW); Yu-Ming Lin, Hsinchu (TW); Chung-Te Lin, Tainan (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 17/460,386

(22) Filed: Aug. 30, 2021

(51) Int. Cl.
| | |
|---|---|
| *H01L 29/78* | (2006.01) |
| *H01L 29/66* | (2006.01) |
| *H01L 27/1159* | (2017.01) |
| *H01L 21/28* | (2006.01) |
| *H01L 21/223* | (2006.01) |
| *H01L 29/51* | (2006.01) |

(52) U.S. Cl.
CPC .... *H01L 29/78391* (2014.09); *H01L 21/2236* (2013.01); *H01L 27/1159* (2013.01); *H01L 29/40111* (2019.08); *H01L 29/516* (2013.01); *H01L 29/6684* (2013.01)

(58) Field of Classification Search
CPC ........... H01L 29/78391; H01L 21/2236; H01L 27/1159; H01L 29/40111; H01L 29/516; H01L 29/6684

USPC ............................................... 257/295; 438/3
See application file for complete search history.

(56) References Cited

U.S. PATENT DOCUMENTS

| | | | |
|---|---|---|---|
| 10,700,093 B1* | 6/2020 | Kalitsov | G11C 11/2275 |
| 2006/0118844 A1* | 6/2006 | Kijima | H01L 29/516 |
| | | | 257/295 |
| 2007/0126042 A1* | 6/2007 | Kijima | H01L 27/11502 |
| | | | 257/295 |
| 2009/0173978 A1* | 7/2009 | Kato | H01L 27/1159 |
| | | | 257/E29.264 |
| 2015/0171183 A1* | 6/2015 | Sakai | H01L 29/517 |
| | | | 257/295 |
| 2015/0214322 A1* | 7/2015 | Mueller | H01L 29/6684 |
| | | | 257/532 |
| 2015/0380511 A1* | 12/2015 | Irsigler | H01L 29/78391 |
| | | | 257/295 |
| 2016/0035856 A1* | 2/2016 | van Bentum | H01L 29/516 |
| | | | 257/295 |
| 2016/0056301 A1* | 2/2016 | Lee | H01L 29/42352 |
| | | | 257/295 |

(Continued)

*Primary Examiner* — Sheikh Maruf
(74) *Attorney, Agent, or Firm* — Marbury Law Group, PLLC

(57) ABSTRACT

Ferroelectric structures, including a ferroelectric field effect transistors (FeFETs), and methods of making the same are disclosed which have improved ferroelectric properties and device performance. A FeFET device including a ferroelectric material gate dielectric layer and a metal oxide semiconductor channel layer is disclosed having improved ferroelectric characteristics, such as increased remnant polarization, low defects, and increased carrier mobility for improved device performance.

20 Claims, 53 Drawing Sheets

(56) References Cited

U.S. PATENT DOCUMENTS

| | | | |
|---|---|---|---|
| 2016/0064510 A1* | 3/2016 | Mueller | H01L 29/66545 |
| | | | 257/295 |
| 2016/0071947 A1* | 3/2016 | Wiatr | H01L 29/516 |
| | | | 257/295 |
| 2016/0172396 A1* | 6/2016 | Masuda | H01L 27/14658 |
| | | | 257/295 |
| 2019/0108998 A1* | 4/2019 | Mueller-Meskamp | H01L 29/517 |

* cited by examiner

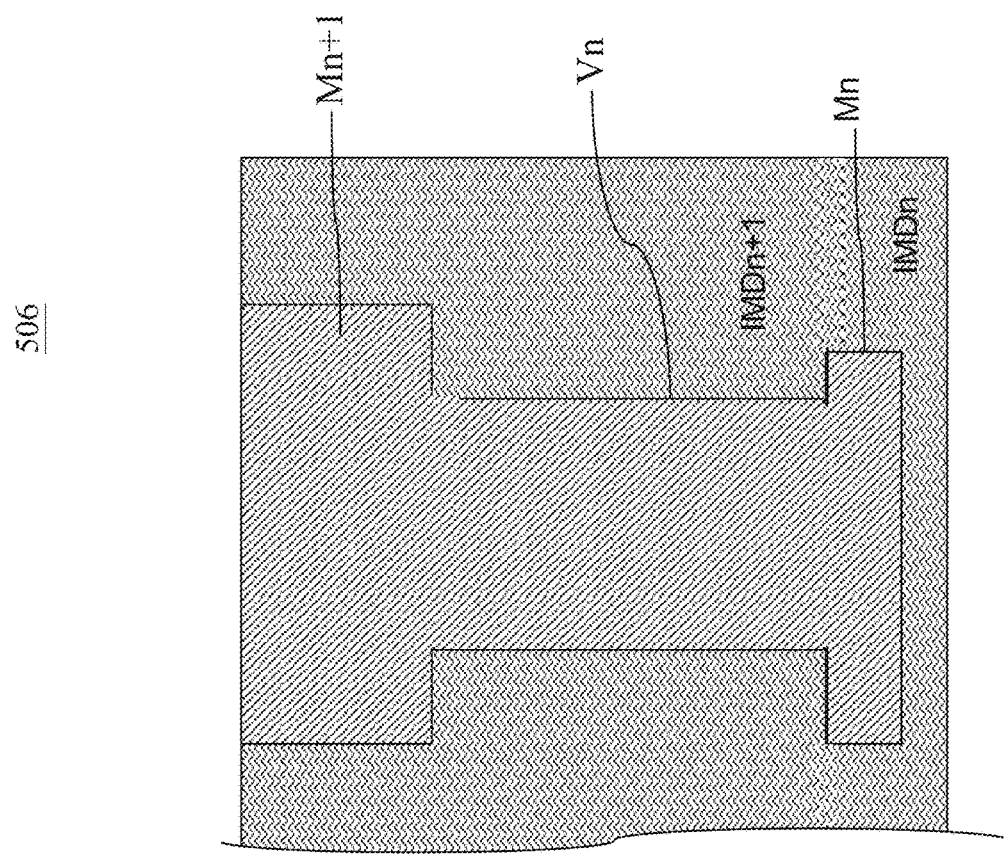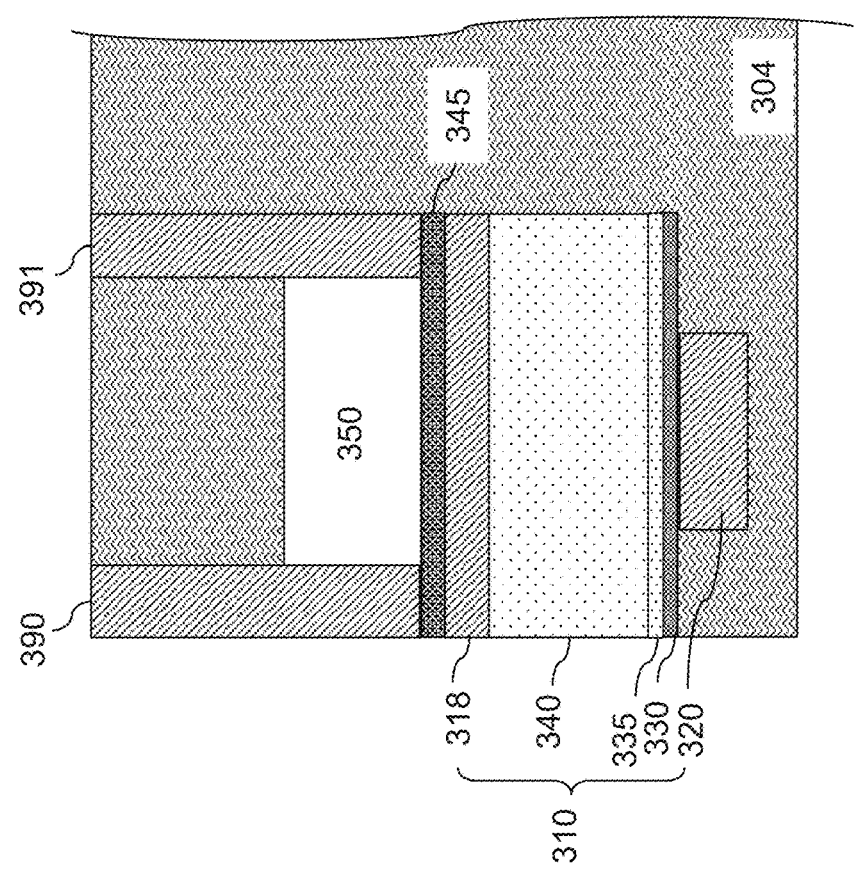
FIG. 29

FERROELECTRIC FIELD EFFECT TRANSISTOR DEVICES AND METHODS FOR FORMING THE SAME

BACKGROUND

Ferroelectric (FE) memory is a candidate for next generation non-volatile memory benefits due to its fast write/read speed, low power consumption and small size. However, it may be difficult to integrate FE materials with commonly utilized semiconductor device materials and structures while maintaining suitable ferroelectric properties and device performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 29 is a vertical cross-section view showing an MFMIS FET memory structure and metal interconnect features located within inter-metal dielectric (IMD) layers according to an embodiment of the present disclosure.

DETAILED DESCRIPTION

Figure 1A:
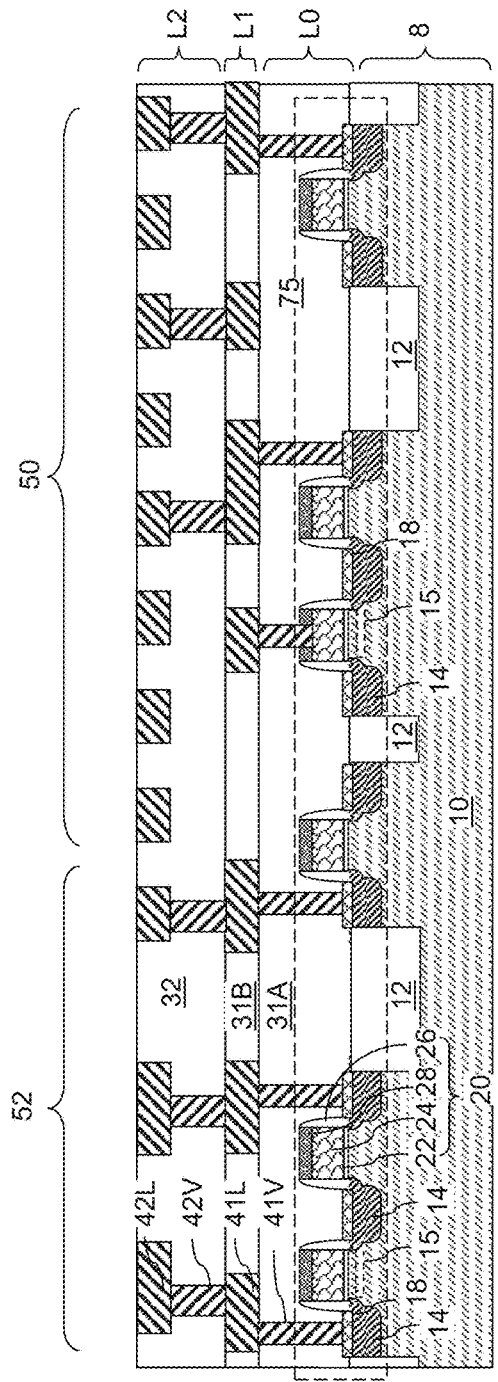
FIG. 1A is a vertical cross-sectional view of a first exemplary structure prior to formation of an array of thin film transistors (TFTs) according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

The present disclosure is directed to ferroelectric (FE) structures, including metal-ferroelectric-semiconductor (MFS) structures and metal-ferroelectric-metal-insulator-semiconductor (MFMIS) structures, and specifically, to memory cells, transistors, and memory structures that include FE materials.

Various embodiments are directed to ferroelectric field effect transistor (FeFET) structures and methods for making the same. FeFETs are emerging devices, in which a FE layer is utilized as a gate insulating layer between a gate electrode and a channel region of a semiconductor material layer. Permanent electrical field polarization in the FE layer causes this type of device to retain the transistor's state (on or off) in the absence of any electrical bias.

A ferroelectric material is a material that may have spontaneous nonzero electrical polarization (i.e., non-zero total electrical dipole moment) when the external electrical field is zero. The spontaneous electrical polarization may be reversed by a strong external electric field applied in the opposite direction. The electrical polarization is dependent not only on the external electrical field at the time of measurement, but also on the history of the external electrical field, and thus, has a hysteresis loop. The maximum of the electrical polarization is referred to as saturation polarization. The electrical polarization that remains after an external electrical field that induces saturation polarization is no longer applied (i.e., turned off) is referred to as remnant polarization. The magnitude of the electrical field that needs to be applied in the opposite direction of the remnant polarization in order to achieve zero polarization is referred to as coercive electrical field.

In some embodiments, a ferroelectric (FE) structure, such as a FeFET structure, may form a memory cell of a memory array. In a FeFET-based memory cell, the FE material located between the gate electrode and the channel region of the semiconductor material layer may have two stable remnant polarization states. In one remnant polarization state, the FeFET may be permanently in an "on" state, and in the other remnant polarization state, the FeFET may be permanently in an "off" state. Thus, the polarization state of the FE layer may be used to encode information (i.e., bits) in a non-volatile manner. The logic state of the FeFET-based memory cell may be read non-destructively by sensing the resistance across the terminals (e.g., source and drain terminals) of the FeFET. To re-program the FeFET-based memory cell, a sufficiently high voltage may be applied to the FeFET to induce the polarization state of the FE material to reverse and thereby change the logic state of the FeFET memory cell.

For the purposes of forming ferroelectric-based memory devices, it is generally desirable to have high remnant polarization and high coercive electrical field. High remnant polarization may increase the magnitude of an electrical signal. A high coercive electrical field makes the memory devices more stable against perturbations caused by noise-level electrical field and interferences.

The fabrication of FeFETs using thin film transistor (TFT) technologies and structures, including the use of oxide semiconductors, is an attractive option for back-end-of-line (BEOL) integration since TFTs may be processed at low temperatures and thus, will not damage previously fabricated devices. However, to date it has proven difficult to integrate ferroelectric gate oxides with oxide semiconductor channels while maintaining adequate ferroelectric properties and device performance.

Accordingly, various embodiments provide ferroelectric structures, including ferroelectric field effect transistors (FeFETs), and methods of forming ferroelectric structures, having improved ferroelectric properties and device performance, particular, various embodiments include FeFET devices having ferroelectric material gate dielectric layers and metal oxide semiconductor channel layers. Various embodiments may provide a FeFET device having improved ferroelectric characteristics, such as increased remnant polarization, and semiconductor channel layers characterized by low defects and increased carrier mobility for improved device performance.

FIG. 1A is a vertical cross-sectional view of a first exemplary structure prior to formation of an array of memory devices according to an embodiment of the present disclosure. Referring to FIG. 1A, a first exemplary structure according to an embodiment of the present disclosure is illustrated prior to formation of an array of memory structures, according to various embodiments of the present disclosure. The first exemplary structure includes a substrate 8 that contains a semiconductor material layer 10. The substrate 8 may include a bulk semiconductor substrate such as a silicon substrate in which the semiconductor material layer continuously extends from a top surface of the substrate 8 to a bottom surface of the substrate 8, or a semiconductor-on-insulator layer including the semiconductor material layer 10 as a top semiconductor layer overlying a buried insulator layer (such as a silicon oxide layer). The exemplary structure may include various devices regions, which may include a memory array region 50 in which at least one array of non-volatile memory cells may be subsequently formed.

The exemplary structure may also include a peripheral logic region 52 in which electrical connections between each array of non-volatile memory cells and a peripheral circuit including field effect transistors may be subsequently formed. Areas of the memory array region 50 and the logic region 52 may be employed to form various elements of the peripheral circuit.

Semiconductor devices such as field effect transistors (FETs) may be formed on, and/or in, the semiconductor material layer 10 during a front-end-of-line (FEOL) operation. For example, shallow trench isolation structures 12 may be formed in an upper portion of the semiconductor material layer 10 by forming shallow trenches and subsequently filling the shallow trenches with a dielectric material such as silicon oxide. Other suitable dielectric materials are within the contemplated scope of disclosure. Various doped wells (not expressly shown) may be formed in various regions of the upper portion of the semiconductor material layer 10 by performing masked ion implantation processes.

Gate structures 20 may be formed over the top surface of the substrate 8 by depositing and patterning a gate dielectric layer, a gate electrode layer, and a gate cap dielectric layer. Each gate structure 20 may include a vertical stack of a gate dielectric 22, a gate electrode 24, and a gate cap dielectric 28, which is herein referred to as a gate stack (22, 24, 28). Ion implantation processes may be performed to form extension implant regions, which may include source extension regions and drain extension regions. Dielectric gate spacers 26 may be formed around the gate stacks (22, 24, 28). Each assembly of a gate stack (22, 24, 28) and a dielectric gate spacer 26 constitutes a gate structure 20. Additional ion implantation processes may be performed that use the gate structures 20 as self-aligned implantation masks to form deep active regions. Such deep active regions may include deep source regions and deep drain regions. Upper portions of the deep active regions may overlap with portions of the extension implantation regions. Each combination of an extension implantation region and a deep active region may constitute an active region 14, which may be a source region or a drain region depending on electrical biasing. A semiconductor channel 15 may be formed underneath each gate stack (22, 24, 28) between a neighboring pair of active regions 14. Metal-semiconductor alloy regions 18 may be formed on the top surface of each active region 14. Field effect transistors may be formed on the semiconductor material layer 10. Each field effect transistor may include a gate structure 20, a semiconductor channel 15, a pair of active regions 14 (one of which functions as a source region and another of which functions as a drain region), and optional metal-semiconductor alloy regions 18. Complementary metal-oxide-semiconductor (CMOS) circuits 75 may be provided on the semiconductor material layer 10, which may include a periphery circuit for the array(s) of transistors, such as thin film transistors (TFTs), and memory devices to be subsequently formed.

Various interconnect-level structures may be subsequently formed, which are formed prior to formation of an array of fin back gate field effect transistors and are herein referred to as lower interconnect-level structures (L0, L1, L2). In case a two-dimensional array of TFTs and memory devices are to be subsequently formed over two levels of interconnect-level metal lines, the lower interconnect-level structures (L0, L1, L2) may include a contact-level structure L0, a first interconnect-level structure L1, and a second interconnect-level structure L2. The contact-level structure L0 may include a planarization dielectric layer 31A including a planarizable dielectric material such as silicon oxide and various contact via structures 41V contacting a respective one of the active regions 14 or the gate electrodes 24 and formed within the planarization dielectric layer 31A. The first interconnect-level structure L1 includes a first interconnect level dielectric (ILD) layer 31B and first metal lines 41L formed within the first ILD layer 31B. The first ILD layer 31B is also referred to as a first line-level dielectric layer. The first metal lines 41L may contact a respective one of the contact via structures 41V. The second interconnect-level structure L2 includes a second ILD layer 32, which may include a stack of a first via-level dielectric material layer and a second line-level dielectric material layer or a line-and-via-level dielectric material layer. The second ILD layer 32 may have formed there within second interconnect-level metal interconnect structures (42V, 42L), which includes first metal via structures 42V and second metal lines 42L. Top surfaces of the second metal lines 42L may be coplanar with the top surface of the second ILD layer 32.

Figure 1B:
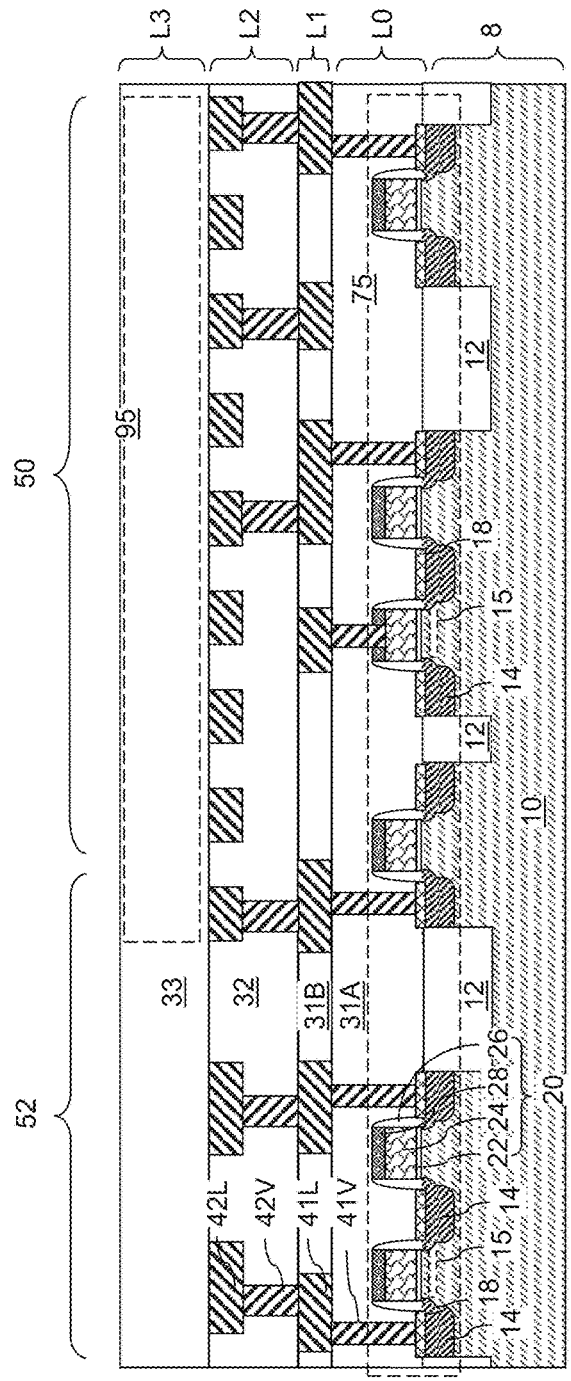
FIG. 1B is a vertical cross-sectional view of the first exemplary structure during formation of the array of fin back gate field effect transistors according to an embodiment of the present disclosure.

FIG. 1B is a vertical cross-sectional view of the first exemplary structure during formation of an array of ferroelectric-based devices, such as TFT FeFET memory cells, according to an embodiment of the present disclosure. Referring to FIG. 1B, an array 95 of non-volatile memory cells, such as TFT FeFET devices, may be formed in the memory array region 50 over the second interconnect-level structure L2. The details for the structure and the processing steps for the array 95 of non-volatile memory cells are subsequently described in detail below. A third ILD layer 33 may be formed during formation of the array 95 of non-volatile memory cells. The set of all structures formed at the level of the array 95 of non-volatile memory cells is herein referred to as a third interconnect-level structure L3.

Figure 1C:
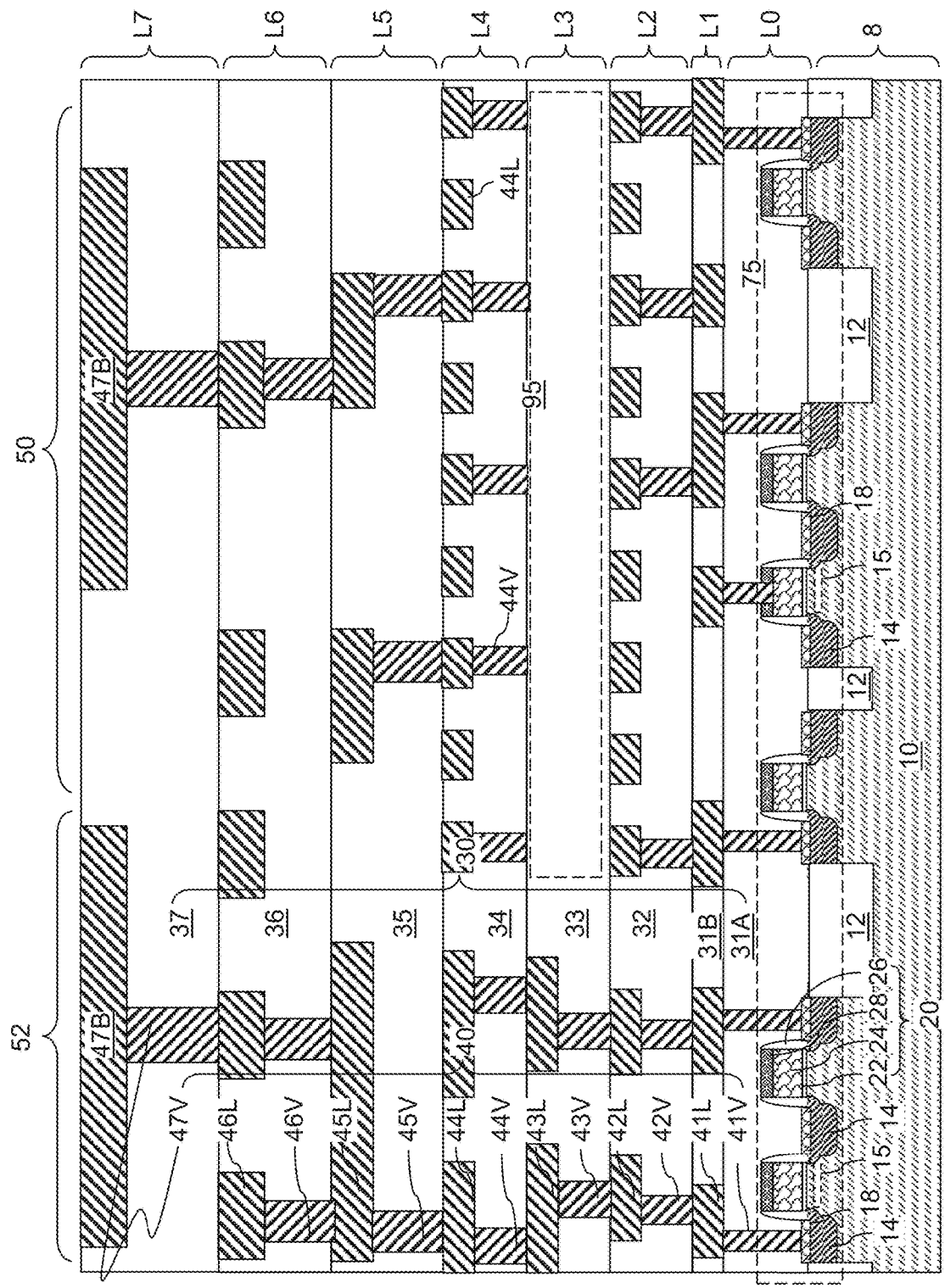
FIG. 1C is a vertical cross-sectional view of the first exemplary structure after formation of upper-level metal interconnect structures according to an embodiment of the present disclosure.

FIG. 1C is a vertical cross-sectional view of the first exemplary structure after formation of upper-level metal interconnect structures according to an embodiment of the present disclosure. Referring to FIG. 1C, third interconnect-level metal interconnect structures (43V, 43L) may be formed in the third ILD layer 33. The third interconnect-level metal interconnect structures (43V, 43L) may include second metal via structures 43V and third metal lines 43L. Additional interconnect-level structures may be subsequently formed, which are herein referred to as upper interconnect-level structures (L4, L5, L6, L7). For example, the upper interconnect-level structures (L4, L5, L6, L7) may include a fourth interconnect-level structure L4, a fifth interconnect-level structure L5, a sixth interconnect-level structure L6, and a seventh interconnect-level structure L7. The fourth interconnect-level structure L4 may include a fourth ILD layer 34 having formed therein fourth interconnect-level metal interconnect structures (44V, 44L), which may include third metal via structures 44V and fourth metal lines 44L. The fifth interconnect-level structure L5 may include a fifth ILD layer 35 having formed therein fifth interconnect-level metal interconnect structures (45V, 45L), which may include fourth metal via structures 45V and fifth metal lines 45L. The sixth interconnect-level structure L6 may include a sixth ILD layer 36 having formed therein sixth interconnect-level metal interconnect structures (46V, 46L), which may include fifth metal via structures 46V and sixth metal lines 46L. The seventh interconnect-level structure L7 may include a seventh ILD layer 37 having formed therein sixth metal via structures 47V (which are seventh interconnect-level metal interconnect structures) and metal bonding pads 47B. The metal bonding pads 47B may be configured for solder bonding (which may employ C4 ball bonding or wire bonding), or may be configured for metal-to-metal bonding (such as copper-to-copper bonding).

Each ILD layer may be referred to as an ILD layer 30. Each of the interconnect-level metal interconnect structures may be referred to as a metal interconnect structure 40. Each contiguous combination of a metal via structure and an overlying metal line located within a same interconnect-level structure (L2-L7) may be formed sequentially as two distinct structures by employing two single damascene processes, or may be simultaneously formed as a unitary structure employing a dual damascene process. Each of the metal interconnect structure 40 may include a respective metallic liner (such as a layer of TiN, TaN, or WN having a thickness in a range from 2 nanometers (nm) to 20 nm) and a respective metallic fill material (such as W, Cu, Co, Mo, Ru, other elemental metals, or an alloy or a combination thereof). Other suitable materials for use as a metallic liner and metallic fill material are within the contemplated scope of disclosure. Various etch stop dielectric layers and dielectric capping layers may be inserted between vertically neighboring pairs of ILD layers 30, or may be incorporated into one or more of the ILD layers 30.

While the present disclosure is described employing an embodiment in which the array 95 of non-volatile memory cells, such as TFT FeFET devices, may be formed as a component of a third interconnect-level structure L3, embodiments are expressly contemplated herein in which the array 95 of non-volatile memory cells may be formed as components of any other interconnect-level structure (e.g., L1-L7). Further, while the present disclosure is described using an embodiment in which a set of eight interconnect-level structures are formed, embodiments are expressly contemplated herein in which a different number of interconnect-level structures is used. In addition, embodiments are expressly contemplated herein in which two or more arrays 95 of non-volatile memory cells may be provided within multiple interconnect-level structures in the memory array region 50. While the present disclosure is described employing an embodiment in which an array 95 of non-volatile memory cells may be formed in a single interconnect-level structure, embodiments are expressly contemplated herein in which an array 95 of non-volatile memory cells may be formed over two vertically adjoining interconnect-level structures. Furthermore, embodiments are expressly contemplated herein in which an array 95 of non-volatile memory cells may be formed on or within the semiconductor material layer 10 (e.g., in a front-end-of-line (FEOL) operation).

Figure 2:
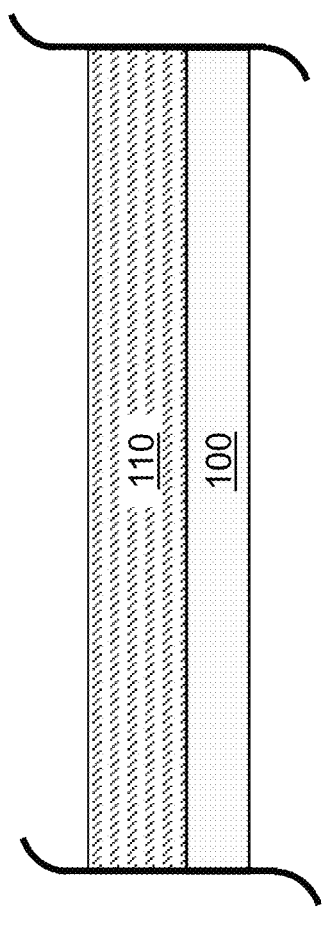
FIG. 2 is a vertical cross-sectional view of an exemplary structure during a process of forming a FeFET device including a first dielectric layer deposited over a substrate.

FIGS. 2-15 are sequential vertical cross-sectional views of an exemplary structure during a process of forming a FeFET device, such as a TFT FeFET device, according to various embodiments of the present disclosure. The FeFET device may form a memory cell of an array 95 of memory cells such as shown in FIG. 1C. Referring to FIG. 2, a first dielectric layer 110 may be deposited over a substrate 100. The substrate 100 may be any suitable substrate, such as a semiconductor device substrate, and may include control elements formed during FEOL processes. In some embodiments, one or more additional dielectric layers, such as ILD layers, may be deposited between the substrate 100 and the first dielectric layer 110. In such embodiments, the first dielectric layer 110 may be omitted. For example, ILD layer 33 discussed above with respect to FIGS. 1B and 1C may be deposited over or substituted for substrate 100.

The first dielectric layer 110 may be formed of any suitable dielectric material such as silicon oxide ($SiO_2$), or the like, or high-k dielectric materials such as silicon nitride ($SiN_4$), hafnium oxide ($HfO_2$), hafnium silicon oxide (HfSiO), hafnium tantalum oxide (HfTaO), hafnium titanium oxide (HfTiO), hafnium zirconium oxide ($Hf_{0.5}Zr_{0.5}O_2$), tantalum oxide ($Ta_2O_5$), aluminum oxide ($Al_2O_3$), hafnium dioxide-alumina ($HfO_2$—$Al_2O_3$), zirconium oxide ($ZrO_2$), or the like. In some embodiments, the first dielectric layer 110 may be a native oxide layer formed on the substrate 100. Other suitable dielectric materials may also be within the contemplated scope of disclosure.

The first dielectric layer 110 may be deposited using any suitable deposition process. Herein, suitable deposition processes may include chemical vapor deposition (CVD), physical vapor deposition (PVD), atomic layer deposition (ALD), high density plasma CVD (HDPCVD), metalorganic CVD (MOCVD), plasma enhanced CVD (PECVD), sputtering, laser ablation, or the like.

Figure 3:
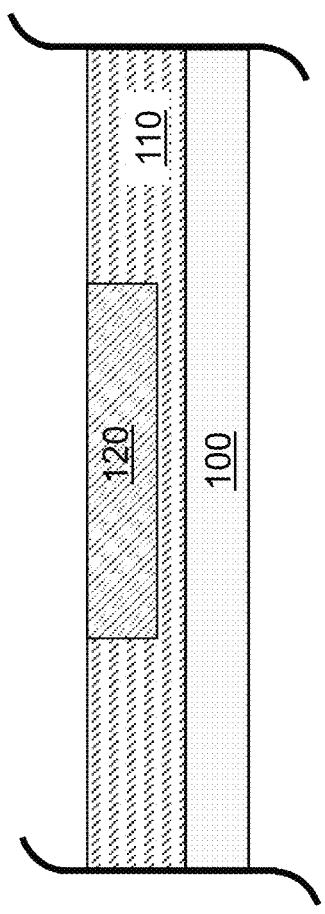
FIG. 3 is a vertical cross-section view of an exemplary structure during a process of forming a FeFET device showing a bottom electrode layer embedded in a first dielectric layer.

FIG. 3 is a vertical cross-section view of an exemplary structure showing a bottom electrode layer 120 embedded in the first dielectric layer 110. Referring to FIG. 3, a bottom electrode layer 120 may be deposited on the first dielectric layer 110. In embodiments, the bottom electrode layer 120 may be embedded in the first dielectric layer 110. For example, a photoresist layer (not shown) may be deposited over the first dielectric layer 110 and patterned using photolithographic techniques. The pattern of the photoresist layer may be transferred to the first dielectric layer 110 and thus, the first dielectric layer 110 may be patterned to form trenches. An electrically conductive material may be deposited in the trenches, and a planarization process may be performed to planarize upper surfaces of the bottom electrode layer 120 and the first dielectric layer 110.

Alternatively, the bottom electrode layer 120 may be deposited as a continuous electrode layer on the upper surface of the first electric layer 110, such that the continuous electrode layer contacts an upper surface of the first dielectric layer 110. Selected portions of the continuous electrode may be removed (e.g., by etching the continuous electrode layer through a patterned mask formed using photolithographic processes) to form one or more discrete patterned electrode layers 120 on the first dielectric layer 100. Then, additional dielectric material may be formed over the exposed surfaces of the first dielectric layer 110, the side surfaces of the patterned electrode layer, and optionally over the upper surface of the bottom electrode layer(s) 120 to embed the bottom electrode layer(s) 120 within the dielectric material. A planarization process may then be performed to planarize the upper surfaces of the bottom electrode layer 120 and the first dielectric layer 110 to provide a bottom electrode layer 120 embedded in a first dielectric layer 110 as shown in FIG. 3.

In other embodiments, the bottom electrode layer 120 may be embedded in a semiconductor material layer, such as semiconductor material layer 10 shown in FIGS. 1A-1C.

The bottom electrode layer 120 may include any suitable electrically conductive material, such as copper (Cu), aluminum (Al), zirconium (Zr), titanium (Ti), titanium nitride (TiN), tungsten (W), tantalum (Ta), tantalum nitride (TaN), molybdenum (Mo), ruthenium (Ru), palladium (Pd), platinum (Pt), cobalt (Co), nickel (Ni), iridium (Ir), iron (Fe), beryllium (Be), chromium (Cr), antimony (Sb), molybdenum (Mo), osmium (Os), thorium (Th), vanadium (V), alloys thereof, and combinations of the same. Other suitable materials for the bottom electrode layer 120 are within the contemplated scope of disclosure. In some embodiments, the material of the bottom electrode layer 120 may optionally have a lower coefficient of thermal expansion (CTE) than the CTE of a ferroelectric (FE) material layer that is subsequently formed over the bottom electrode layer 120. Utilizing a bottom electrode layer 120 having a lower CTE than the CTE of an overlying FE material layer may impart tensile stress on the FE material layer and improve ferroelectric properties of the FE material layer, as discussed in further detail below. In embodiments, the CTE of the material of the bottom electrode layer 120 may be less than $14 \times 10^{-6}$/K.

The bottom electrode layer 120 may be deposited using any suitable deposition process. For example, suitable deposition processes may include physical vapor deposition (PVD), sputtering, chemical vapor deposition (CVD), atomic layer deposition (ALD), plasma-enhanced chemical vapor deposition (PECVD), or combinations thereof. The thickness of the bottom electrode layer 120 may be in a range from 10 nm to 100 nm, although lesser and greater thicknesses may also be used.

Figure 4:
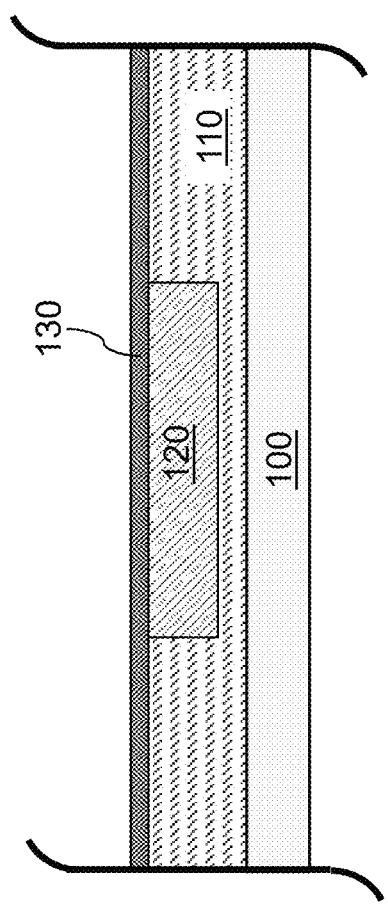
FIG. 4 is a vertical cross-section view of an exemplary structure during a process of forming a FeFET device showing an optional stress layer deposited over the upper surfaces of a bottom electrode layer and a first dielectric layer.

FIG. 4 is a vertical cross-section view of an exemplary structure showing an optional stress layer 130 deposited over the upper surfaces of the bottom electrode layer 120 and the first dielectric layer 110. Referring to FIG. 4, the optional stress layer 130 may include a metal oxide material that may function as a buffer layer for a ferroelectric material layer that is subsequently formed over the stress layer 130. The optional stress layer 130 may be a material having a lattice mismatch with the ferroelectric material that is subsequently formed over the stress layer 130 such that a tensile strain is induced in the ferromagnetic material layer. It is known that in many FE materials, such as hafnium zirconium oxide ($Hf_xZr_{1-x}O_y$, also referred to as "HZO"), small changes in the lattice parameters may result in a larger portion of the FE material having a desirable crystalline phase, such as an orthorhombic crystal phase, relative to other crystal phases, such as a monoclinic crystal phase. Tensile strain due to lattice mismatch between the stress layer 130 and the FE layer may provide a FE layer having improved ferroelectric properties, such as increased remnant polarization, $P_r$.

The optional stress layer 130 may include a metal oxide material such as $Ta_2O_5$, $K_2O$, $Rb_2O$, SrO, BaO, a-$V_2O_3$, a-$Cr_2O_3$, a-$Ga_2O_3$, a-$Fe_2O_3$, a-$Ti_2O_3$, a-$In_2O_3$, $YAlO_3$, $Bi_2O_3$, $Yb_2O_3$, $Dy_2O_3$, $Gd_2O_3$, $SrTiO_3$, $DyScO_3$, $TbScO_3$, $GdScO_3$, $NdScO_3$, $NdGaO_3$, $LaSrAlTaO_3$ (LSAT), and combinations of the same. In various embodiments, the stress layer 130 may include a multi-layer structure, including at least one layer comprised of $LaSrMnO_3$ (LMSO). For example, the stress layer 130 may include a bi-layer structure such as LSMO/$SrTiO_3$, LSMO/$DyScO_3$, LSMO/$TbScO_3$, LSMO/$GdScO_3$, LSMO/$NdScO_3$, LSMO/$NdGaO_3$, and LSMO/LSAT. Other suitable materials for the stress layer 130 are within the contemplated scope of disclosure. In various embodiments, the lattice constant $a_0$ of the optional stress layer 130 may be larger than the in-plane lattice constant of the material of the ferroelectric (FE) material layer that is subsequently formed over the stress layer 130 in order to induce tensile strain in the FE material layer.

The optional stress layer 130 may be deposited using any suitable deposition process. In various embodiments, the optional stress layer 130 may be deposited using atomic layer deposition (ALD) or pulsed laser deposition (PLD). In some embodiments, the optional stress layer 130 may be thermally annealed for 30 seconds to 10 minutes at temperatures between 300° C. and 700° C. to increase the crystallinity of the stress layer 130. Longer or shorter annealing times as well as higher or lower annealing temperatures may also be used. Alternatively or in addition, the stress layer 130 may be deposited as a quasi-single crystal metal oxide material using a suitable deposition technique (e.g., PLD). The thickness of the optional stress layer 130 may be in a range from 0.5 nm to 5 nm, although lesser and greater thicknesses may also be used.

Figure 5:
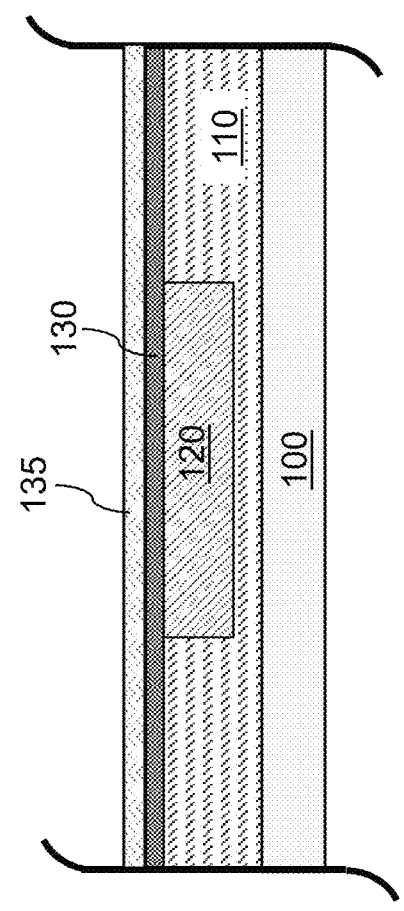
FIG. 5 is a vertical cross-section view of an exemplary structure during a process of forming a FeFET device showing an optional seed layer deposited over the upper surface of an optional stress layer.

FIG. 5 is a vertical cross-section view of an exemplary structure showing an optional seed layer 135 deposited over the upper surface of the optional stress layer 130. In embodiments in which the optional stress layer 130 is not present, the optional seed layer 135 may be deposited over the upper surfaces of the bottom electrode layer 120 and the first dielectric layer 110. The optional seed layer 135 (also referred to as a ferroelectrical promotional layer) may include a material configured to promote the formation of a desired crystal structure in a FE material layer that is subsequently formed thereon. For example, the seed layer 135 may promote the formation of cubic (c-phase), tetragonal (t-phase) and/or orthorhombic (o-phase) crystal phases relative to monoclinic crystal phases (m-phase) in the subsequently-formed FE material layer, and may also inhibit the transformation of t-phase crystal structures to m-phase crystal structures in the FE material layer. This may result in an FE material layer having improved ferroelectric properties, such as increased remnant polarization, $P_r$.

In various embodiments, the optional seed layer 135 may be a metal oxide material, such as zirconium oxide ($ZrO_2$), zirconium-yttrium oxide ($ZrO_2$—$Y_2O_3$), hafnium oxide ($HfO_2$), aluminum oxide ($Al_2O_3$), and hafnium zirconium oxide ($Hf_xZr_{1-x}O_2$, where $0 \leq x \leq 1$), and combinations of the same. Other suitable materials for the seed layer 135 are within the contemplated scope of disclosure. The seed layer 135 may include a single layer of metal oxide material, or multiple layers of metal oxide materials which may have different compositions. In various embodiments, the seed layer material may have a crystal structure including cubic, tetragonal and/or orthorhombic crystal phases.

The optional seed layer 135 may be deposited using any suitable deposition process. In various embodiments, the optional seed layer 135 may be deposited using atomic layer deposition (ALD) or pulsed laser deposition (PLD). In some embodiments, the optional seed layer 135 may be thermally annealed for 30 seconds to 10 minutes at temperatures between 300° C. and 700° C. to increase the crystallinity of the seed layer 135. In embodiments in which an optional stress layer 130 is present, the stress layer 130 and the seed layer 135 may be annealed at the same time or may be annealed in separate annealing steps. Alternatively or in addition, the seed layer 135 may be deposited as a quasi-single crystal metal oxide material using a suitable deposition technique (e.g., PLD). The thickness of the optional seed layer 135 may be in a range from 0.1 nm to 5 nm, although lesser and greater thicknesses may also be used.

Figure 6:
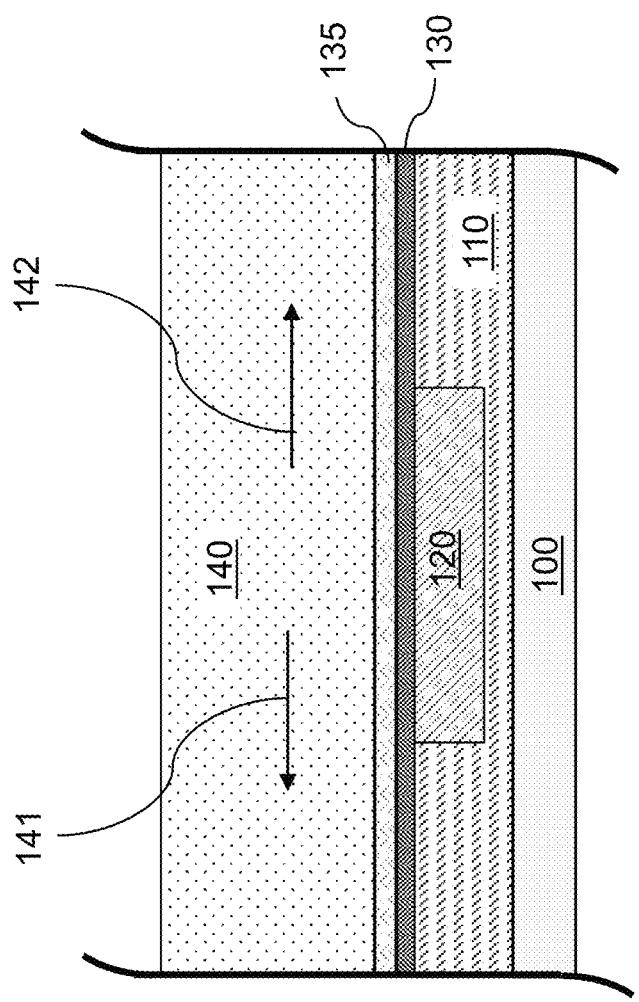
FIG. 6 is a vertical cross-section view of an exemplary structure during a process of forming a FeFET device showing a ferroelectric (FE) material layer deposited over the upper surface of an optional seed layer.

FIG. 6 is a vertical cross-section view of an exemplary structure showing a ferroelectric (FE) material layer 140 deposited over the upper surface of the optional seed layer 135. In embodiments in which the optional seed layer 135 is not present, the FE material layer 140 may be deposited over the upper surface of the optional stress layer 130. In embodiments in which neither the optional seed layer 135 nor the optional stress layer 130 are present, the FE material layer 140 may be deposited over the upper surfaces of the bottom electrode layer 120 and the first dielectric layer 110.

The FE material layer 140 may be formed of any suitable ferroelectric material. In various embodiments, the Fe material layer 140 may be hafnium oxide-based ferroelectric material, such as $Hf_xZr_{1-x}O_y$, where $0 \leq x \leq 1$ (e.g., $Hf_{0.5}Zr_{0.5}O_2$), $HfO_2$, HfSiO, HfLaO, etc. In various embodiments, the FE material layer 140 may be hafnium zirconium oxide (HZO) doped with atoms having a smaller ionic radius than hafnium (e.g., Al, Si, etc.) and/or doped with atoms having a larger ionic radius than hafnium (e.g., La, Sc, Ca, Ba, Gd, Y, Sr, etc.). The dopant(s) may be at a concentration configured to improve a ferroelectric property of the FE material layer 140, such as increasing the remnant polarization. In various embodiments, dopants having a smaller ionic radius than hafnium and/or dopants having a larger ionic radius than hafnium may have a doping concentration that is between about 1 mol. % and about 20 mol. %. In some embodiments, the FE material of the FE material layer 140 may include oxygen vacancies. Oxygen vacancies in the FE material may promote the formation of orthorhombic (o-phase) crystal phases in the Fe material layer 140.

In some embodiments, the FE material of the FE material layer 140 may include MN that is doped with Sc. Other suitable materials for the FE material layer 140 are within the contemplated scope of disclosure, including, without limitation, $ZrO_2$, $PbZrO_3$, $Pb[Zr_xTi_{1-x}]O_3$, $(0 \leq x \leq 1)$ (PZT), $Pb_{1-x}La_xZr_{1-y}Ti_yO_3$ (PLZT), $BaTiO_3$, $PbTiO_3$, $PbNb_2O_6$, $LiNbO_3$, $LiTaO_3$, $PbMg_{1/3}Nb_{2/3}O_3$ (PMN), $PbSc_{1/2}Ta_{1/2}O_3$ (PST), $SrBi_2Ta_2O_9$ (SBT), $Bi_{1/2}Na_{1/2}TiO_3$, and combinations thereof.

In embodiments, the FE material layer 140 may include a single layer of FE material, or multiple layers of FE materials which may have different compositions. In various embodiments, the FE material layer 140 may have a crystal structure including cubic, tetragonal and/or orthorhombic crystal phases. In embodiments, the FE material layer 140 may include a hafnium oxide-based ferroelectric material, such as $Hf_xZr_{x-1}O_y$, and may have a structure such that a volume of the FE material having a cubic, tetragonal and/or orthorhombic crystal structure is more than 50% greater than a volume of the FE material having a monoclinic crystal structure.

The FE material layer 140 may be deposited using any suitable deposition process. In various embodiments, the FE material layer 140 may be deposited using atomic layer deposition (ALD). The thickness of the FE material layer 140 may be in a range from 0.1 nm to 100 nm, although lesser and greater thicknesses may also be used.

In various embodiments, the FE material layer 140 may optionally be under a tensile strain in a direction that is parallel to the top and/or bottom surfaces of the FE material layer 140 (illustrated schematically by arrows 141 and 142 in FIG. 6). In embodiments, the FE material layer 140 may be subject to a tensile strain of between 1.5% and 3.0% over at least a portion of the FE material layer 140. As discussed above, subjecting the FE material layer 140 to a tensile strain may promote the formation and stability of crystal structures, such as orthorhombic crystal phases, that may increase the ferroelectric properties of the material, relative to other structures such as monoclinic crystal phases that may degrade the ferroelectric properties of the material. In various embodiments in which the optional stress layer 130 is present, tensile strain on the FE material layer 140 may be induced, at least in part, by a lattice mismatch between the stress layer 130 and the FE material layer 140. As discussed above, the lattice constant $a_0$ of the optional stress layer 130 may be larger than the in-plane lattice constant of the material of the ferroelectric (FE) material layer 140 in order to induce tensile strain in the FE material layer.

Alternatively, or in addition, tensile strain on the FE material layer 140 may be induced, at least in part, by a mismatch of the coefficient of thermal expansion (CTE) between the bottom electrode layer 120 and the FE material layer 140. As discussed above, in various embodiments the material of the bottom electrode layer 120 may have a lower CTE than the CTE of the material of the FE layer 140. For example, in embodiments in which the FE material layer 140 includes hafnium zirconium oxide (HZO), which has a CTE of $14 \times 10^{-6}$/K, the bottom electrode layer 120 may include material(s) having a CTE that is less than $14 \times 10^{-6}$/K. Suitable electrically conductive materials having a comparatively lower CTE include, without limitation, platinum (Pt), titanium (Ti), titanium nitride (TiN), tungsten (W), tantalum (Ta), tantalum nitride (TaN), iron (Fe), nickel (Ni), beryllium (Be), chromium (Cr), cobalt (Co), antimony (Sb), iridium (Ir), molybdenum (Mo), osmium (Os), thorium (Th), vanadium (V), alloys thereof, and combinations of the same. In various embodiments, tensile strain may be induced in the FE material layer 140 by subjecting the intermediate structure shown in FIG. 6 to an annealing process, which may include annealing the intermediate structure at a temperature between 400° C. and 700° C. for between 30 seconds and 5 minutes, followed by a cool down period. During the cool down period, the FE material layer 140 may shrink to a greater extent than the bottom electrode 120 due to the differential in CTE. This may stretch the FE material layer 140 in the direction of arrows 141 and 142 and thus subject the FE material layer 140 to a permanent tensile strain.

Figure 7:
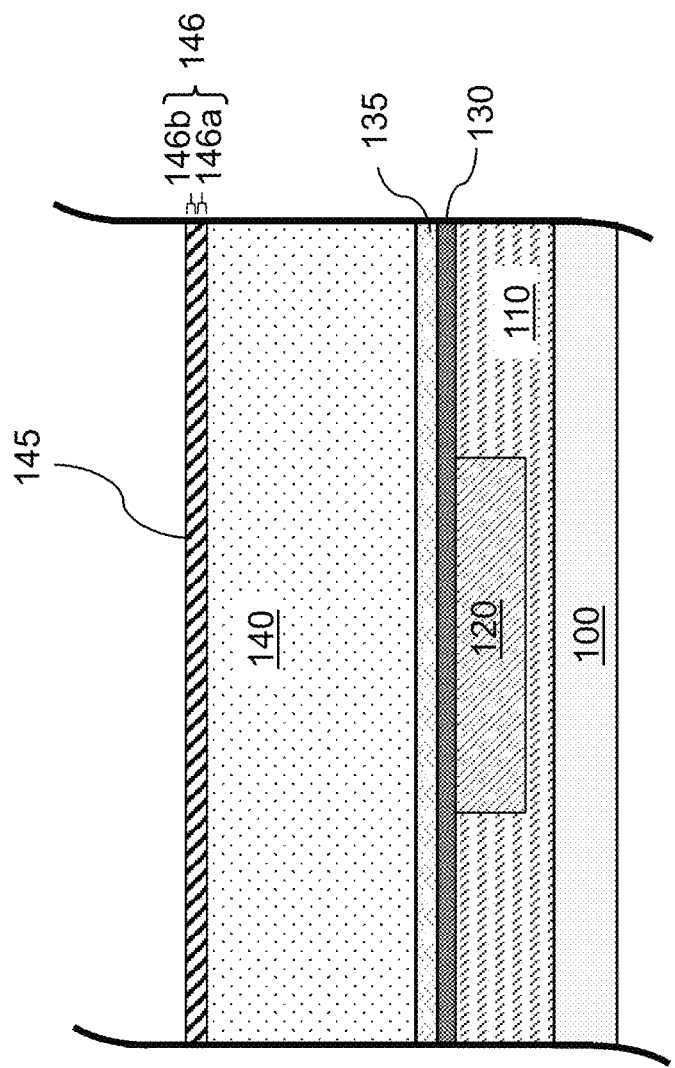
FIG. 7 is a vertical cross-section view of an exemplary structure during a process of forming a FeFET device showing an optional insulating layer deposited over the upper surface of a FE material layer.

FIG. 7 is a vertical cross-section view of an exemplary structure showing an optional insulating layer 145 deposited over the upper surface of the FE material layer 140. Referring to FIG. 7, the optional insulating layer 145 (also referred to as a "blocking" layer) may include a layer of dielectric material, such as a high-k dielectric material. Herein, high-k dielectric materials have a dielectric constant greater than 3.9 and may include, but are not limited to, hafnium oxide (HfO$_2$), hafnium silicon oxide (HfSiO$_4$), zirconium silicate (ZrSiO$_4$) hafnium tantalum oxide (HfTaO), hafnium titanium oxide (HfTiO), hafnium zirconium oxide (Hf$_x$Zr$_{x-1}$O$_y$) (HZO)), silicon nitride (SiN$_x$), tantalum oxide (Ta$_2$O$_5$), aluminum oxide (Al$_2$O$_3$), lanthanum aluminate (LaAlO$_3$), hafnium dioxide-alumina (HfO$_2$—Al$_2$O$_3$), zirconium oxide (ZrO$_2$), magnesium oxide (MgO), yttrium oxide (Y$_2$O$_3$), lanthanum oxide (La$_2$O$_3$), strontium oxide (SrO), gadolinium oxide (Gd$_2$O$_3$), calcium oxide (CaO), scandium oxide (Sc$_2$O$_3$), combinations thereof, or the like. In embodiments, the optional insulating layer 145 may include Si, Mg, Al, Y$_2$O$_3$, La, Sr, Gd, N, Sc, Ca etc., including any combination compound of Si, Mg, Al, Y$_2$O$_3$, La, Sr, Gd, N, Sc, Ca etc. Other suitable dielectric materials are within the scope of the present disclosure.

The optional insulating layer 145 may be deposited using any suitable deposition processes, as described above. In various embodiments, the optional insulating layer 145 may be deposited using atomic layer deposition (ALD). The thickness of the optional insulating layer 145 may be in a range from 0.1 nm to 10 nm, although lesser and greater thicknesses may also be used.

The optional insulating layer 145 may function as a barrier between the FE material layer 140 and a semiconductor channel layer that may be subsequently formed over the insulating layer 145. The optional insulating layer 145 may help to reduce surface state density (D$_{it}$) and inhibit carrier (i.e., electron and/or hole) injection from the semiconductor channel layer. In various embodiments, the material of the optional insulating layer 145 may have a higher band gap (E$_g$) than the band gap of the subsequently-formed semiconductor channel layer. For example, where the subsequently formed semiconductor channel layer is amorphous InGaZnO$_4$ (a-IGZO), having a band gap E$_g$ of ~3.16 eV, the material of the optional insulating layer 145 may have a larger band gap (e.g., E$_g$≥3.5 eV, such as E$_g$≥5.0 eV). Further, the conduction band offset (E$_{CBO}$) and the valence band offset (E$_{VBO}$) between the material of the insulating layer 145 and the semiconductor channel layer may be sufficiently large (e.g., E$_{CBO}$>1 eV, E$_{VBO}$>1 eV) to block charge carriers, including both electrons and holes, from being injected into the insulating layer 145 and thereby minimize current leakage from the semiconductor channel layer. In various embodiments, the optional insulating layer 145 may include silicon-doped hafnium oxide, such as Hf$_{1-x}$Si$_x$O$_y$, where x>0.1.

In some embodiments, the FE material layer 140 may include hafnium zirconium oxide (HZO) and the optional insulating layer 145 may include a hafnium-containing dielectric material, such as silicon-doped hafnium oxide. An interface region 146 adjacent to the interface between the FE material layer 140 and the optional insulating layer 145 may include a first interface region portion 146a located within the FE material layer 140, and a second interface region portion 146b, adjacent to the first interface region portion 146a, located within the optional insulating layer 145. Each of the first interface region portion 146a and the second interface region portion 146b may have a thickness of at least 1 nm. In various embodiments, within the interface region 146, a ratio of the atomic percentage of oxygen to the atomic percentage of zirconium may be ≥1, and a ratio of the atomic percentage of oxygen to the atomic percentage of hafnium may be >1.

Figure 8:
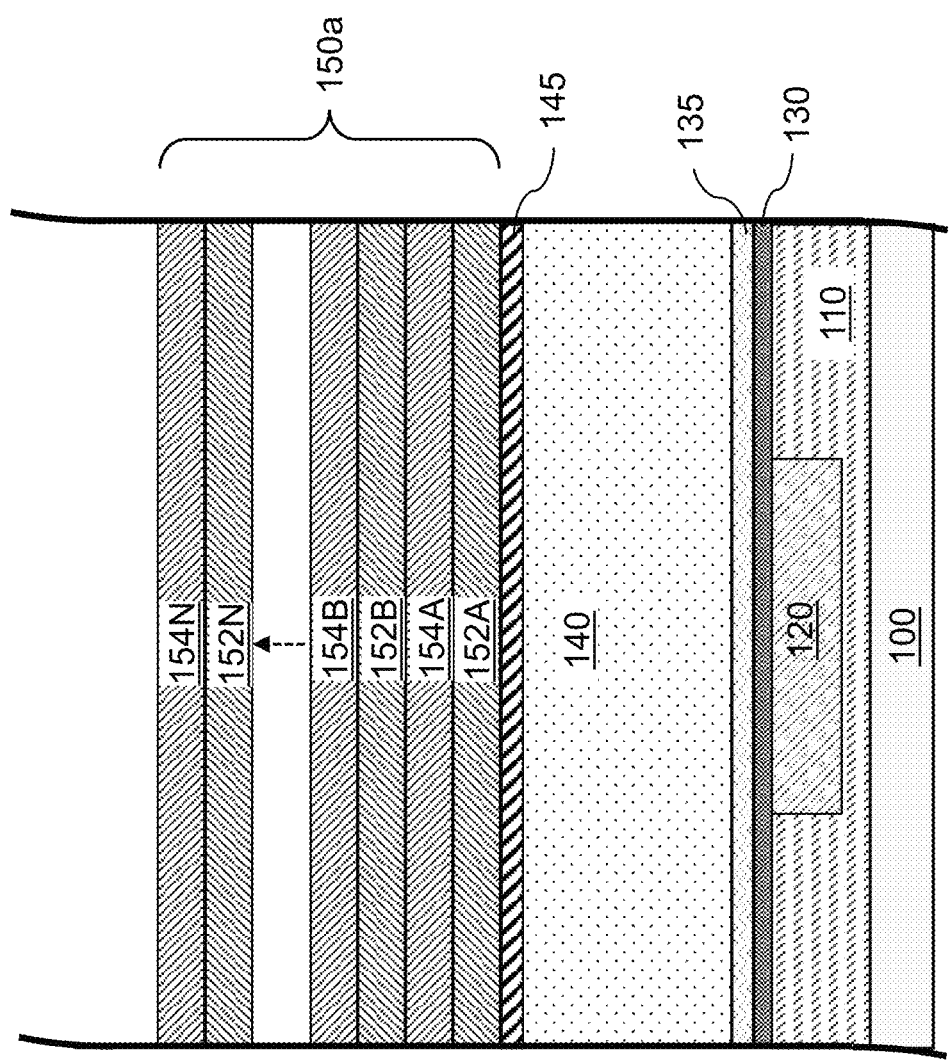
FIG. 8 is a vertical cross-section view of an exemplary structure during a process of forming a FeFET device showing portions of an in-progress channel layer deposited over the upper surface of an optional insulating layer.

FIG. 8 is a vertical cross-section view of an exemplary structure showing an in-progress channel layer 150a deposited over the upper surface of optional insulating layer 145.

In embodiments in which the optional insulating layer 145 is not present, the in-progress channel layer 150a may be deposited over the upper surface of the FE material layer 140. The in-progress channel layer 150a may be composed of an oxide semiconductor material, such as M$_x$M'$_y$Zn$_z$O. where 0<(x, y, z)<1. M may be a metal selected from the group consisting of indium (In) and tin (Sn) or combinations thereof, and M' may be a metal selected from the group consisting of gallium (Ga), hafnium (Hf), zirconium (Zr), titanium (Ti), aluminum (Al), strontium (Sr), barium (Ba), scandium (Sc), magnesium (Mg), lanthanum (La), and gadolinium (Gd) or combinations thereof. In some embodiments, the in-progress channel layer 150a may be amorphous indium gallium zinc oxide (a-IGZO). In other embodiments, indium may be partially or fully substituted by another metal, such as tin (Sn), that may be configured to provide high carrier mobility within the channel layer 150a. Alternatively, or in addition, gallium may be partially or fully substituted by another metal, such as one or more of hafnium (Hf), zirconium (Zr), titanium (Ti), aluminum (Al), strontium (Sr), barium (Ba), scandium (Sc), magnesium (Mg), lanthanum (La), or gadolinium (Gd), that may be configured to reduce oxygen vacancies and lower surface states (D$_{it}$).

The in-progress channel layer 150a may be formed by depositing a series of sub-layers over the upper surface of optional insulating layer 145, or in embodiments in which the optional insulating layer 145 is not present, over the upper surface of the FE material layer 140. Referring again to FIG. 8, a first sublayer 152A of the in-progress channel layer 150a may include a combination of a first metal oxide material and a second metal oxide material. The first metal oxide material may be composed of MO$_x$, where M is a metal selected from the group consisting of indium (In) and tin (Sn) or combinations thereof. The second metal oxide material may be composed of M'O$_x$, where M' is a metal selected from the group consisting of gallium (Ga), hafnium (Hf), zirconium (Zr), titanium (Ti), aluminum (Al), strontium (Sr), barium (Ba), scandium (Sc), magnesium (Mg), lanthanum (La), and gadolinium (Gd) or combinations thereof. In various embodiments, the first sublayer 152A may include a combination of InO$_x$ and GaO$_x$. The first sublayer 152A may be deposited using any suitable deposition process. In various embodiments, the first sublayer 152A may be deposited using atomic layer deposition (ALD).

Referring again to FIG. 8, a second sublayer 154A of the in-progress channel layer 150a may be deposited over the upper surface of the first sublayer 152A. The second sublayer 154A of the in-progress channel layer 150a may include zinc oxide (ZnO$_x$). The second sublayer 154A may be deposited using any suitable deposition process. In various embodiments, the second sublayer 154A may be deposited using atomic layer deposition (ALD).

In various embodiments, deposition of zinc oxide directly onto the gate dielectric material (i.e., the optional insulating layer 145 in FIG. 8, or the FE material layer 140 in embodiments in which the optional insulating layer 145 is not present) may result in increased surface roughness at the interface between the in-progress channel layer 150a and the gate dielectric due to the propensity for zinc oxide to form polycrystalline grain structures. Thus, in various embodiments, a first sublayer 152A of the in-progress channel layer 150a that is formed over the gate dielectric 145/140 may include may a combination of a first metal oxide material and a second metal oxide material, and a second sublayer 154A including zinc oxide may be formed over the first sublayer 152A. In various embodiments, the first sublayer 152A may be essentially free of zinc oxide. Further, in various embodiments the first sublayer 152A may include a combination of a first metal oxide material, such as indium oxide ($InO_x$), that may promote higher carrier (e.g., electron) mobility, and a second metal oxide material, such as gallium oxide ($GaO_x$) that may reduce oxygen vacancies and lower surface state density ($D_{it}$) in the in-progress channel layer 150a.

Referring again to FIG. 8, a third sublayer 152B of the in-progress channel layer 150a may be deposited over the upper surface of the second sublayer 154A. In various embodiments, the third sublayer 152B may include a combination of a first metal oxide material and a second metal oxide material. The first metal oxide material may be composed of $MO_x$, where M is a metal selected from the group consisting of indium (In) and tin (Sn) or combinations thereof. The second metal oxide material may be composed of $M'O_x$, where M' is a metal selected from the group consisting of gallium (Ga), hafnium (Hf), zirconium (Zr), titanium (Ti), aluminum (Al), strontium (Sr), barium (B a), scandium (Sc), magnesium (Mg), lanthanum (La), and gadolinium (Gd) or combinations thereof. In various embodiments, the third sublayer 152B may include a combination of $InO_x$ and $GaO_x$. In some embodiments, the third sublayer 152B may have the same composition as the first sublayer 152A. In other embodiments, the third sublayer 152B may have a different composition than the first sublayer 152A. For example, a ratio of M:M' in the third sublayer 152B may be different than the ratio of M:M' in the first sublayer 152A. Alternatively, or in addition, the metal material(s), M and/or M', of the third sublayer 152B may be different than the metal material(s), M and/or M', of the first sublayer 152A. The third sublayer 152A may be deposited using any suitable deposition process. In various embodiments, the third sublayer 152B may be deposited using atomic layer deposition (ALD).

Referring again to FIG. 8, a fourth sublayer 154B of the in-progress channel layer 150a may be deposited over the upper surface of the third sublayer 152B. The fourth sublayer 154B of the in-progress channel layer 150a may include zinc oxide ($ZnO_x$). The fourth sublayer 154B may be deposited using any suitable deposition process. In various embodiments, the fourth sublayer 154B may be deposited using atomic layer deposition (ALD).

In various embodiments, this process may be repeated multiple times, such that the in-progress channel layer 150a may include an alternating stack of sublayers 152, 154, including a first set of sublayers 152A, 152B . . . 152N that each include a combination of a first metal oxide material and a second metal oxide material (e.g., $InO_x$ and $GaO_x$), and a second set of sublayers 154A, 154B . . . 154N, that include zinc oxide. In embodiments, the alternating stack of sublayers may include at least two sublayers 152, 154, such as at least four sublayers 152, 154 (e.g., eight or more sublayers 152, 154). In various embodiments, the uppermost layer of the alternating stack of sublayers may be a sublayer 154N containing zinc oxide. Alternatively, the uppermost layer of the alternating stack of sublayers may be a sublayer 152N that includes a combination of a first metal oxide material and a second metal oxide material (e.g., $InO_x$ and $GaO_x$).

Figure 9A:
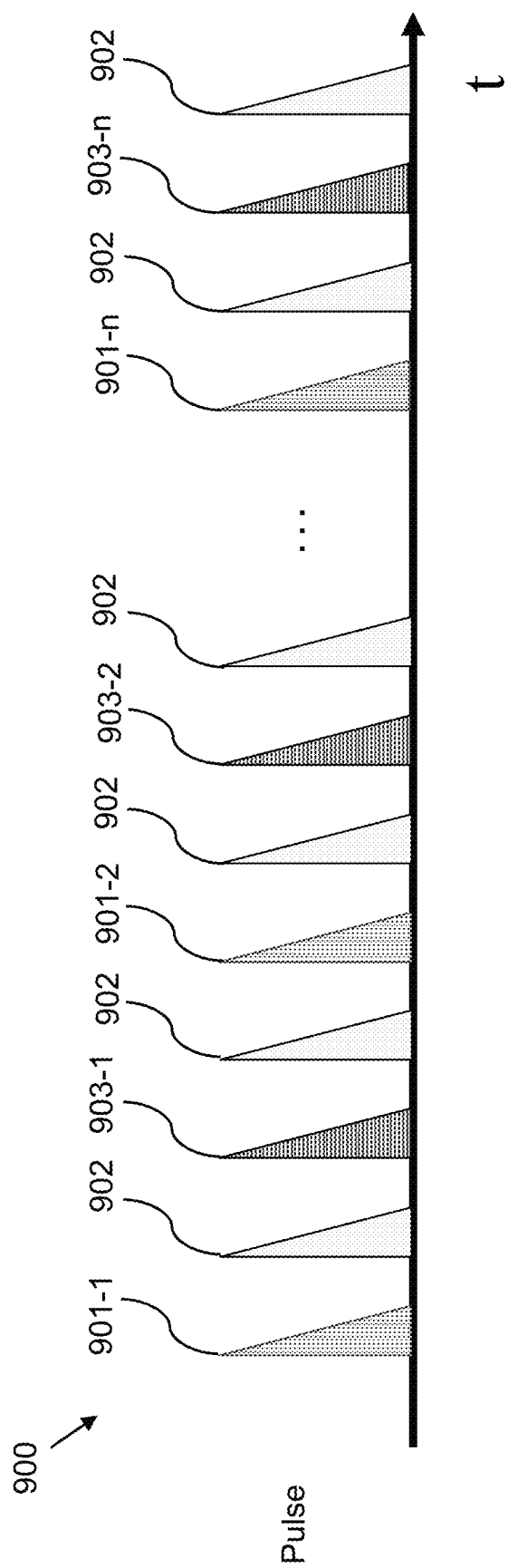
FIG. 9A is a plot showing a pulse sequence for an atomic layer deposition (ALD) system that may be used to form an amorphous oxide semiconductor (AOS) channel layer made from a plurality of sublayers according to various embodiments of the present disclosure.

FIG. 9A is a plot showing a pulse sequence 900 for an atomic layer deposition (ALD) system that may be used to form an amorphous oxide semiconductor (AOS) channel layer 150 made from a plurality of sublayers 152, 154 according to various embodiments of the present disclosure. Referring to FIG. 9A, a sequence of ALD precursor pulses introduced into the ALD reaction chamber is schematically illustrated over time, t. A first pulse 901-1 may be a precursor mixture including precursors containing a first metal, M, and a second metal, M'. The first metal, M, may be a metal selected from the group consisting of indium (In) and tin (Sn) or combinations thereof. The second metal, M', may be a metal selected from the group consisting of gallium (Ga), hafnium (Hf), zirconium (Zr), titanium (Ti), aluminum (Al), strontium (Sr), barium (Ba), scandium (Sc), magnesium (Mg), lanthanum (La), and gadolinium (Gd) or combinations thereof. In one non-limiting example, the first metal, M, may be indium, and the precursor of the first metal may be trimethyl-indium (TMIn). The second metal, M', may be gallium, and the precursor of the second metal may be triethylgallium, $Ga(C_2H_5)_3$ (TEG/TEGa). Other suitable precursors are within the contemplated scope of disclosure. In various embodiments, the precursor mixture may be a solid precursor including a mixture (also referred to as a "cocktail") of solid precursors containing metals M and M'. The solid precursor "cocktail" mix may be vaporized using a low pressure vessel (LPV) and the resulting vaporized precursor mixture may be introduced (i.e., pulsed) into an ALD reaction chamber containing an intermediate structure such as shown in FIG. 7. The precursor mixture may react with the gate dielectric material (i.e., the optional insulating layer 145 in FIG. 7, or the FE material layer 140 in embodiments in which the optional insulating layer 145 is not present) to deposit the first metal M and the second metal M' on the gate dielectric material.

Referring again to FIG. 9A, following the introduction of the first pulse 901-1, the ALD reaction chamber may optionally be purged using an inert gas (e.g., $N_2$, Ar, etc.) and a second pulse 902 including a counter-reactant precursor may be introduced into the ALD reaction chamber. In various embodiments, the counter-reactant precursor may be an oxygen precursor, such as water vapor ($H_2O$). The counter-reactant precursor may react with the first metal, M, and the second metal, M', to form a first channel sublayer 152A including a combination of a first metal oxide material and a second metal oxide material (e.g., $InO_x$ and $GaO_x$).

Following the introduction of the second pulse 902, the ALD reaction chamber may optionally be purged using an inert gas, and a third pulse 903-1 may be introduced into the ALD reaction chamber. The third pulse 903-1 may include a zinc precursor. In embodiments, the zinc precursor may include diethylzinc ($(C_2H_5)_2Zn$ (DEZ) and/or dimethylzinc $Zn(CH_3)_2$ (DMZ). Other suitable precursors are within the contemplated scope of disclosure. The zinc precursor may react with the metal oxide materials of the first channel sublayer 152A to deposit zinc on the first channel sublayer 152A. The ALD reaction chamber may again optionally be purged using an inert gas, and a pulse 902 including a counter-reactant precursor (e.g., an oxygen precursor, such as $H_2O$) may be introduced into the ALD reaction chamber. The counter-reactant precursor may react with the zinc to form a second channel sublayer 154A including zinc oxide.

This sequence may then be repeated by introducing a pulse 901-2 of the precursor mixture containing metals M and M', followed by a pulse 902 of the counter-reactant precursor, a pulse 903-2 of the zinc precursor, and a pulse 902 of the counter-reactant precursor, and so forth, to form additional sublayers 152B, 154B . . . 152N, 154N of the semiconductor channel layer 150.

Figure 9B:
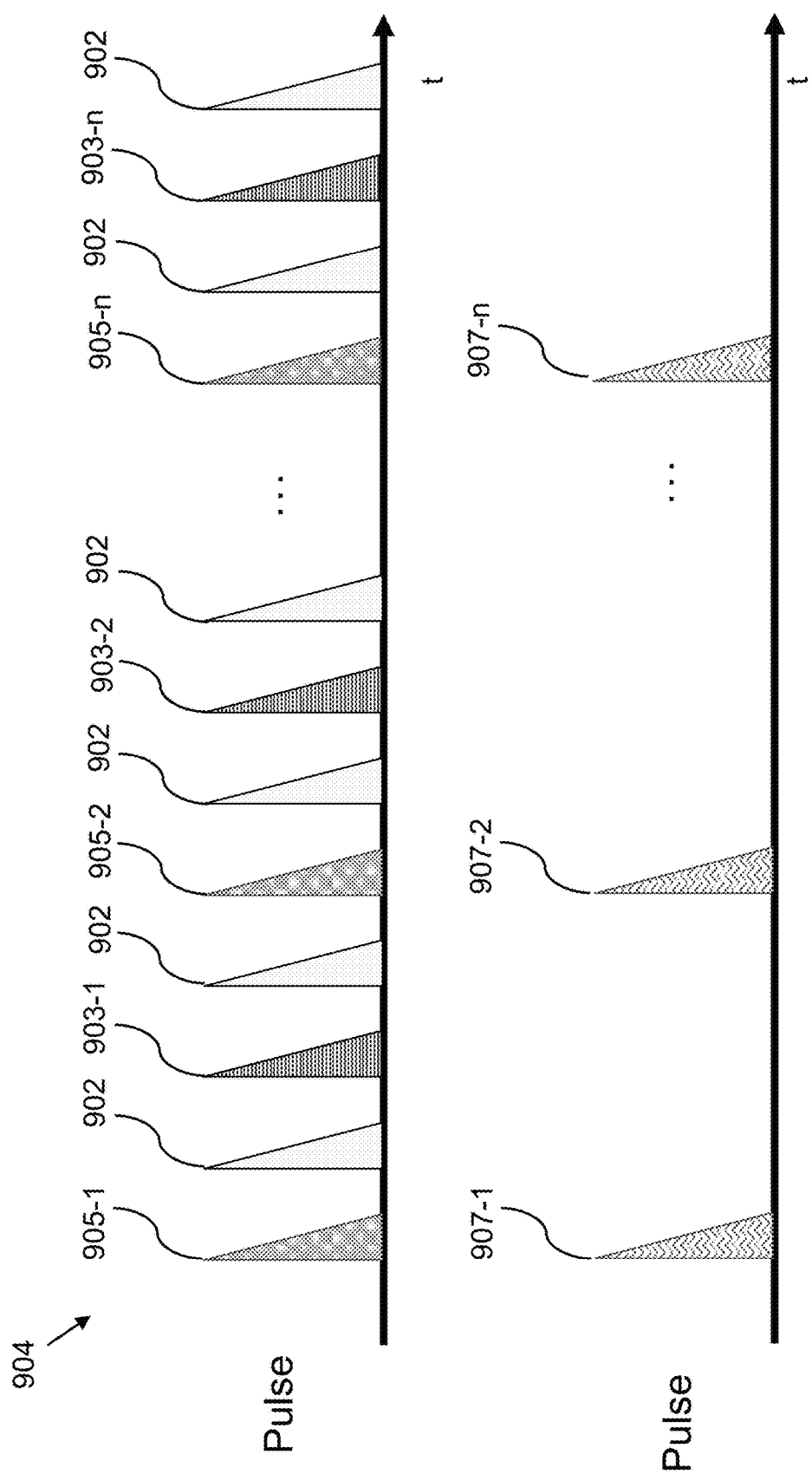
FIG. 9B is a plot showing an alternative pulse sequence for an atomic layer deposition (ALD) system that may be used to form an amorphous oxide semiconductor (AOS) channel layer made of a plurality of sublayers according to various embodiments of the present disclosure.

FIG. 9B is a plot showing an alternative pulse sequence 904 for an atomic layer deposition (ALD) system that may be used to form an amorphous oxide semiconductor (AOS) channel layer 150 made of a plurality of sublayers 152, 154 according to various embodiments of the present disclosure.

Referring to FIG. 9B, the pulse sequence 904 in this embodiment is similar to the pulse sequence 900 shown in FIG. 9A, except that that instead of introducing a single pulse 901-1 of a precursor mixture including precursors containing a first metal, M, and a second metal, M', the ALD system may be operated in a co-pulse mode in which a first precursor pulse 905-1 and a second precursor pulse 907-1 may be introduced into the ALD reaction chamber at the same time. The first precursor pulse 905-1 may include a precursor containing the first metal, M, and the second precursor pulse 907-1 may include a precursor containing second metal, M'. The respective precursors may mix within the ALD reaction chamber and react with the gate dielectric material to deposit the first metal, M, and the second metal, M', on the gate dielectric material. Then, a pulse 902 of a counter-reactant precursor (e.g., an oxygen precursor, such as $H_2O$) may be introduced into the ALD reaction chamber, and may react with the first metal, M, and the second metal, M', to form a channel sublayer 152A including a combination of a first metal oxide material and a second metal oxide material (e.g., $InO_x$ and $GaO_x$).

Figure 10:
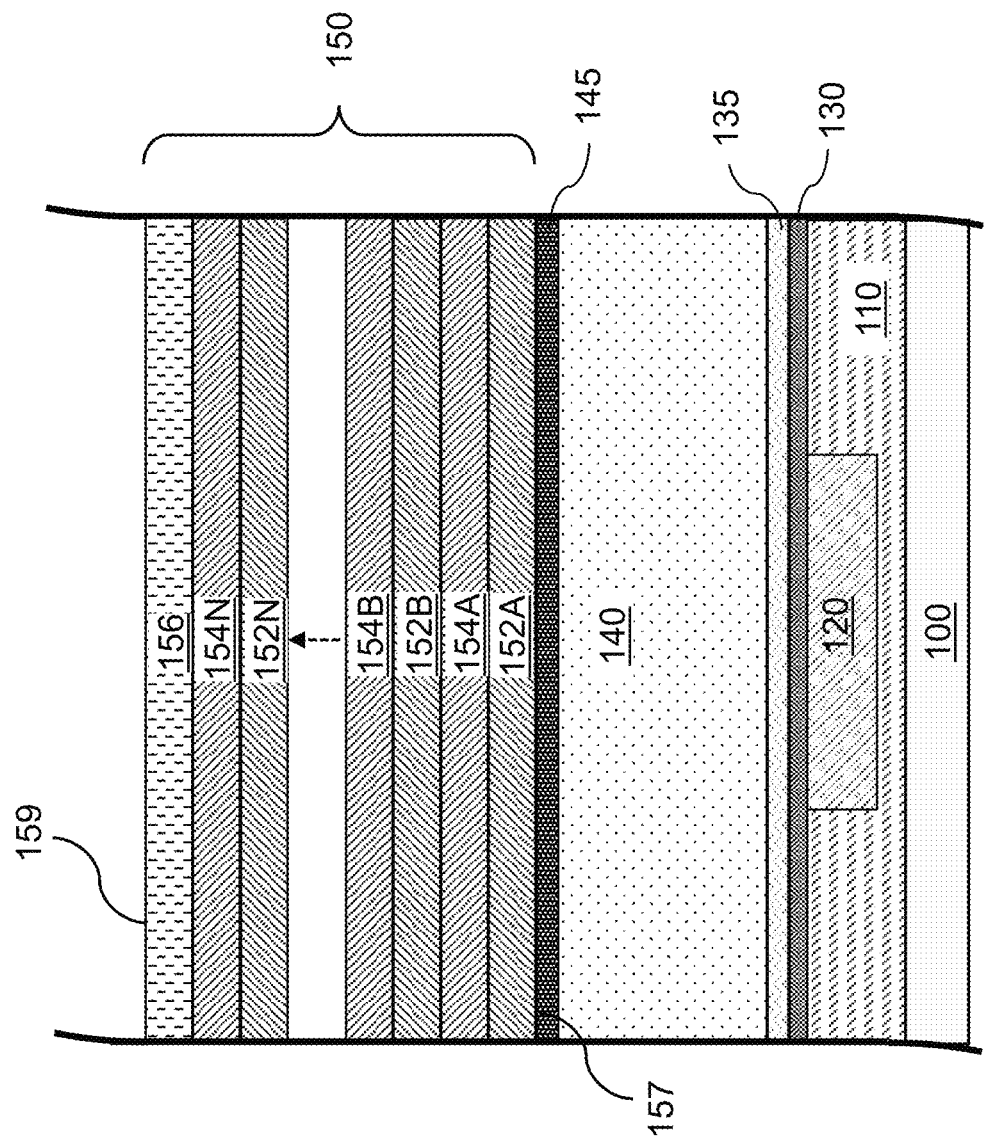
FIG. 10 is a vertical cross-section view of an exemplary structure during a process of forming a FeFET device showing a final sublayer deposited on a plurality of sublayers to form a completed channel layer.

FIG. 10 is a vertical cross-section view of an exemplary structure showing a final sublayer 156 deposited over the upper surface of sublayer 154N to form a completed channel layer 150. In embodiments in which the uppermost layer of the alternating stack of sublayers is a sublayer 152N that includes a combination of a first metal oxide material and a second metal oxide material (e.g., $InO_x$ and $GaO_x$), the final sublayer 156 may be deposited over the upper surface of sublayer 152N. The final sublayer 156 of the channel layer 150 may include the second metal oxide material, $M'O_x$, where M' is a metal selected from the group consisting of gallium (Ga), hafnium (Hf), zirconium (Zr), titanium (Ti), aluminum (Al), strontium (Sr), barium (Ba), scandium (Sc), magnesium (Mg), lanthanum (La), and gadolinium (Gd) or combinations thereof. Because the final sublayer 156 of the channel layer 150 is exposed to air, the surface defects may be higher, which may reduce channel mobility due to the electron scattering effect. In various embodiments, the final sublayer 156 may include a metal oxide material, such as $GaO_x$, having a relatively high bonding energy, which may reduce surface defects. In some embodiments, the final sublayer 156 may have a higher concentration of the second metal oxide material, $M'O_x$ than of zinc oxide, indium oxide or tin oxide. The final sublayer 156 may be deposited using any suitable deposition process. In various embodiments, the final sublayer 156 may be deposited using atomic layer deposition (ALD).

In various embodiments, the channel layer 150 including the alternating stack of sublayers 152, 154 and the final sublayer 156, may have a total thickness between 1 and 100 nm (e.g., between 2 nm and 70 nm), although greater or lesser thicknesses may be used. The channel layer 150 may be composed of an oxide semiconductor material, such as $M_xM'_yZn_zO$, where $0<(x, y, z)<1$. M may be a first metal selected from the group consisting of indium (In) and tin (Sn) or combinations thereof, and M' may be a second metal selected from the group consisting of gallium (Ga), hafnium (Hf), zirconium (Zr), titanium (Ti), aluminum (Al), strontium (Sr), barium (Ba), scandium (Sc), magnesium (Mg), lanthanum (La), and gadolinium (Gd) or combinations thereof. In some embodiments, the channel layer 150a may be amorphous indium gallium zinc oxide (a-IGZO).

The channel layer 150 may extend between a first surface 157 that contacts a gate dielectric material (e.g., the optional insulating layer 145, or the FE material layer 140 in embodiments in which the optional insulating layer 145 is not present), and a second surface 159 opposite the first surface 157. In embodiments, the channel layer 150 may include a first region 152A, adjacent to the first surface 157, that contains both the first metal, M, and the second metal, M', and the atomic percentages of the first metal, M, and the second metal, M' in the first region 152A are each greater than the atomic percentage of zinc in the first region 152A. In embodiments, the channel layer 150 may also include a second region 156 adjacent to the second surface 157 that includes the second metal M', and the atomic percentage of the second metal M' in the second region 156 is greater than the atomic percentages of either the first metal M or zinc in the second region 156. In various embodiments, the channel layer 150 may include a third region 154A between the first region 152A and the second region 156, where the atomic percentage of zinc in the third region 154A is greater than the atomic percentages of either the first metal M or the second metal M' within the third region 154A. In various embodiments, the channel region 150 may include an alternating stack of sublayers 152, 154 between the first surface 157 and the second surface 159, where in a first set of sublayers 152A, 152B, 152N, the atomic percentages of the first metal, M, and the second metal, M', are each greater than the atomic percentage of zinc, and a second set of sublayers 154A, 154B, 154N, the atomic percentage of zinc is greater than the atomic percentages of either the first metal, M, or the second metal, M'.

Figure 11:
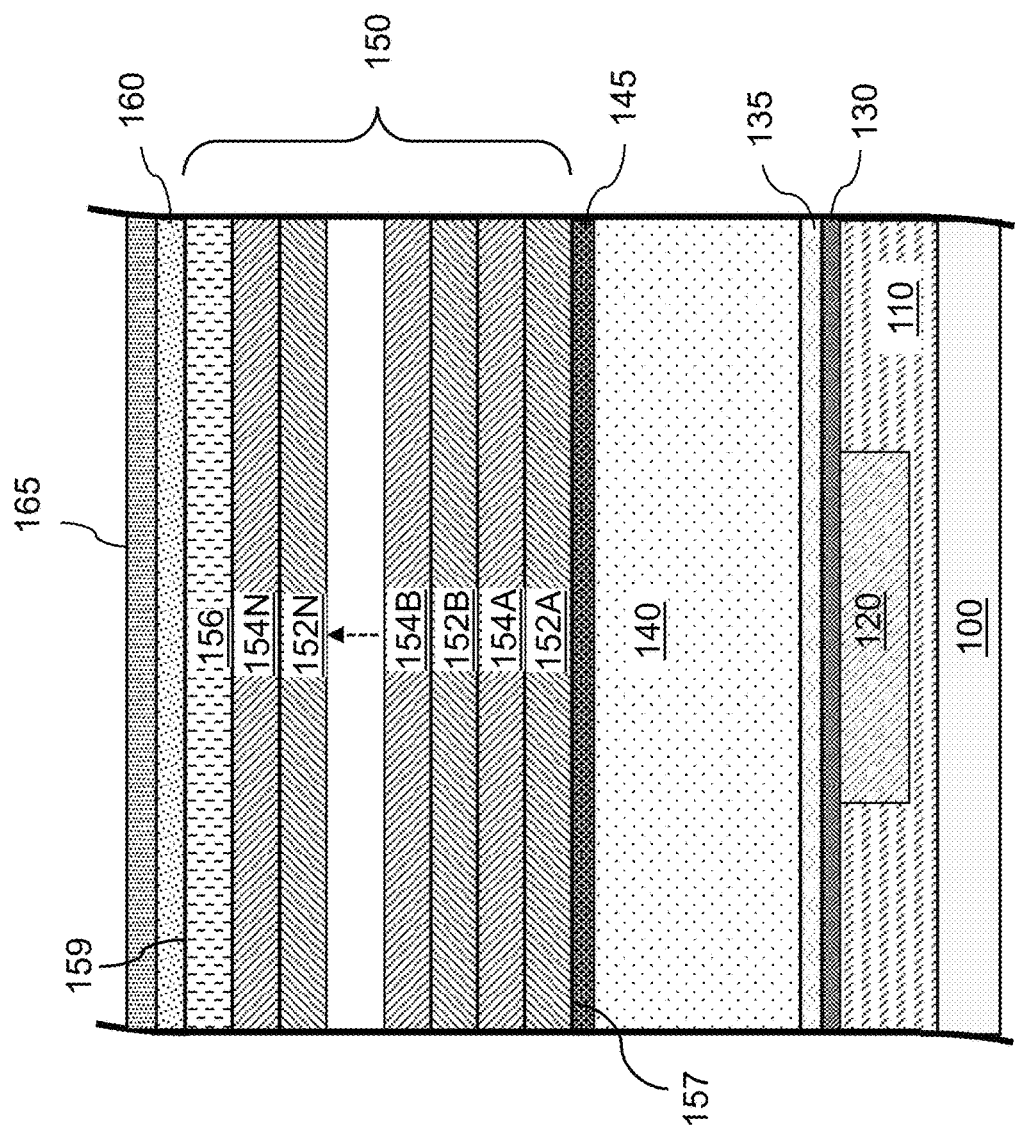
FIG. 11 is a vertical cross-section view of an exemplary structure during a process of forming a FeFET device showing first and second capping layers formed over the upper surface of a channel layer.

FIG. 11 is a vertical cross-section view of an exemplary structure showing first and second capping layers 160, 165 formed over the upper surface of the channel layer 150. Although FIG. 11 illustrates two capping layers 160, 165 over the upper surface of the channel layer 150, in various embodiments a single capping layer or more than two capping layers may be formed over the upper surface of the channel layer 150. In various embodiments, the capping layers 160, 165 may each be formed of a metal material, such as calcium (Ca), aluminum (Al), hafnium (Hf), zirconium (Zr), titanium (Ti), tantalum (Ta), strontium (Sr), barium (Ba), scandium (Sc), magnesium (Mg), lanthanum (La) and gadolinium (Gd). In various embodiments, the capping layers 160, 165 may include material(s) having a higher affinity for oxygen than the metal materials of the channel layer 150 (e.g., Ga, In, Zn). The material of each of the capping layers 160, 165 may include single metal ions (e.g., Ca and Al), as well as binary metal ions, ternary metal ions, quaternary metal ions, etc. In embodiments, the first capping layer 160 may be calcium and the second capping layer 165 may be aluminum. The first and second capping layers 160, 165 may reduce oxygen vacancies and surface defects within portions of the channel layer 150 underlying the capping layers 160, 165, and may increase carrier (e.g., electron) mobility and reduce RC delay effects in the finished FeFET device.

The capping layers 160, 165 may be deposited using any suitable deposition process, such as atomic layer deposition (ALD), physical vapor deposition (PVD), chemical vapor deposition (CVD), sputtering, evaporation, or the like. In various embodiments, the final sublayer 156 may be deposited using atomic layer deposition (ALD). In embodiments, each of the capping layers 160, 165 may have a thickness that is between about 0.05 nm and 5 nm. In some embodiments, each of the capping layers 160, 165 may be deposited as a monolayer using an ALD process. In embodiments, the capping layers 160, 165 may be deposited following the deposition of the channel layer 150. Precursor pulses for the materials of the capping layers 160, 165 may be sequentially introduced into the ALD reaction chamber to deposit the first capping layer 160 and the second capping layer 165 over the upper surface of the channel layer 150. For example, in embodiments where the first capping layer 160 is composed of calcium and the second capping layer 165 is composed of aluminum, a suitable calcium precursor (e.g., Ca(OCC (CH3)3CHCOC(CH3)3)2, Calcium bis (2, 2, 6, 6-tetramethyl-3, 5-heptanedionate)) may be introduced into the ALD reaction chamber to form the first capping layer 160 over the upper surface of the channel layer 150, and a suitable aluminum precursor (e.g., Al(CH3)3) may then be introduced into the ALD reaction chamber to form the second capping layer 165 over the first capping layer 160. Alternatively, the first capping layer 160 may be composed of aluminum and the second capping layer 165 may be composed of calcium. Other suitable materials, including without limitation, hafnium (Hf), zirconium (Zr), titanium (Ti), tantalum (Ta), strontium (Sr), barium (Ba), scandium (Sc), magnesium (Mg), lanthanum (La) and gadolinium (Gd), may be used for the capping layers 160, 165.

Figure 12:
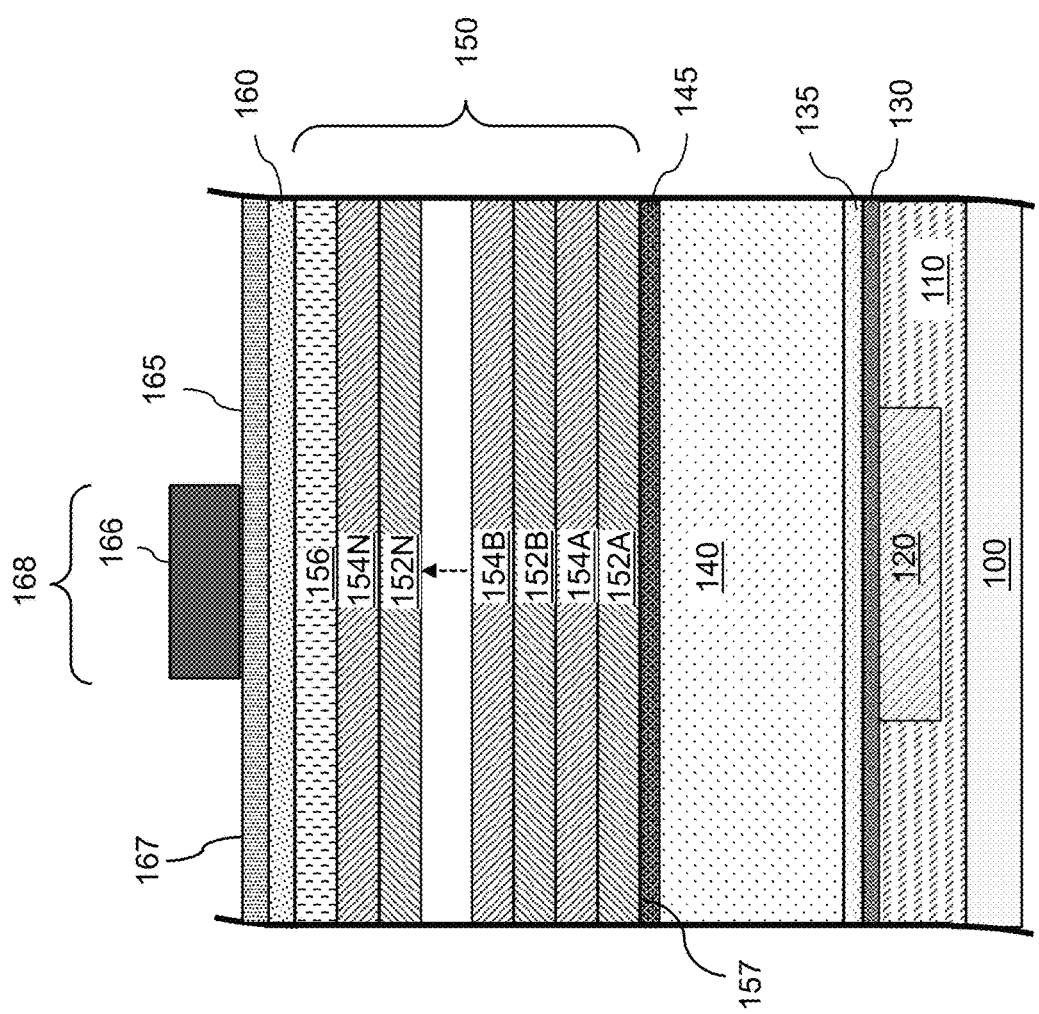
FIG. 12 is a vertical cross-section view of an exemplary structure during a process of forming a FeFET device showing a patterned mask over an upper surface of a second capping layer.

FIG. 12 is a vertical cross-section view of an exemplary structure during a process of forming a FeFET device showing a patterned mask 166 over an upper surface 167 of the second capping layer 165. The patterned mask 166 may be a hard mask that is patterned using photoresist and an etching process to remove portions of the mask material from the periphery of the FeFET device. The remaining portion of the patterned mask 166 may be located over a central region 168 of the FeFET device, In embodiments, the patterned mask 166 may be located above the buried electrode 120. The patterned mask 166 may be made of a suitable mask material, such as silicon nitride, amorphous carbon, carbon doped silicon oxide, and combinations thereof. Other materials for the patterned mask 166 are within the contemplated scope of disclosure.

Figure 13:
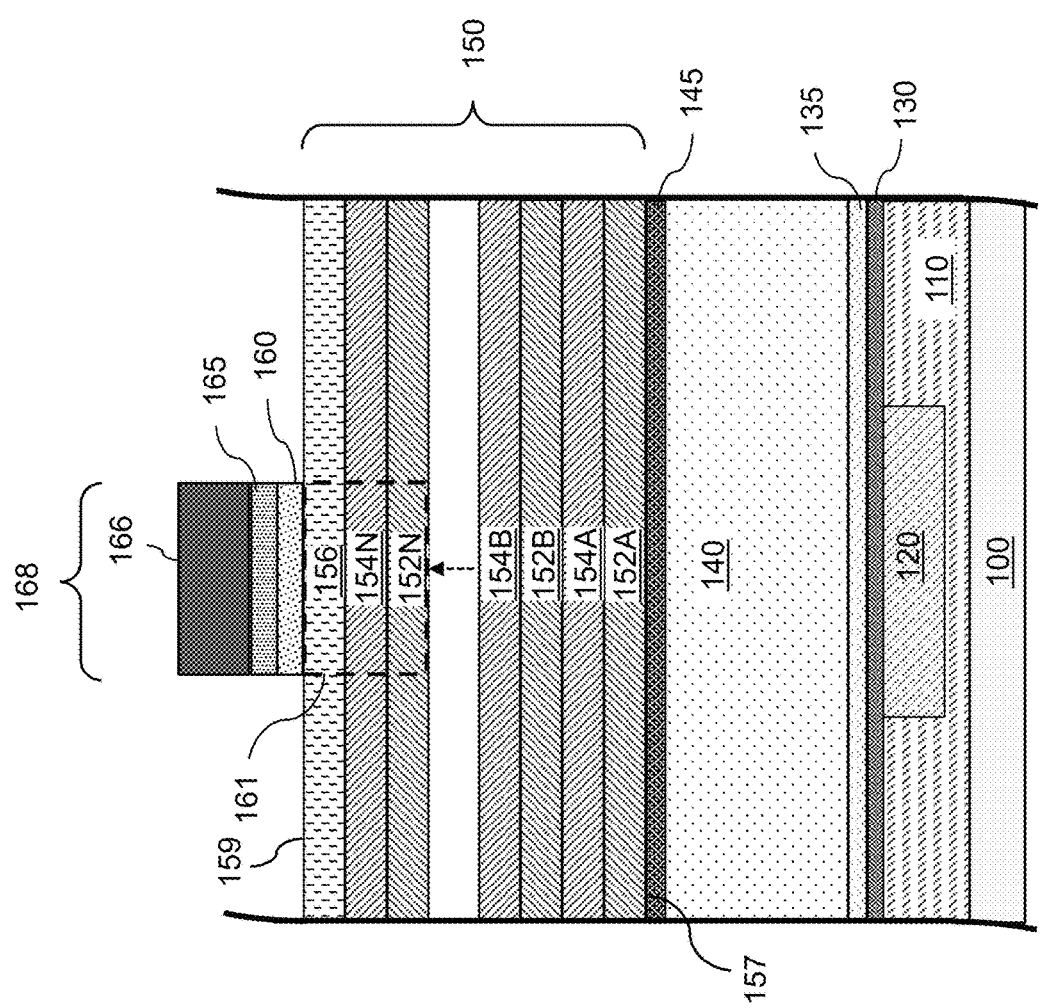
FIG. 13 is a vertical cross-section view of an exemplary structure during a process of forming a FeFET device showing first and second capping layers and a patterned mask over the channel layer in a central region of the FeFET device.

FIG. 13 is a vertical cross-section view of an exemplary structure during a process of forming a FeFET device showing the first and second capping layers 160, 165 and the patterned mask 166 over the channel layer 150 in a central region 168 of the FeFET device. Referring to FIG. 13, an etching process may be used to remove portions of the first and second capping layers 160, 166 and expose the upper surface 159 of the channel layer 150 in the periphery of the FeFET device. The patterned mask 166 may prevent the first and second capping layers 160, 165 from being etched in the central region 168 of the FeFET device.

Referring again to FIG. 13, a portion 161 of the channel layer 150 underlying the first and second capping layers 160, 165 may be oxygen-rich due to the strong oxidation ability of the material(s) of the capping layers 160, 165. Oxygen in the channel layer 150 may be caught by metal ions from the capping layers 160, 165 and form an oxygen-rich condition, with may include metal oxides such as AlOx and/or CaOx, at the interface between the channel layer 150 and the first capping layer 160. In embodiments, metal material(s) of the first capping layer 160 and/or the second capping layer 165 may diffuse into the channel layer 150 in the portion 161 of the channel layer 150 underlying the capping layers 160, 165. In some embodiments, a thermal annealing process may be performed after the deposition of the first channel layer 160 and the second channel layer 165. In one non-limiting embodiment, the exemplary structure including the capping layers 160 and 165 may be annealed at a temperature between 400° C. and 700° C. in an environment that may include oxygen (O2), nitrogen (N2), and/or a forming gas (H2/N2). The annealing process may promote diffusion of the metal material(s) of the capping layers 160, 165 into the channel layer 150.

Figure 14:
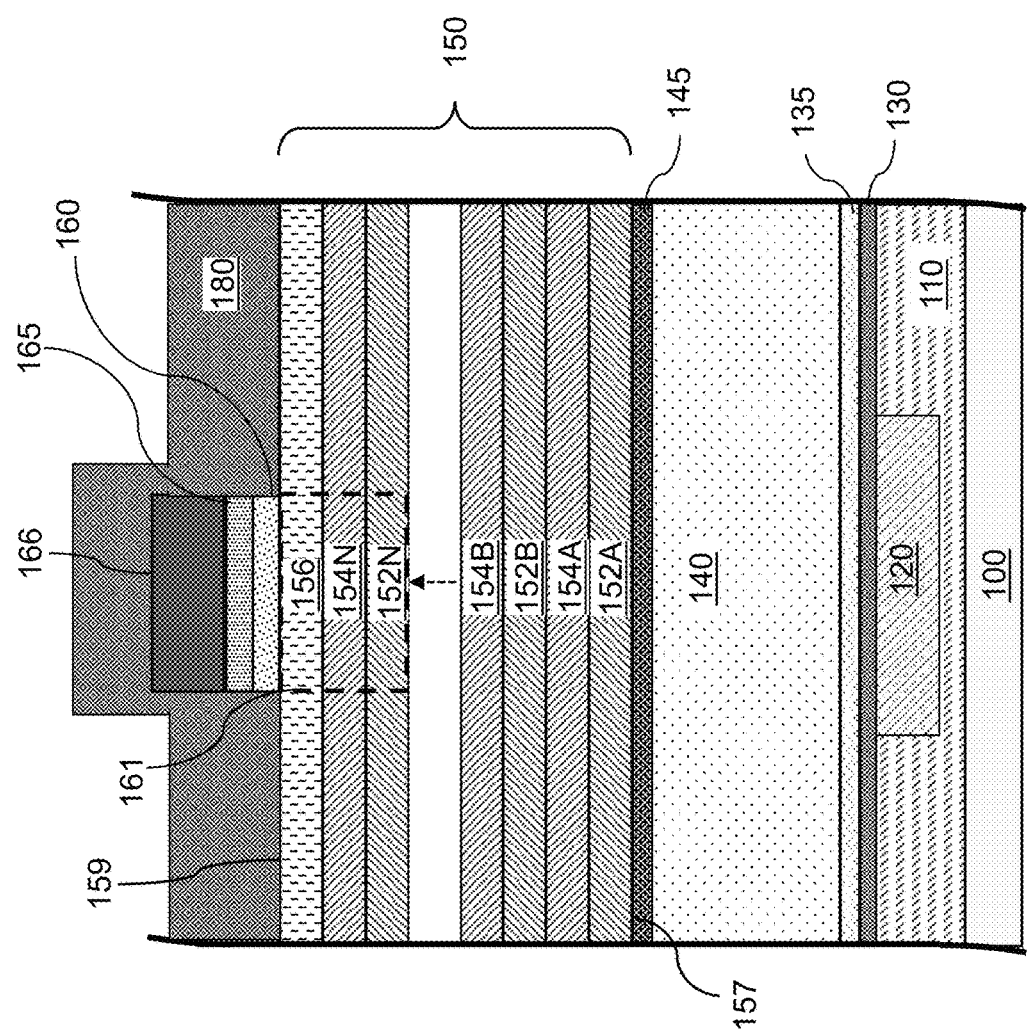
FIG. 14 is a vertical cross-section view of an exemplary structure during a process of forming a FeFET device showing a passivation layer deposited over an upper surface of a channel layer and over an upper surface of a patterned mask.

FIG. 14 is a vertical cross-section view of an exemplary structure during a process of forming a FeFET device showing a passivation layer 180 deposited over an upper surface 159 of the channel layer 150 and over an upper surface of the patterned mask 166. The passivation layer 180 may be composed of a suitable dielectric material, such as aluminum oxide or silicon oxide. Other materials are within the contemplated scope of disclosure. In some embodiments, the passivation layer 180 may be a low-k dielectric material. The passivation layer 180 may be deposited using a suitable deposition method as described above.

Figure 15:
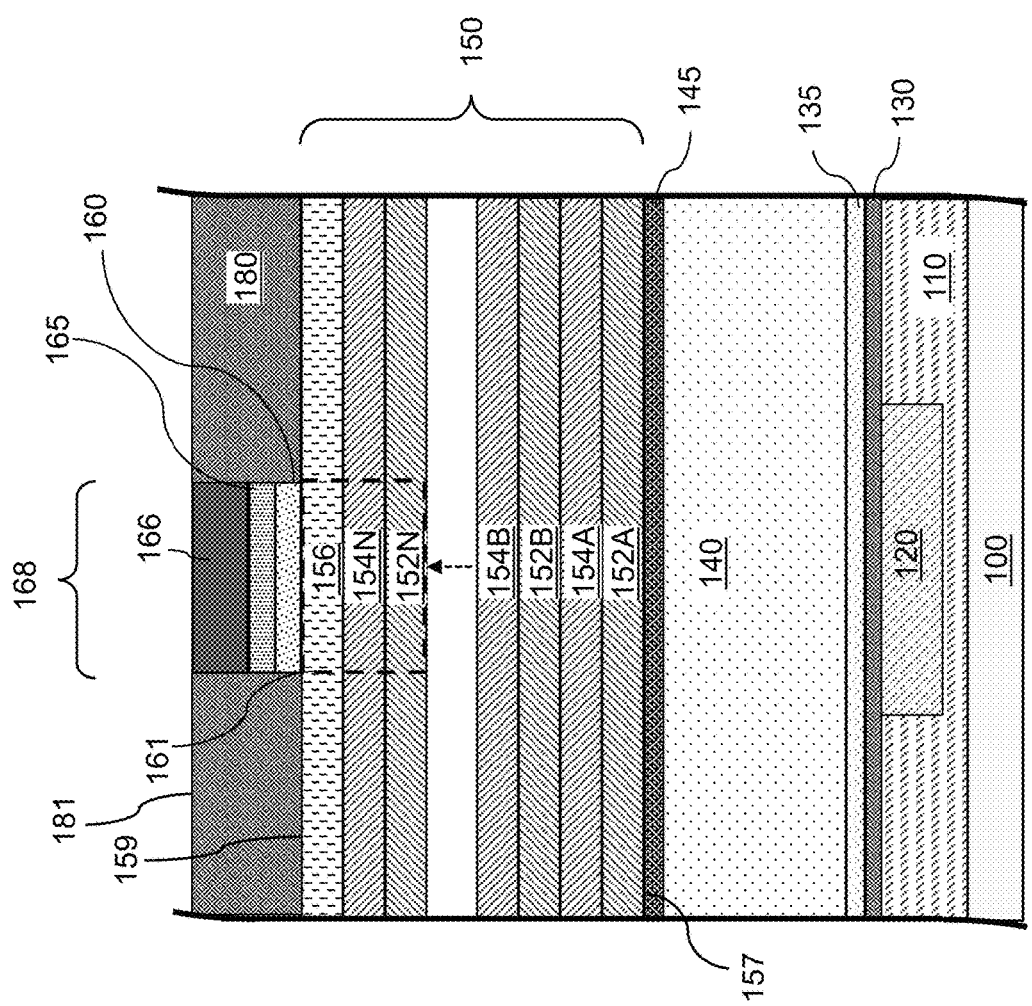
FIG. 15 is a vertical cross-section view of an exemplary structure during a process of forming a FeFET device following a planarization process to remove portions of a passivation layer from over an upper surface of a patterned mask.

FIG. 15 is a vertical cross-section view of an exemplary structure during a process of forming a FeFET device following a planarization process to remove portions of the passivation layer 180 from over an upper surface of the patterned mask 166. Referring to FIG. 15 a planarization process, such as a chemical mechanical planarization (CMP) process, may be performed to remove portions of the passivation layer 180 from over the upper surface of the patterned mask 166 and expose the patterned mask 166 in the central region 168 of the FeFET device. Following the planarization process, the upper surface 181 of the passivation layer 180 may be co-planar with the upper surface of the patterned mask 166.

Figure 16:
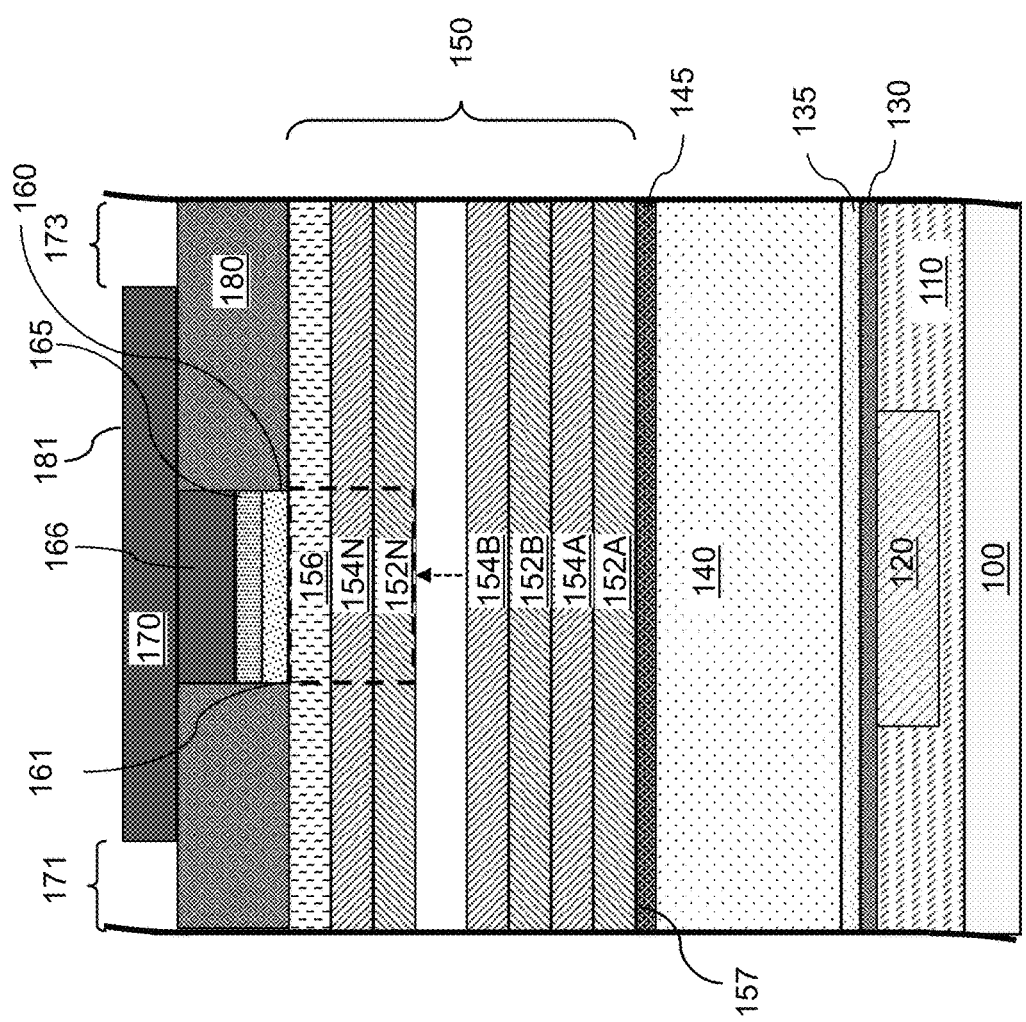
FIG. 16 is a vertical cross-section view of an exemplary structure during a process of forming a FeFET device showing a patterned mask over the upper surfaces of a passivation layer and a patterned mask.

FIG. 16 is a vertical cross-section view of an exemplary structure during a process of forming a FeFET device showing a patterned mask 170 over the upper surfaces of the passivation layer 180 and the patterned mask 166. The patterned mask 170 may be patterned using photoresist and an etching process to remove portions of the mask material and expose regions 171 and 173 of the upper surface 181 of the passivation layer 180. The exposed regions 171 and 173 of the passivation layer 180 may correspond to the locations of source and drain regions, respectively, that may be subsequently formed.

Figure 17:
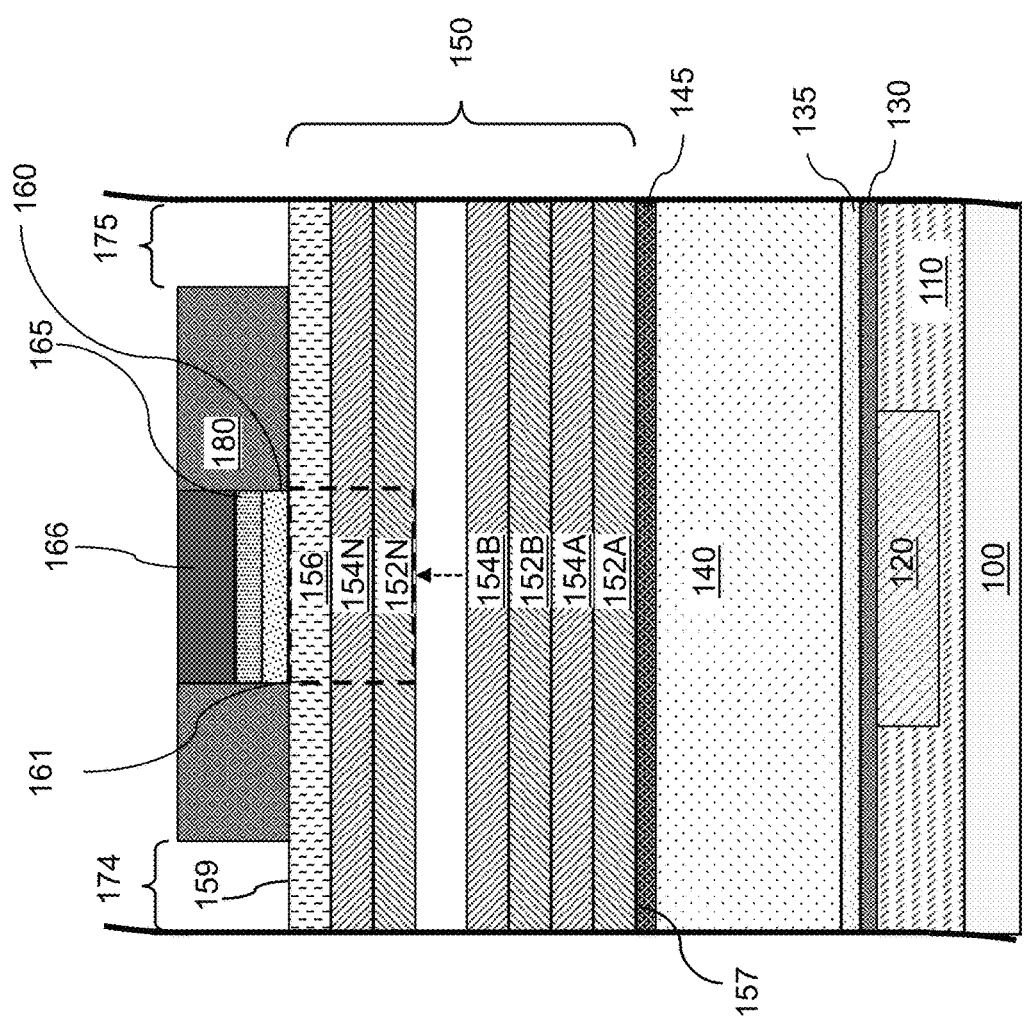
FIG. 17 is a vertical cross-section view of an exemplary structure during a process of forming a FeFET device showing openings formed through a passivation layer to expose the upper surface of channel layer.

FIG. 17 is a vertical cross-section view of an exemplary structure during a process of forming a FeFET device showing openings 174 and 175 formed through the passivation layer 180 to expose the upper surface 159 of the channel layer 150. Referring to FIG. 17, the passivation layer 180 may be etched through the patterned mask 170 to remove portions of the passivation layer 180 and expose the upper surface 159 of the channel layer 150. The regions of the channel layer 150 exposed through the openings 174 and 175 in the passivation layer 180 may correspond to source and drain regions, respectively, of the FeFET device. Following the etching process, the patterned mask 170 may be removed using a suitable process, such as by ashing or by dissolution using a solvent.

Figure 18:
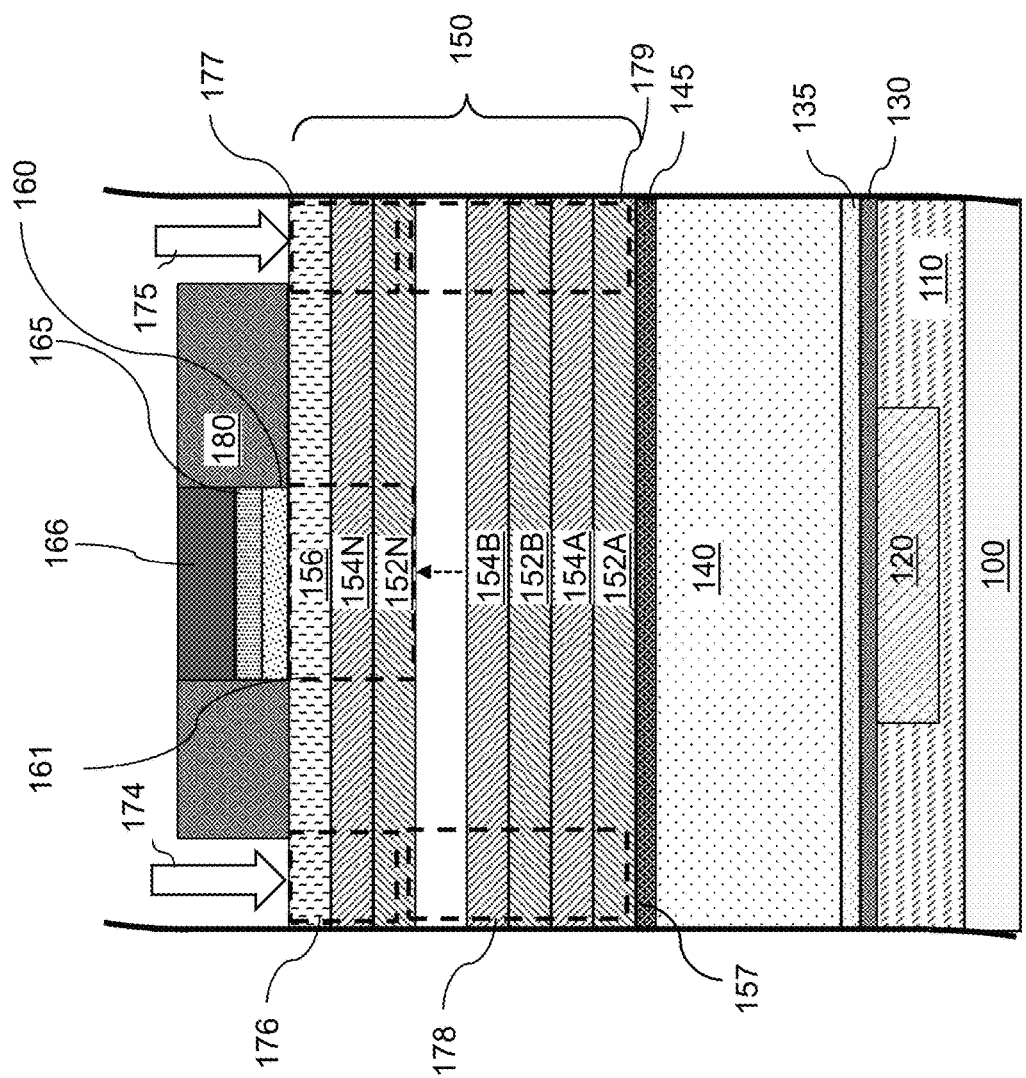
FIG. 18 is a vertical cross-section view of an exemplary structure during a process of forming a FeFET device showing a plasma treatment of source and drain regions of a channel layer.

FIG. 18 is a vertical cross-section view of an exemplary structure during a process of forming a FeFET device showing a plasma treatment of source and drain regions 176 and 177 of the channel layer 150. Referring to FIG. 18, the source and drain regions 176 and 177 of the channel layer 150 may be subjected to a plasma treatment (indicated schematically by arrows 174 and 175). In embodiments, the plasma treatment may be a helium (He) plasma treatment. The plasma treatment of the source and drain regions 176 and 177 of the channel layer 150 may be conducted for between 5 seconds and 5 minutes, such as between 30 and 120 seconds (e.g., ~60 seconds). The plasma treatment may be conducted with a power density that is greater than 0.3 W/cm2, such as between 0.8 and 1.2 W/cm2 (e.g., ~0.98 W/cm2).

In embodiments, the plasma treatment may lower the contact resistance at the source and drain regions 176 and 177. In various embodiments, the plasma treatment may result in regions that are comparatively rich in the first metal, M, of the channel layer 150 (e.g. In), which may promote a reduction in contact resistance. The plasma treatment may also produce regions 178, 179 of the channel layer 150 beneath the source and drain regions 176 and 177 that may be comparatively rich in oxygen vacancies. In embodiments, the oxygen-vacancy rich regions 176 and 177 may be located at a depth of at least about 0.5 nm beneath the upper surface 159 of the channel layer 150, and may extend to a depth of up to about 70 nm beneath the upper surface 159 of the channel layer 150. In various embodiments, a concentration of oxygen vacancies in regions 178, 179 beneath the source and drain regions 176, 177 may be greater than a concentration of oxygen vacancies within a central region 161 of the channel layer located between regions 178 and 179. The oxygen-vacancy rich regions 176 and 177 of the channel layer 150 may reduce the source-gate and drain-gate resistance of the channel layer 150. Following the plasma treatment, the mask 170 may be removed via a suitable method.

Figure 19:
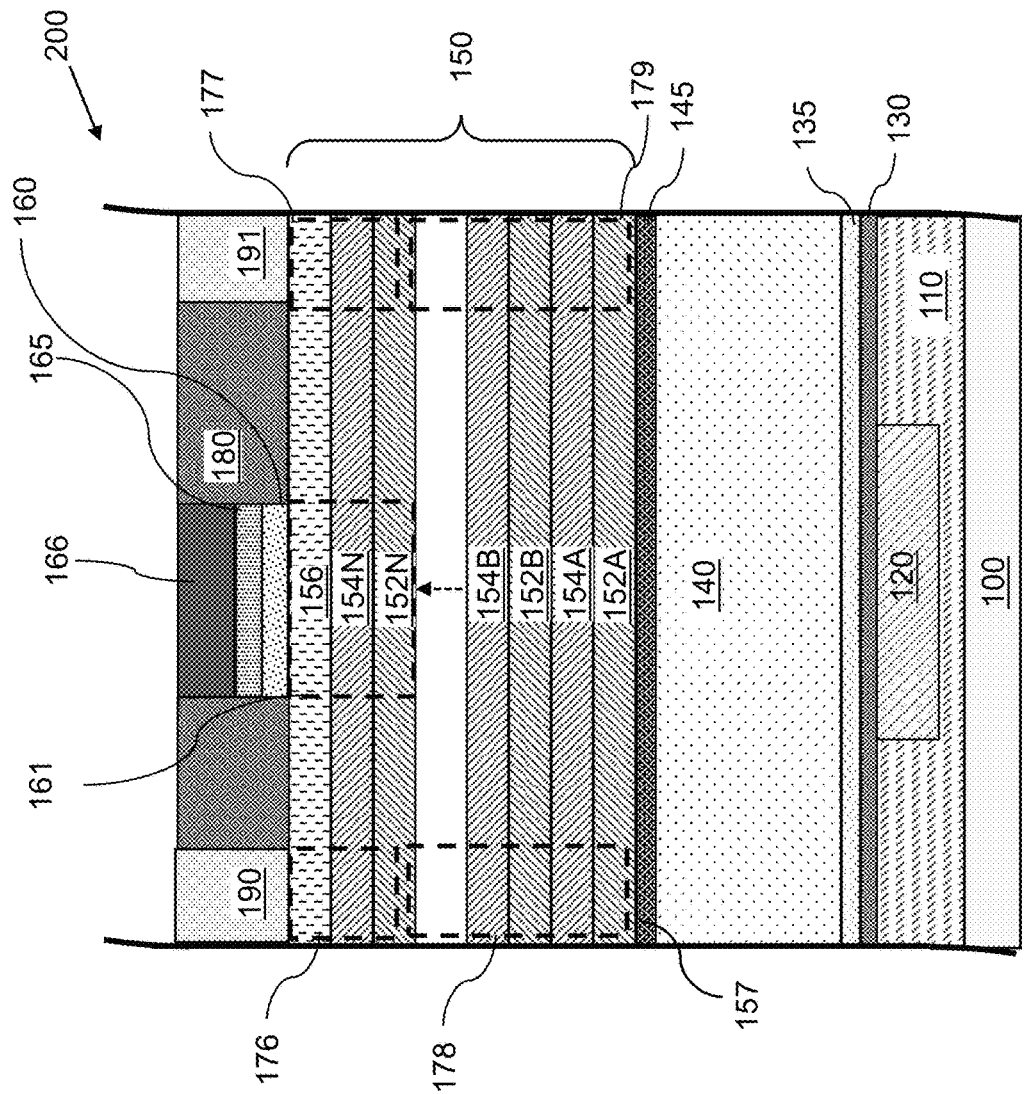
FIG. 19 is a vertical cross-section view of an exemplary structure of a FeFET device including source and drain electrodes formed over source and drain regions of a channel layer.

FIG. 19 is a vertical cross-section view of an exemplary structure of a FeFET device 200 including source and drain electrodes 190 and 191 formed over the source and drain regions 176 and 177 of the channel layer 150. Referring to FIG. 19, the source and drain electrodes 190 and 191 may include any suitable electrically conductive material, such as titanium nitride (TiN), molybdenum (Mo), copper (Cu), aluminum (Al), zirconium (Zr), titanium (Ti), tungsten (W), tantalum (Ta), tantalum nitride (TaN), ruthenium (Ru), palladium (Pd), platinum (Pt), cobalt (Co), nickel (Ni), iridium (Ir), iron (Fe), beryllium (Be), chromium (Cr), antimony (Sb), osmium (Os), thorium (Th), vanadium (V), alloys thereof, and combinations of the same. Other suitable electrode materials are within the scope of disclosure. The source and drain electrodes 190 and 191 may electrically contact the source and drain regions 176 and 177, respectively, of the channel layer 150. The source and drain electrodes 190 and 191 may be deposited using any suitable deposition method, such as physical vapor deposition (PVD), sputtering, chemical vapor deposition (CVD), atomic layer deposition (ALD), plasma-enhanced chemical vapor deposition (PECVD), or combinations thereof. In embodiments, the source and drain regions 190 and 191 may be deposited via atomic layer deposition (ALD). In various embodiments, the source and drain electrodes 190 and 191 may be formed by depositing a layer of an electrically conductive material over the upper surfaces of the passivation layer 180 and the patterned mask 166 and within the openings 174, 175 through the passivation layer 180. Then, a planarization process, such as a chemical mechanical planarization (CMP) process, may be used to remove portions of the electrically conductive material from above the upper surfaces of the passivation layer 180 and the patterned mask 166 and provide discrete source and drain electrodes 190 and 191 contacting the upper surface of the channel layer 150. In embodiments, the upper surfaces of the source and drain electrodes 190 and 191 may be co-planar with the upper surfaces of the passivation layer 180 and the patterned mask 166. In embodiments, the source and drain electrodes 190 and 191 may be laterally spaced from the capping layers 160 and 165 by the passivation layer 180, which may minimize electrical shorts between the source and drain electrodes 190 and 191.

Although the various embodiments, structures and methods described herein have been with reference to metal-ferroelectric-semiconductor (MFS) FeFET structures, it will be understood that various embodiments of the present disclosure may be utilized in connection with other structures, including metal-ferroelectric-metal field effect transistor (MFMFET) FeRAM structures and metal-ferroelectric-insulator field effect transistor (MFIFET) FeRAM structures. For example, a MFMFET and/or MFIFET FeRAM device may include a buried electrode 120, optional stress layer 130, optional seed layer 135, FE material layer 140, optional insulating layer 145, oxide semiconductor channel layer 150, and/or a capping layer 160, 165 as described herein in accordance with various embodiments.

Figure 20:
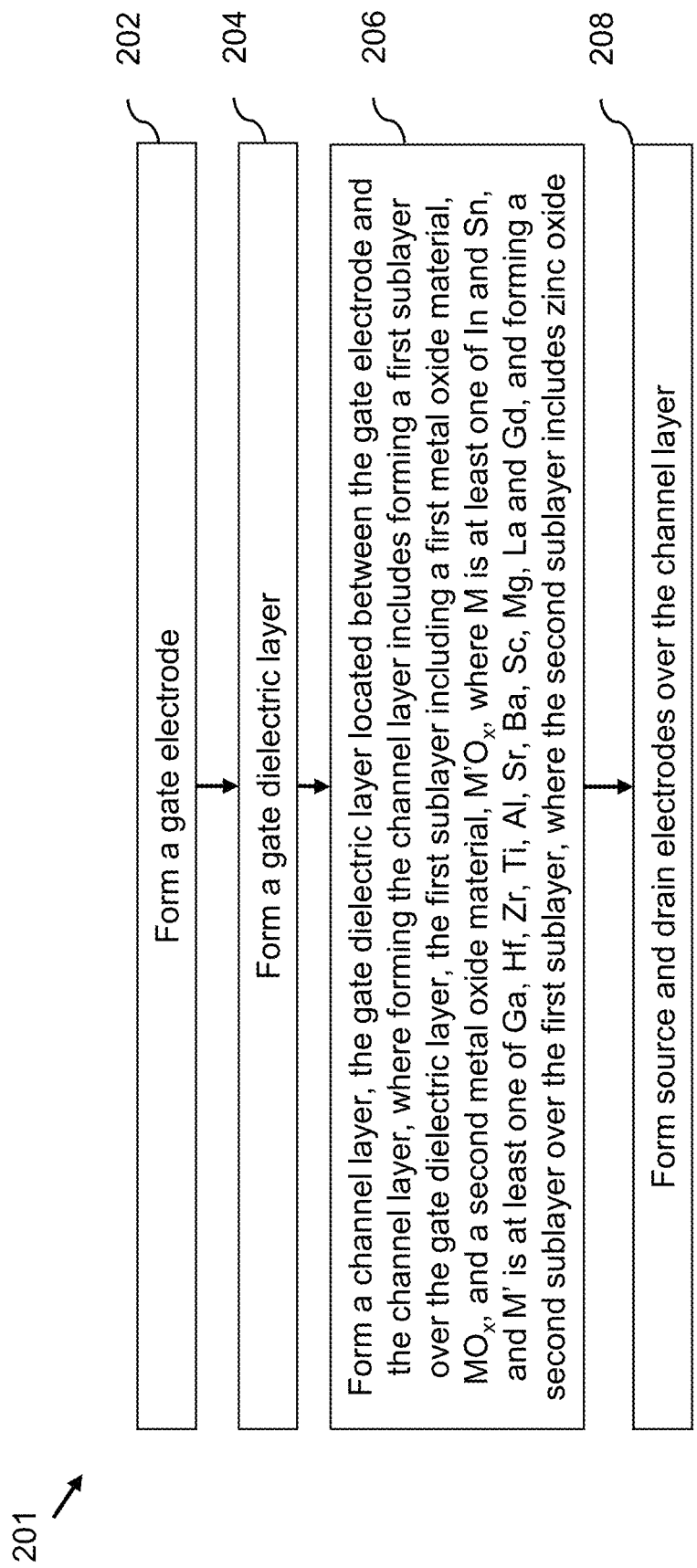
FIG. 20 is a flow chart illustrating steps of a method of forming a field effect transistor device, such as a FeFET device, according to various embodiments of the present disclosure.

FIG. 20 is a flow chart illustrating steps of a method 201 of forming a field effect transistor device 200, such as a FeFET device as shown in FIG. 19, according to various embodiments of the present disclosure. Referring to FIGS. 2 and 20, in step 202, a gate electrode 120 may be formed on a supporting substrate, such as a dielectric layer. The gate electrode 120 may be a buried electrode that is embedded within the dielectric layer. In embodiments, the gate electrode 120 may be made of an electrically conductive material, such as copper (Cu), aluminum (Al), zirconium (Zr), titanium (Ti), titanium nitride (TiN), tungsten (W), tantalum (Ta), tantalum nitride (TaN), molybdenum (Mo), ruthenium (Ru), palladium (Pd), platinum (Pt), cobalt (Co), nickel (Ni), iridium (Ir), iron (Fe), beryllium (Be), chromium (Cr), antimony (Sb), molybdenum (Mo), osmium (Os), thorium (Th), vanadium (V), alloys thereof, and combinations of the same.

The gate electrode may be formed using any suitable deposition process. For example, suitable deposition processes may include physical vapor deposition (PVD), sputtering, chemical vapor deposition (CVD), atomic layer deposition (ALD), plasma-enhanced chemical vapor deposition (PECVD), or combinations thereof.

Referring to FIGS. 6, 7 and 20, in step 204, a gate dielectric layer 140, 145 may be formed. In embodiments, the gate dielectric layer 140, 145 may be deposited over the gate electrode 120. In various embodiments, the gate dielectric layer 140, 145 may be, or may include, a ferroelectric (FE) material layer 140. In various embodiments, the Fe material layer 140 may be hafnium oxide-based ferroelectric material, such as $Hf_xZr_{x-1}O_y$ where $0 \le x \le 0$ (e.g., $Hf0.5Zr0.5O2$), $HfO2$, $HfSiO$, $HfLaO$, etc. In various embodiments, the FE material layer 140 may be hafnium zirconium oxide (HZO) doped with atoms having a larger ionic radius than hafnium (e.g., Al, Si, etc.) and/or doped with atoms having a smaller ionic radius than hafnium (e.g., La, Sc, Ca, Ba, Gd, Y, Sr, etc.). The FE material layer 140 may be deposited using any suitable deposition process, such as via atomic layer deposition (ALD).

In some embodiments, the gate dielectric layer may include an FE material layer 140 and an optional insulating layer 145 over the FE material layer 140. The optional insulating layer 145 (also referred to as a "blocking" layer) may include a layer of dielectric material, such as a high-k dielectric material. The optional insulating layer 145 may be deposited using any suitable deposition processes, such as atomic layer deposition (ALD).

Referring to FIGS. 8, 9A, 9B, 10 and 20, in step 206, a channel layer 150 may be formed such that the gate dielectric layer 140, 145 is located between the gate electrode 120 and the channel layer 150. The step 206 of forming the channel layer 150 may include forming a first sublayer 152A of the channel layer 150 over the gate dielectric layer 140, 145, where the first sublayer 152A includes a first metal oxide material, MOx, and a second metal oxide material, M'Ox, where M is at least one of indium (In) and tin (Sn), and M' is at least one of gallium (Ga), hafnium (Hf), zirconium (Zr), titanium (Ti), aluminum (Al), strontium (Sr), barium (Ba), scandium (Sc), magnesium (Mg), lanthanum (La), and gadolinium (Gd), and forming a second sublayer 154A of the channel layer 150 over the first sublayer 152A, where the second sublayer 154A includes zinc oxide.

In various embodiments, forming the first sublayer 152A may include introducing a precursor mixture 901-1, 905-1, 907-1 including precursors containing the first metal, M, and the second metal, M', into an atomic layer deposition (ALD) reaction chamber to deposit the first sublayer 152A over the gate dielectric layer 140, 145, and forming the second sublayer 154A may include introducing a precursor 903-1 containing zinc into the atomic layer deposition (ALD) reaction chamber to deposit the second sublayer 154A over the first sublayer 152A.

Referring to FIGS. 16-20, in step 208, source and drain electrodes 190 and 191 may be formed over the channel layer 150. In embodiments, the source and drain electrodes 190 and 191 may be made of an electrically conductive material, such as titanium nitride (TiN), molybdenum (Mo), copper (Cu), aluminum (Al), zirconium (Zr), titanium (Ti), tungsten (W), tantalum (Ta), tantalum nitride (TaN), ruthenium (Ru), palladium (Pd), platinum (Pt), cobalt (Co), nickel (Ni), iridium (Ir), iron (Fe), beryllium (Be), chromium (Cr), antimony (Sb), osmium (Os), thorium (Th), vanadium (V), alloys thereof, and combinations of the same. The source and drain electrodes 190 and 191 may be deposited using any suitable deposition process, such as via atomic layer deposition (ALD).

Further embodiments are directed to is directed to ferroelectric (FE) structures, including FeFET devices, having a metal-ferroelectric-metal-insulator-semiconductor (MFMIS) structure. An MFMIS FET structure may serve as a portion of a transistor with a metal-ferroelectric-metal (MFM) stack serving as a gate structure over an insulator on a semiconductor channel. In some comparative embodiments, the MFMIS FET structure may use single-crystal lead zirconate titanate (PZT) or barium strontium titanate (SBT). A thickness of the PZT or SBT influences performance of the MFMIS FET structure. For example, a thicker ferroelectric layer may result in a greater resistance value and a lower capacitance value. The thickness of the ferroelectric layer also affects multi-domain characteristics of the MFM stack. Therefore, various embodiments may include an MFMIS FET structure having thinner layers.

Various embodiments of the present disclosure may provide a semiconductor memory structure and a method for forming the same. In some embodiments, the semiconductor memory structure may be an MFMIS memory structure. In some embodiments, the semiconductor memory structure may include a bottom-gate structure. In some embodiments, the MFMIS memory structure may include a hafnium zirconium oxide (HfZrO)-based ferroelectric layer that may be formed by atomic layer deposition (ALD). Accordingly, a thinner ferroelectric layer may be obtained. In some embodiments, the semiconductor memory structure may be a memory structure disposed in a front-end-of-line (FEOL) structure or a back-end-of-line (BEOL) interconnect structure. Thus a feasibility of the MFMIS memory structure is further improved.

Figure 21:
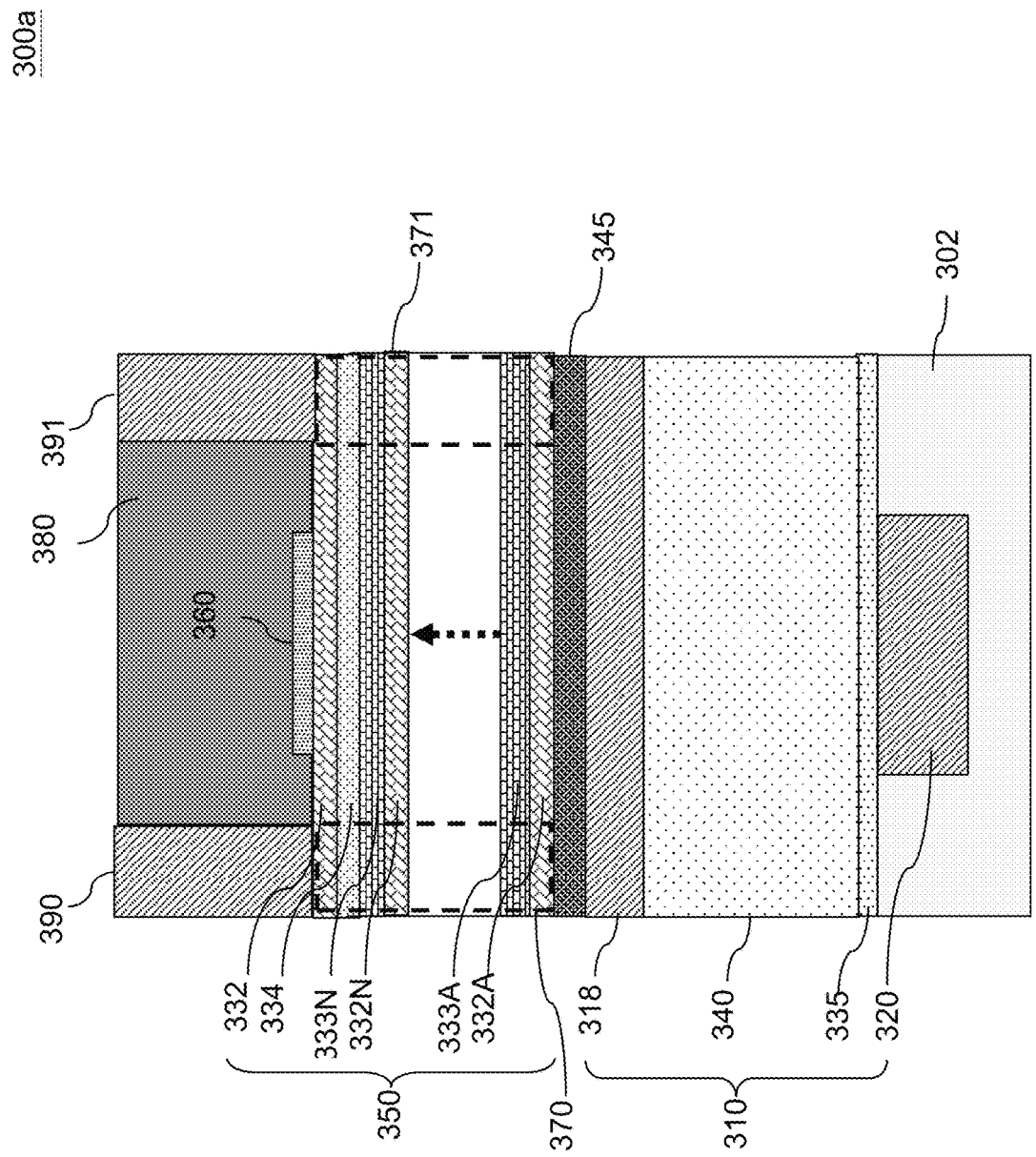
FIG. 21 is a vertical cross-section view of an exemplary structure of a metal-ferroelectric-metal-insulator-semiconductor (MFMIS) field effect transistor (FET) device according to an embodiment of the present disclosure.
Figure 22:
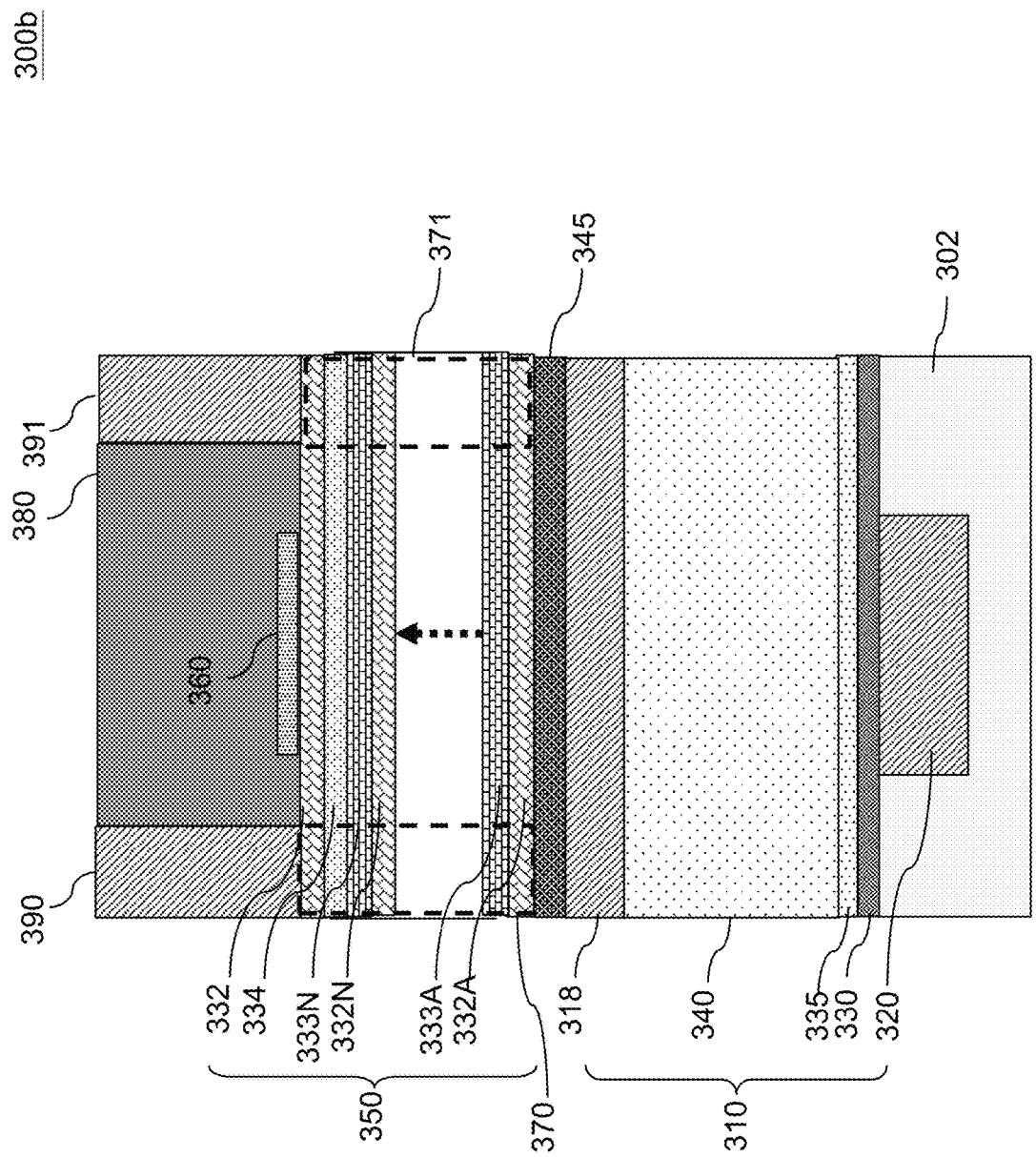
FIG. 22 is a vertical cross-section view of an exemplary structure of a metal-ferroelectric-metal-insulator-semiconductor (MFMIS) field effect transistor (FET) device according to another embodiment of the present disclosure.
Figure 23:
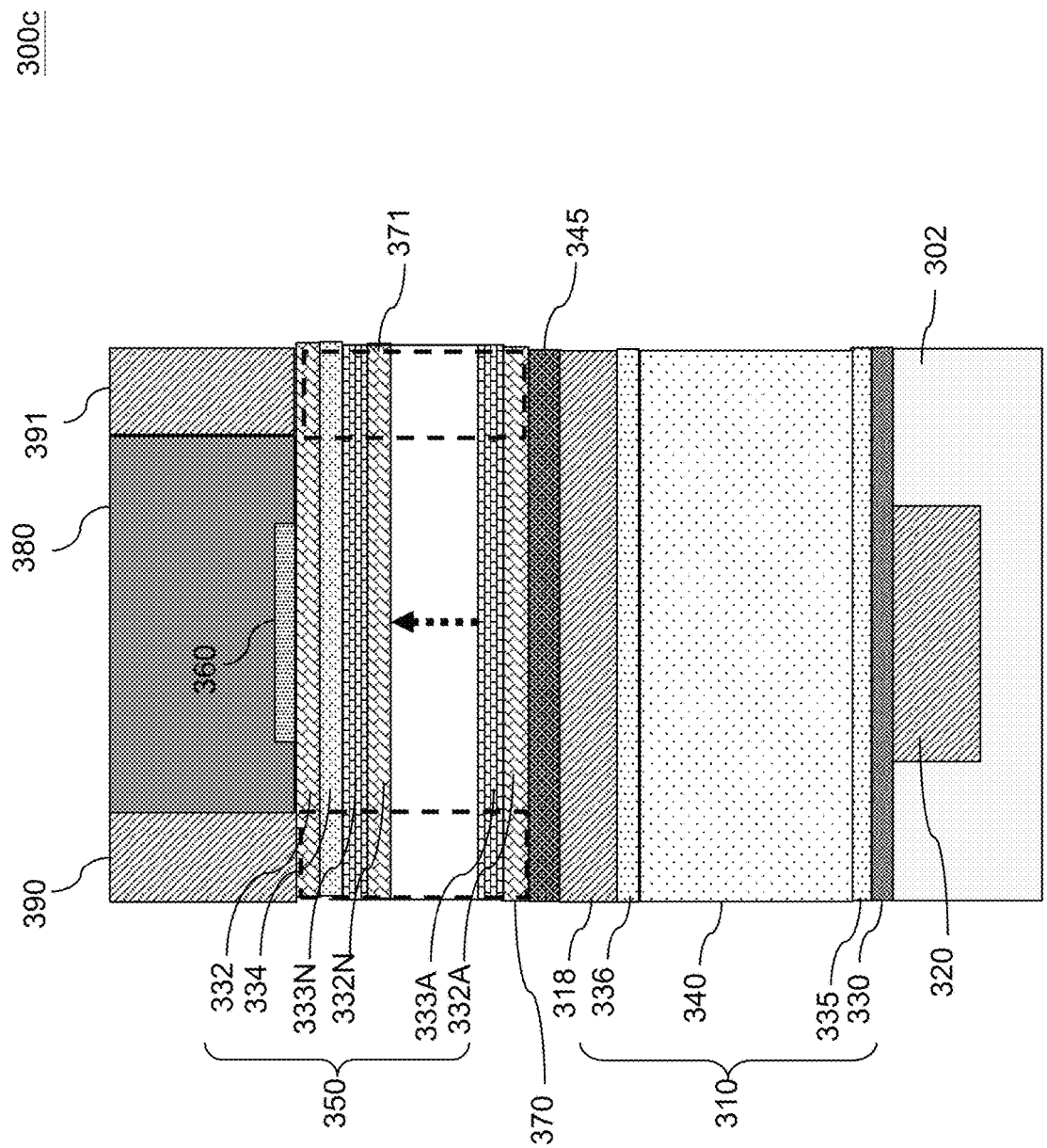
FIG. 23 is a vertical cross-section view of an exemplary structure of a metal-ferroelectric-metal-insulator-semiconductor (MFMIS) field effect transistor (FET) device according to another embodiment of the present disclosure.

FIGS. 21, 22 and 23 are vertical cross-section views respectively illustrating semiconductor memory structures 300a, 300b and 300c according to aspects of the present disclosure in one or more embodiments. It should be noted that same elements in FIGS. 21, 22 and 23 are indicated by same numerals, and can include a same material. In some embodiments, the semiconductor memory structures 300a, 300b and 300c may be disposed in and over a semiconductor substrate 302. The semiconductor memory structures 300a, 300b and 300c may include a gate structure 310, an insulating layer 345, a channel layer 350 (which may also be referred to as a semiconductor stack), a source electrode 390 and a drain electrode 391. As shown in FIGS. 21, 22 and 23, the gate structure 310 may include a buried gate electrode 320, a ferroelectric layer 340 (which may also be referred to as a ferroelectric memory layer) over the buried gate electrode 320, a seed layer 335 between the ferroelectric layer 340 and the buried gate electrode 320, and a floating gate electrode 318 over the ferroelectric layer 340. In some embodiments, a buffer layer 330 (which may also be a stress layer) may be disposed between the seed layer 335 and the buried gate electrode 320, as shown e.g., in FIGS. 22-24. In some embodiments, another seed layer 336 may be disposed between the ferroelectric layer 340 and the floating gate electrode 318, as shown e.g., in FIGS. 23, 27, 28.

Figure 25:
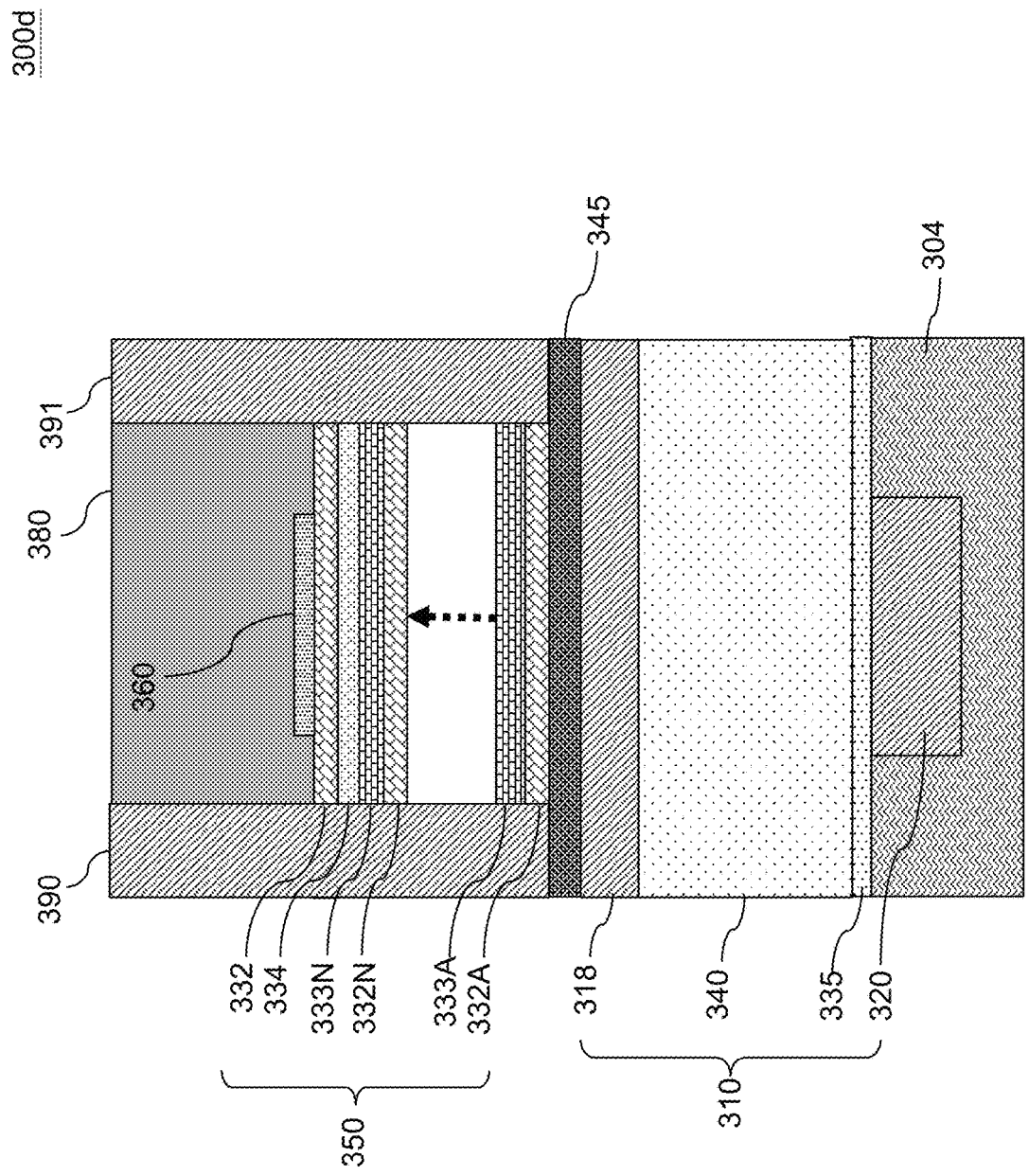
FIG. 25 is a vertical cross-section view showing an MFMIS FET memory structure according to an embodiment of the present disclosure.

Referring to FIGS. 21, 22 and 25, in some embodiments, the buried gate electrode 320 may be disposed in the semiconductor substrate 302. Further, a top surface of the buried gate electrode 320 may be aligned with (i.e., coplanar with) a top surface of the semiconductor substrate 302. The buried gate electrode 320 may include an electrically conductive material, including any of the materials of the bottom electrode layer 120 described above with reference to FIG. 3. For example, the buried gate electrode 320 may include a metal and/or a metal nitride material. In some embodiments, the buried gate electrode 320 may include platinum (Pt), titanium (Ti), titanium nitride (TiN), tantalum (Ta), tantalum nitride (TaN), tungsten (W), iron (Fe), nickel (Ni), beryllium (Be), chromium (Cr), cobalt (Co), antimony (Sb), iridium (Ir), molybedem (Mo), osmium (Os), thorium (Th), vanadium (V), or a combination thereof. Other suitable conductive materials are within the contemplated scope of disclosure.

In some embodiments, an optional seed layer 335 may be disposed on the semiconductor substrate 302 and the buried gate electrode 320. In some embodiments, a width of the seed layer 335 may be greater than a width of the buried gate electrode 320, as shown in FIGS. 21, 22 and 23, but the disclosed embodiments are not limited thereto. In some embodiments, an optional seed layer 336 may be disposed on the ferroelectric layer 340, as shown in FIG. 23. In other words, the ferroelectric layer 340 may be disposed between two seed layers 335 and 336. A thickness of the seed layers 335 and 336 may be between approximately 0.1 nanometer and approximately 5 nanometers, but the disclosed embodiments are not limited thereto. In some embodiments, the seed layers 335 and 336 may be a single-layered structure. In some alternative embodiments, the seed layers 335 and 336 may be a multi-layered structure. The seed layers 335 and 336 may include a metal oxide material, including any of the materials of the optional seed layer 135 described above with reference to FIG. 5. In some embodiments, the seed layers 335 and 336 may include zirconium oxide of cubic-phase (c-phase), tetragonal phase (t-phase) or orthorhombic phase (o-phase), zirconium yttrium oxide of c-phase, t-phase or o-phase, hafnium oxide of c-phase, t-phase or o-phase, aluminum oxide of c-phase, t-phase or o-phase, and hafnium zirconium oxide of c-phase, t-phase or o-phase. For example, the seed layers 335 and 336 may include c-phase, t-phase or o-phase zirconium dioxide (ZrO2), c-phase, t-phase or o-phase zirconium dioxide and diyttuim trioxide (ZrO2-Y2O3), c-phase, t-phase or o-phase hafnium dioxide (HfO2), c-phase, t-phase or o-phase dialuminum trioxide (Al2O3), c-phase, t-phase or o-phase hafnium zirconium oxide (HfxZr1−xOy), or a combination thereof, wherein x of HfxZr1−xOy can be varied from 0 to 1.

The ferroelectric layer 340 may be formed on seed layer 335. In some embodiments, a thickness of the ferroelectric layer 340 may be between approximately 0.1 nanometer and approximately 100 nanometers. The ferroelectric layer 340 may be formed of a suitable ferroelectric material, including any of the ferroelectric materials described above with reference to FIG. 6. In some embodiments, the ferroelectric layer 340 may include hafnium zirconium oxide (HfxZr1−xOy), wherein x of HfxZr1−xOy can be varied from 0 to 1. For example, the ferroelectric layer 340 may include Hf0.5Zr0.5O2. In some embodiments, the ferroelectric layer 340 may include c-phase, t-phase or o-phase Hf0.5Zr0.5O2. In some embodiments, the ferroelectric layer 340 may include c-phase, t-phase, o-phase, and m-phase Hf0.5Zr0.5O2, with the c-, t-, o-phase Hf0.5Zr0.5O2 being greater than 50% compared to the m-phase Hf0.5Zr0.5O2, but the disclosure is not limited thereto. In some embodiments, the ferroelectric layer 340 (i.e., the hafnium zirconium oxide (HfxZr1−xOy) layer) may include oxygen vacancies. In some embodiments, the ferroelectric layer 340 (i.e., the hafnium zirconium oxide (HfxZr1−xOy) layer) may be doped with silicon (Si), Al, or ions of larger radius, such as lanthanum (La), scandium (Sc), calcium (Ca), barium (Ba), gadolinium (Gd), strontium (Sr), or yttrium (Y). The doped HfxZr1−xOy layer may have improved polarization hysteresis. For example the polarization hysteresis of the doped HfxZr1−xOy layer may be improved by between approximately 2 cat % and approximately 20 cat %. In some embodiments, the ferroelectric memory layer 340 may include aluminum nitride (AlN) doped with Sc or other ferroelectric elements.

In some embodiments, the floating gate electrode 318 may be formed on the ferroelectric layer 340. Further, the floating gate electrode 318 may be in contact with the ferroelectric layer 340, as shown in FIG. 21. The floating gate electrode 318 may include an electrically conductive material. For example, the floating gate electrode 318 may include a metal and/or metal nitride material. In some embodiments, the floating gate electrode 318 may include Pt, Ti, TiN, Ta, TaN, W, Fe, Ni, Be, Cr, Co, Sb, Ir, Mo, Os, Th, V, or a combination thereof. Other suitable conductive materials are within the scope of disclosure. In some embodiments, the floating gate electrode 318 may include a conductive material having a coefficient of thermal expansion (CTE) less than that of the ferroelectric layer 340. For example, the floating gate electrode 318 may include a conductive material having a CTE less than that of the o-phase ferroelectric layer 340. In some embodiments, the buried gate electrode 320 and the floating gate electrode 318 may include same conductive material. Thus, the o-phase ferroelectric memory layer 340 may be stabilized by the floating gate electrode 318. In some alternative embodiments, the buried gate electrode 320 and the floating gate electrode 318 may include different conductive materials.

Referring to FIGS. 22 and 23, in some embodiments, an optional buffer layer 330 may be disposed between the seed layer 335 and the buried gate electrode 320. Additionally, the buffer layer 330 may also be disposed between the seed layer 335 and the semiconductor substrate 302. A thickness of the buffer layer 330 may be between approximately 0.5 nanometer and approximately 5 nanometers. In some embodiments, the buffer layer 330 may impart a tensile strain on the ferroelectric layer 340. In such embodiments, the buffer layer 330 may also be referred to as a stress layer. The buffer layer 330 may be composed of any the materials of stress layer 130 described above with reference to FIG. 4. In some embodiments, the buffer layer 330 may include a material having a lattice constant a0 that is larger than the in-plane lattice constant of the material of the ferroelectric layer 340 in order to induce tensile strain in the ferroelectric layer 340. Alternatively or in addition, the buffer layer 330 may have a CTE that is greater than that of the underlying buried gate electrode 320. In some embodiments, the buffer layer 330 may include metal oxides, alkali metal oxides, alkali earth oxides, and semiconductor oxides. In some embodiments, the buffer layer 330 may be a single layer including, for example but not limited thereto, tantalum oxide (Ta2O5), a-titanium oxide (a-Ti2O3), a-indium oxide (a-In2O3), a-ferrous oxide (a-Fe2O3), potassium oxide (K2O), rubidium oxide (Rb2O), strontium oxide (SrO), barium oxide (BaO), a-vanadium oxide (a-V2O3), a-chromium oxide (a-Cr2O3), yttrium-aluminum oxide (YAlO), ytterbium oxide (Yb2O3), dysprosium oxide (Dy2O3), gadolinium oxide (Gd2O3), a-gallium oxide (a-Ga2O3), strontium titanate (SrTiO3), dysprosium scandate (DyScO3), terbium scandate (TbScO3), gadolinium scandate (GdScO3), neodymium scandate (NdScO3), neodymium gallate (NdGaO3), and lanthanum strontium aluminate (LaSrAlO3, LSAT). In some embodiments, the buffer layer 330 may be a bi-layered structure including lanthanum strontium manganite (LaSrMnO3, LSMO) and SrTiO3, LSMO and DyScO3, LSMO and GdScO3, LSMO and NdScO3, LSMO and NdGaO3, or LSMO and LSAT. In some embodiments, the CTE of the buffer layer 330 is greater than the CTE of the underlying buried gate electrode 320, and a tensile strain may therefore be generated on the ferroelectric layer 340. The tensile strain may be preferable to o-phase stabilization in the ferroelectric layer 340. Accordingly, the buffer layer 340 can be referred to as a stress layer.

In some embodiments, the buried gate electrode 320, the ferroelectric layer 340 and the floating gate electrode 318, together with the optional seed layers 335, 336 and the optional buffer layer 330 may be referred to as an MFM gate structure 310.

An insulating layer 345 may be disposed between the MFM gate structure 310 and the channel layer 150. In some embodiments, a thickness of the insulating layer 345 may be between approximately 0.1 nanometer and approximately 10 nanometers. The insulating layer 345 may include a suitable dielectric material, including any of the materials of the insulating layer 145 described above with reference to FIG. 7. The insulating layer 145 may include high-k dielectric materials. In some embodiments, the insulating layer 145 may be a single layer including silicon-doped hafnium oxide (Si—HfO). In such embodiments, a silicon atom ratio in the insulating layer 145 may be greater than approximately 10% in order to achieve higher VCBO and VVBO and to mitigate electron and hole leakage current issues. In some embodiments, the insulating layer 145 may be a bi-layered structure including a Si—HfO layer and a hafnium zirconium oxide (HfZrO) layer. In such embodiments, an interface region is defined as a region extending from one nanometer below to one nanometer above an interface between the Si—HfO layer and the HfZrO layer. Further, in the interface region, a ratio of oxygen to zirconium is equal to or greater than 1, and a ratio of oxygen to hafnium is greater than 1. In some embodiments, the insulating layer 145 may further include Si, magnesium (Mg), nitrogen (N), calcium (Ca), Al, Y2O3, La, Sr, Gd, Sc, or combinations thereof.

A channel layer 350 may be disposed over the insulating layer 345. Referring to FIGS. 21, 22 and 23, the channel layer 350 may include a plurality of semiconductor layers stacked over the insulating layer 345. Accordingly, the channel layer 350 may also be referred to as a semiconductor stack. In some embodiments, a thickness of the channel layer 350 may be between approximately 2 nanometers and approximately 200 nanometers, but the disclosure is not limited thereto. In some embodiments, the channel layer 350 includes a first semiconductor layer 332, a second semiconductor layer 333 and a third semiconductor layer 334. Further, the first semiconductor layer 332, the second semiconductor layer 333 and the third semiconductor layer 334 are different from each other. For example, the first semiconductor layer 332 may be a GaOx layer, the second semiconductor layer 333 may be an InOx layer, and the third semiconductor layer 334 may be a ZnO layer, but the disclosure is not limited thereto. In some embodiments, for the first semiconductor layer 332, Ga may be replaced with Hf, Zr, Ti, Al, Ta, Sr, Ba, Sc, Mg, La, or Gd. The first semiconductor layer 332 may include ions that are able to reduce oxygen vacancies and lower surface states (Dit). The second semiconductor layer 333 may include tin-gallium-zinc oxide (SnGaZnO). The second semiconductor layer 333 may include semiconductor materials that are able to increase electron mobility.

The first semiconductor layer 332 and the second semiconductor layer 333 may be alternately arranged. In embodiments, the channel layer 350 may include an alternating stack of semiconductor layers, including a first set of first semiconductor layers 332A, 332B . . . 332N, and a second set of second semiconductor layers 333A, 333B . . . 333N. Each of the first semiconductor layers 332 may include a metal oxide material that includes gallium (Ga), hafnium (Hf), zirconium (Zr), titanium (Ti), aluminum (Al), tantalum (Ta), strontium (Sr), barium (Ba), scandium (Sc), magnesium (Mg), lanthanum (La), and gadolinium (Gd) or combinations thereof. Each of the second semiconductor layers 333 may include a metal oxide material that includes indium (In), tin (Sn), or combinations thereof. The number of the alternating layers 332 and 333 can be made as high as the number of layers needed for the semiconductor memory device. Further, in some embodiments, the bottommost layer of the alternating stack may be the first semiconductor layer 332A, and the topmost layer of the alternating stack may be the second semiconductor layer 333N, as shown in FIGS. 21, 22 and 23. In embodiments, the third semiconductor layer 334 may be disposed over the topmost layer of the alternating stack of first and second semiconductor layers 332 and 333. For example, the third semiconductor layer 334 may be located over the topmost second semiconductor layer 333N. In various embodiments, a first semiconductor layer 332 may be disposed over the third semiconductor layer 334. The semiconductor stack including each of the first semiconductor layers 332, the second semiconductor layers 333, and the third semiconductor layer 334, may together form a channel layer 150. In various embodiments, a first semiconductor layer 332 may be a bottommost and a topmost layer of the semiconductor stack forming the channel layer 150.

In alternative embodiments, the channel layer 350 of the semiconductor memory structures 300a, 300b and 300c shown in FIGS. 21, 22 and 23 may be a channel layer 150 as described above with reference to FIGS. 8-10.

Referring again to FIGS. 21, 22 and 23, a source electrode 390 and a drain electrode 391 may contact an upper surface of the channel layer 350. The source electrode 390 may contact a source region of the channel layer 350, and the drain electrode 391 may contact a drain region of the channel layer 350. The source and drain electrodes 390 and 391 may include an electrically conductive material, including any of the materials of the source and drain electrodes 190 and 191 described above with reference to FIG. 19. In various embodiments, the source and drain electrodes 390 and 391 may include TiN, Mo, or combinations thereof, but the disclosure is not limited thereto.

Portions of the channel layer 350 underlying the source and drain electrodes 390, 391 may be regions 370, 371 of the channel layer 350 having relatively higher conductivity than a central portion of the channel layer 350 located between regions 370 and 371. Thus, regions 370 and 371 may also be referred to as conductive regions. In embodiments, the conductive regions 370 and 371 may extend through the semiconductor stack of the channel layer 350, and may extend to the insulating layer 345. In embodiments, at least a portion of the conductive regions 370 and 371 may include at least one of indium and tin at relatively higher concentration than in the central region of the channel layer 350. In embodiments, at least a portion of the conductive regions 370 and 371 may include oxygen vacancies at a higher concentration than in the central region of the channel layer 350.

In some embodiments, at least one capping layer 360 may disposed over the channel layer 350, and a passivation layer 380 may be disposed over the at least one capping layer 360. The at least one capping layer 360 may be laterally spaced from the source and drain electrodes 390, 391 such that portions of the passivation layer 380 may be located between the at least one capping layer 360 and the source and drain electrodes 390 and 391, and may contact the upper surface of the channel layer 350. The at least one capping layer 360 may be formed of a metal material, including any of the materials of capping layers 160 and 165 described above with reference to FIGS. 11-13. In various embodiments, the at least one capping layer 360 may include material(s) having a higher affinity for oxygen than the metal materials of the channel layer 350 (e.g., Ga, In, Zn). In some embodiments, the at least one capping layer 360 may be an Al/Ca dual layer, but the disclosure is not limited thereto. For example, the capping layer 360 may include Hf, Zr, Ti, Al, Ta, Sr, Ba, Sc, Mg, La, and Gd. In some embodiments, the passivation layer 380 includes aluminum oxide or silicon oxide, but the disclosure is not limited thereto.

In various embodiments, the at least one capping layer 360 may increase electron mobility. In some embodiments, the uppermost first semiconductor layer 332 of the channel layer 350 and the at least one capping layer 360 together may help reduce surface defects and oxygen vacancies. Consequently, the mobility of the MFMIS FET memory structures 300a, 300b and 300c may be increased while RC delay may be reduced.

The passivation layer 380 may include a suitable dielectric material, such as aluminum oxide, silicon oxide, silicon nitride, or the like. Other materials are within the contemplated scope of disclosure.

Accordingly, the MFM gate structure 310, the insulating layer 345, the channel layer 350, the source electrode 390 and the drain structure electrode 391 may be referred to as an MFMIS FET memory structure. Further, because the MFM gate structure 310 is formed under the insulating layer 345 and the channel layer 350, the MFMIS FET memory structure is a bottom-gate MFMIS FET memory structure.

Figure 24:
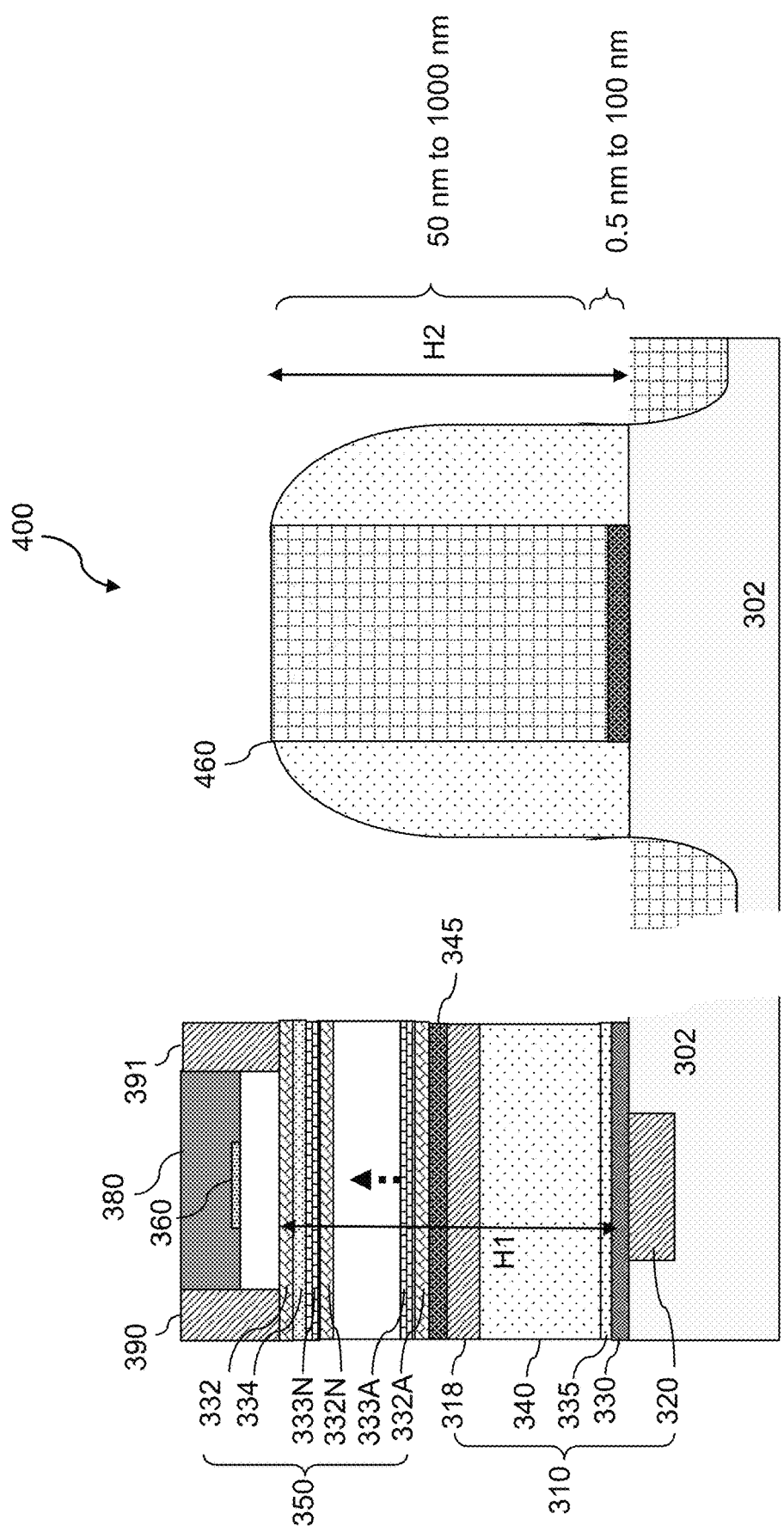
FIG. 24 is a vertical cross-sectional view of showing an MFMIS FET memory structure and a field effect transistor (FET) device located on a semiconductor substrate.

FIG. 24 is a vertical cross-sectional view of showing an MFMIS FET memory structure and a field effect transistor (FET) device 400, such as a complementary metal-oxide semiconductor (CMOS) transistor device, located on a semiconductor substrate 302. Referring to FIG. 24, as mentioned above, the MFMIS FET memory structures 300a, 300b and 300c may be formed in and over the semiconductor substrate 302. In some embodiments, the forming of the MFMIS FET memory structures 300a, 300b and 300c may be integrated with CMOS manufacturing operations. In such embodiments, a sum H1 of a thickness of the gate structure 310, a thickness of the insulating layer 345, and a thickness of the channel layer 350 may be similar to a height H2 of a gate structure 460 of a FET device 400, but the disclosure is not limited thereto.

Figure 26:
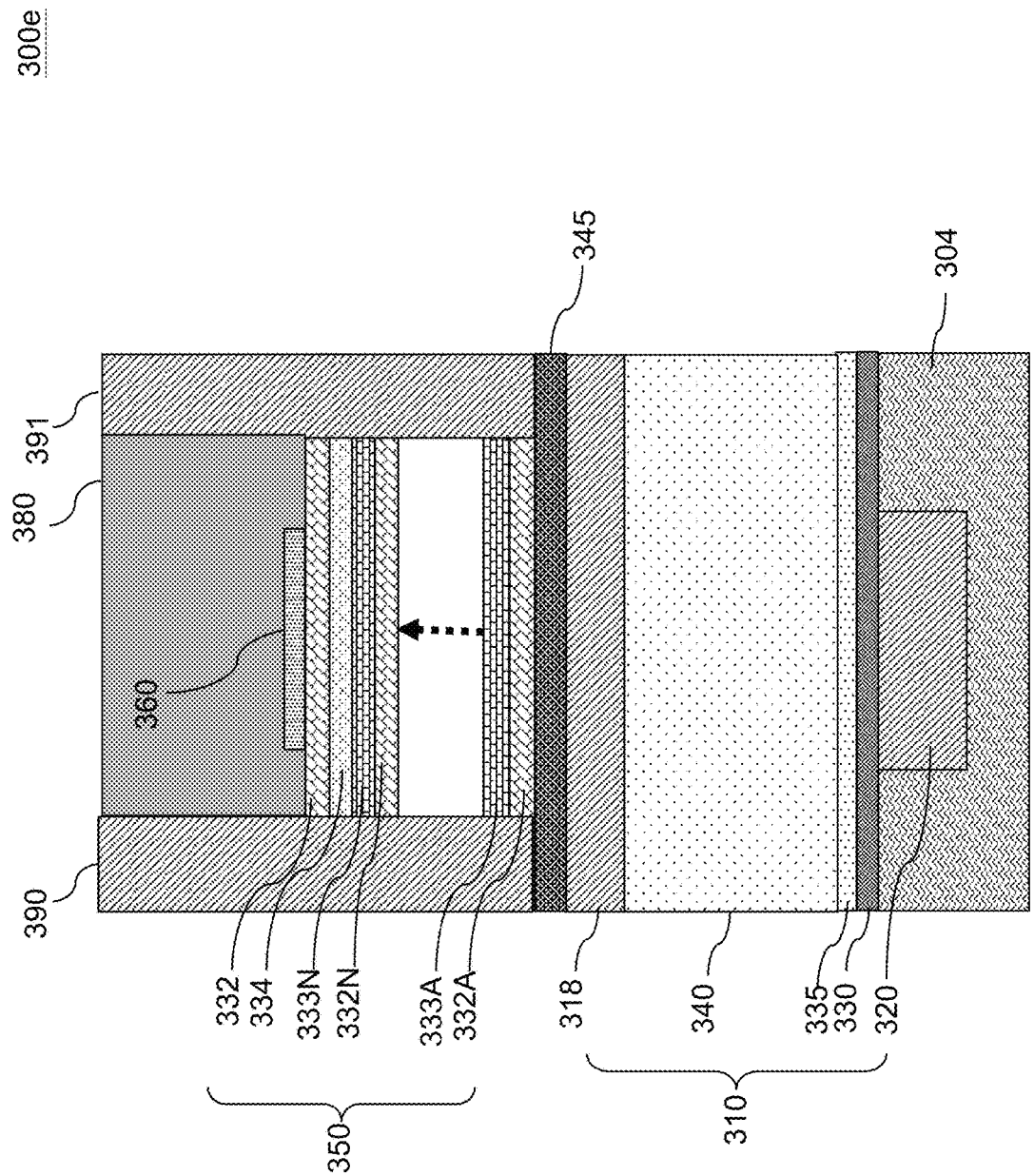
FIG. 26 is a vertical cross-section view showing an MFMIS FET memory structure according to another embodiment of the present disclosure.
Figure 27:
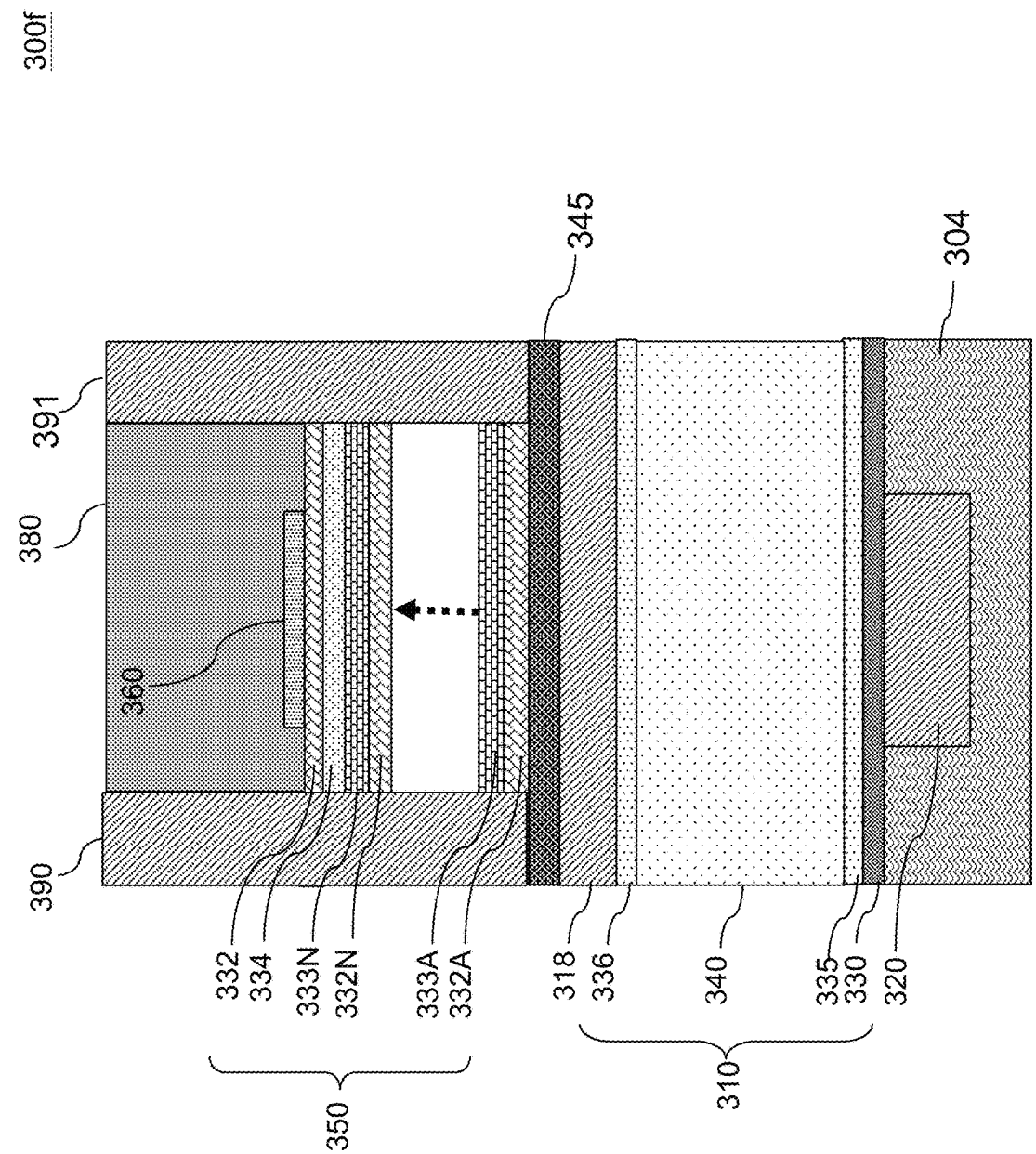
FIG. 27 is a vertical cross-section view showing an MFMIS FET memory structure according to another embodiment of the present disclosure.
Figure 28:
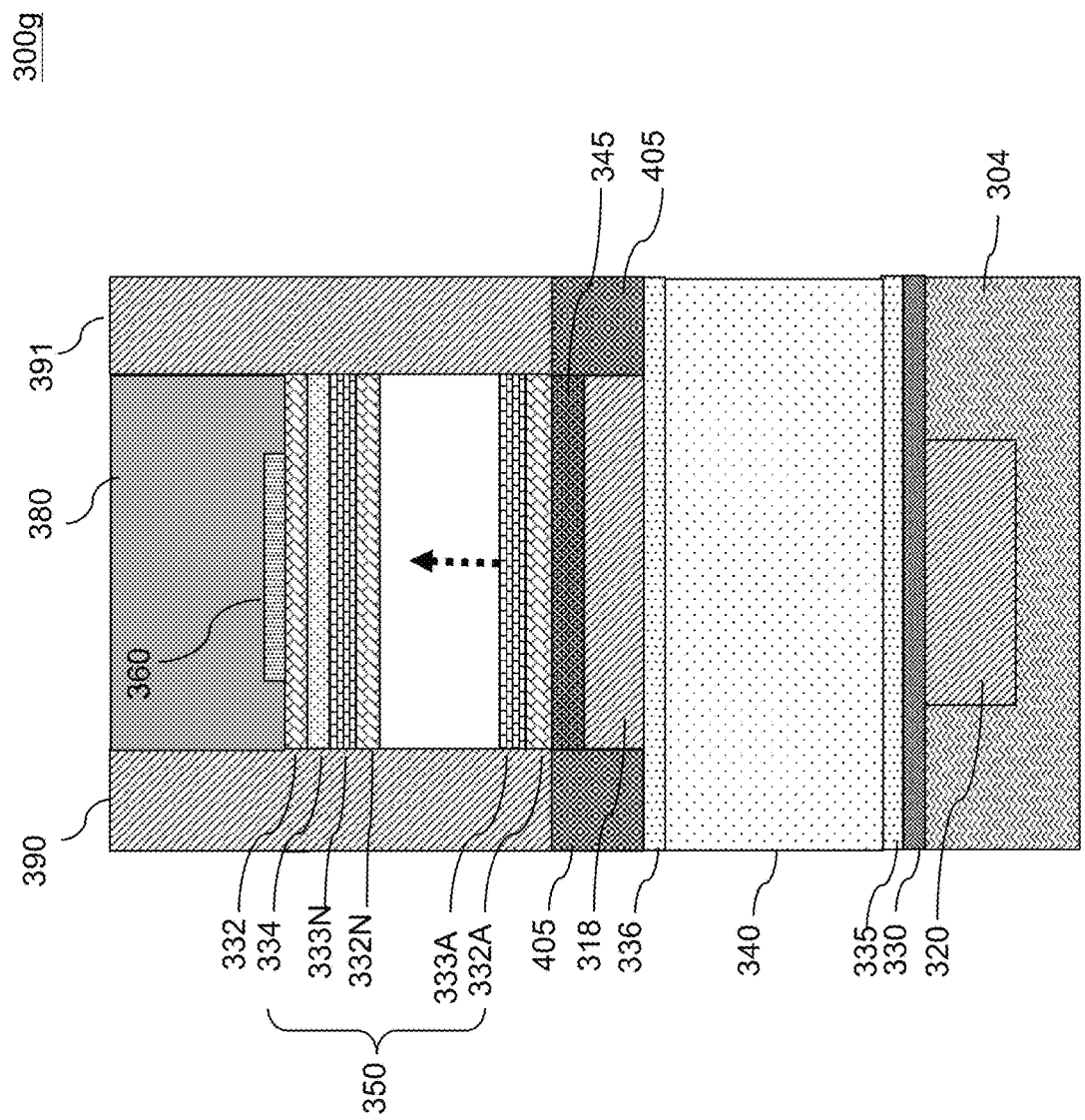
FIG. 28 is a vertical cross-section view showing an MFMIS FET memory structure according to another embodiment of the present disclosure.

FIGS. 25 to 28 are vertical cross-section views illustrating semiconductor memory structures 300d, 300e, 300f and 300g according to aspects of the present disclosure in one or more embodiments. It should be noted that same elements in FIGS. 21 to 28 are indicated by same numerals, and can include a same material; thus, repeated detailed descriptions of such elements are omitted for brevity. In some embodiments, the semiconductor memory structures 300d, 300e, 300f and 300g may be disposed over a semiconductor substrate. Further, the semiconductor memory structures 300d, 300e, 300f and 300g may be disposed in a plurality of dielectric layers over the semiconductor substrate, and the plurality of dielectric layers may be inter-metal dielectric layers of a BEOL interconnect structure. As shown in FIGS. 25 to 28, the semiconductor memory structures 300d, 300e, 300f and 300g include a gate structure 310, an insulating layer 345, a channel layer 350, a source electrode 390 and a drain electrode 391. As mentioned above, the gate structure 310 may include a buried gate electrode 320, a ferroelectric memory layer 340 over the buried gate electrode 320, an optional seed layer 135 between the ferroelectric memory layer 340 and the buried gate electrode 320, and a floating gate electrode 318 on the ferroelectric memory layer 340. In some embodiments, a buffer layer 330 may be disposed between the seed layer 345 and the buried gate electrode 320, as shown in FIGS. 26 to 28. In some embodiments, another seed layer 336 may be disposed on the ferroelectric memory layer 340, as shown in FIGS. 27 and 28.

Referring to FIGS. 25 to 28, in some embodiments, the buried gate electrode 320 is disposed in a dielectric layer 304, such as a dielectric layer of a BEOL interconnect structure. Further, a top surface of the buried gate electrode 320 may be aligned with (i.e., co-planar with) a top surface of the dielectric layer 304. The buried gate electrode 320 includes conductive materials as mentioned above, and repeated descriptions of details are omitted for brevity.

The optional seed layer 335 may be disposed on the dielectric layer 304 and the buried gate electrode 320. In some embodiments, a width of the seed layer 335 may be greater than a width of the buried gate electrode 320, as shown in FIGS. 25 to 28, but the disclosure is not limited thereto. As mentioned above, in some embodiments, when the gate structure 310 further includes an additional seed layer 336, the ferroelectric memory layer 340 may be disposed between the two seed layers 335 and 336. A thickness and a material of the seed layers 335 and 336 may be similar to those described above; therefore, repeated descriptions of details are omitted for brevity.

The ferroelectric memory layer 340 may be formed on the seed layer 335, and the floating gate electrode 318 may be formed on the ferroelectric memory layer 340. In some embodiments, an optional buffer layer 330, which may function as a stress layer, may be disposed between the seed layer 335 and the dielectric layer 304, as shown in FIGS. 26 to 28. Thicknesses and materials of the ferroelectric memory layer 340, the floating gate electrode 318, and the buffer layer 330 may be similar to those described above; therefore, repeated descriptions of details are omitted for brevity. As mentioned above, the buried gate electrode 320, the optional seed layer(s) 335 and 336, the ferroelectric memory layer 340, the optional buffer layer 330, and the floating gate electrode 318 may be referred to as an MFM gate structure 310.

The insulating layer 345 may be disposed between the MFM gate structure 310 and the channel layer 350. A thickness and a material of the insulating layer 345 may be similar to those described above; therefore, repeated descriptions of details are omitted for brevity. The channel layer 350 may include a plurality of semiconductor layers stacked over the insulating layer 345, and may also be referred to as a semiconductor stack. In some embodiments, the channel layer 350 may include a first semiconductor layer 332, a second semiconductor layer 332 and a third semiconductor layer 334. Further, the first semiconductor layer 332, the second semiconductor layer 333 and the third semiconductor layer 334 may be different from each other. A thickness of the channel layer 350, materials of the first, second and third semiconductor layers 332, 333 and 334, and arrangement of the first, second and third semiconductor layers 332, 333 and 334 may be similar to those described above; therefore, repeated descriptions of details are omitted for brevity.

Source and drain electrodes 390 and 391 may contact the channel layer 350. In the exemplary embodiment structures shown in FIGS. 25-28, the source and drain electrodes 390 and 391 may extend below the upper surface of the channel layer 350 such that the source and drain electrodes 390 and 391 may contact the channel layer 350 along the sidewalls of the source and drain electrodes 390 and 391. In some embodiments, the source and drain electrodes 390 and 391 may extend through an entire thickness of the channel layer 350. As shown in the exemplary semiconductor memory structures 300d, 300e and 300f of FIGS. 25, 26 and 27, respectively, the source and drain electrodes 390 and 391 may extend through the channel layer 350 and contact the insulating layer 345 underlying the channel layer 350. Materials of the source and drain electrodes 390 and 391 may be similar to those described above; therefore, repeated descriptions of details are omitted for brevity.

Referring to the exemplary semiconductor memory structure 300g shown in FIG. 28, in some embodiments, a dielectric fill structure 405 may be located above the ferroelectric memory layer 340 and the additional seed layer 336 (if present). The dielectric fill structure 405 may be laterally adjacent to the floating gate electrode 318 and the insulating layer 345, such that sidewalls of the dielectric fill structure 405 may contact side surfaces of the floating gate electrode 318 and the insulating layer 345. An upper surface of the dielectric fill structure 405 may be co-planar with an upper surface of the insulating layer 345. The source and drain electrodes 390 and 391 may extend through a thickness of the channel layer 350 and may contact the upper surface of the dielectric fill material 405, as shown in FIG. 28.

Referring to FIGS. 25 to 28, in some embodiments, at least one capping layer 360 may be disposed over the channel layer 350. The material(s) and arrangement of the at least one capping layer 360 may be similar to those described above; therefore, repeated descriptions of details are omitted for brevity. As mentioned above, the capping layer 360 helps increase electron mobility. In some embodiments, the at least one capping layer 360 and the uppermost first semiconductor channel layer 332 of the channel layer 350 may together help reduce surface defects and oxygen vacancies. Accordingly, the mobility of the MFMIS FET memory structures 300d, 300e, 300f and 300g may be increased while RC delay can be reduced.

As mentioned above, the MFM gate structure 310, the insulating layer 345, the channel layer 350, the source electrode 390 and the drain structure electrode 391 may be referred to as an MFMIS FET memory structure. Further, because the MFM gate structure 310 may be formed under the insulating layer 345 and the channel layer 350, the MFMIS FET memory structure is a bottom-gate MFMIS FET memory structure.

Figure 30:
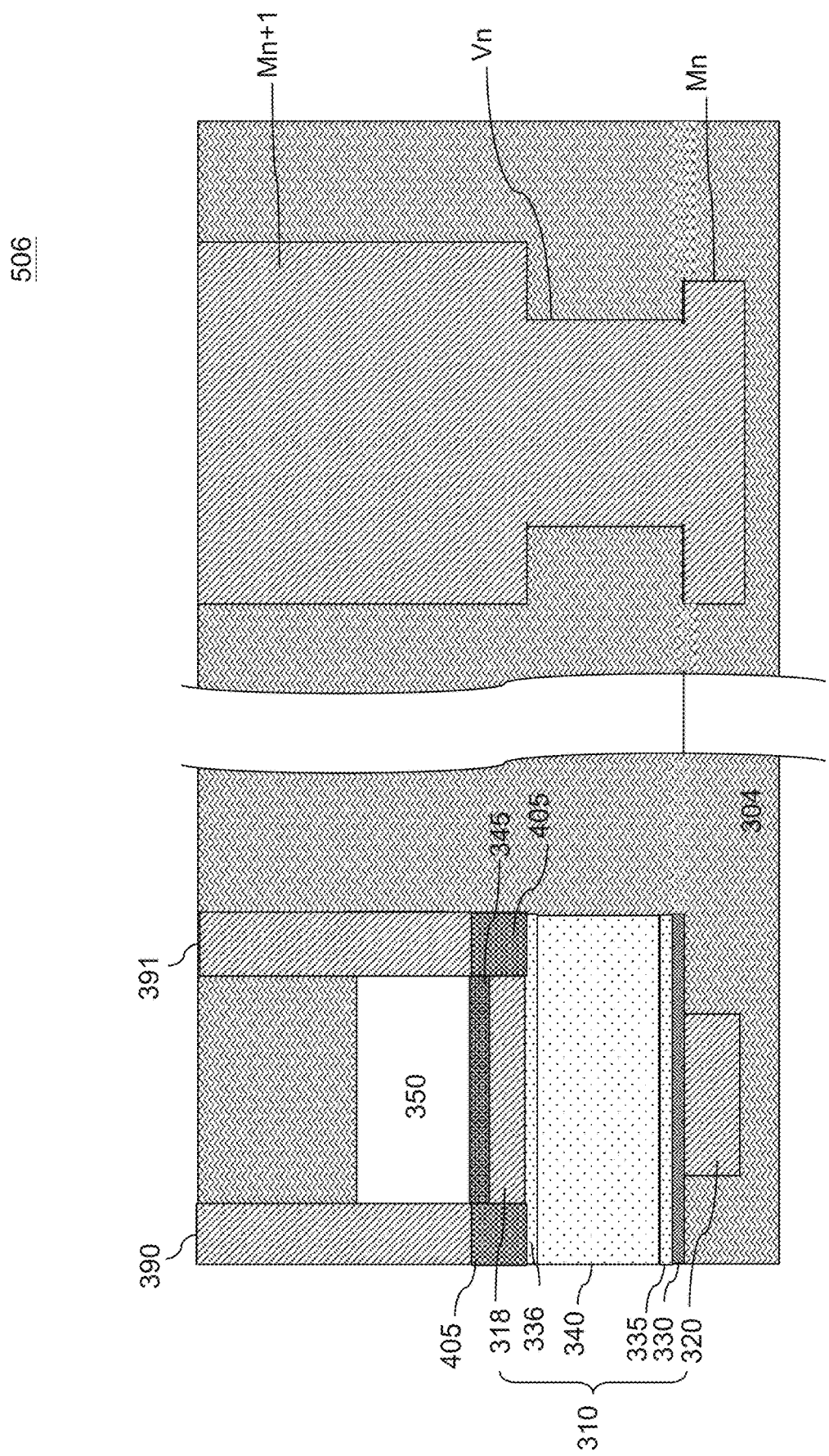
FIG. 30 is a vertical cross-section view showing an MFMIS FET memory structure and metal interconnect features located within inter-metal dielectric (IMD) layers according to another embodiment of the present disclosure.

FIGS. 29 and 30 are vertical cross-sectional views showing an MFMIS FET memory structure and metal interconnect features located within inter-metal dielectric (IMD) layers according to embodiments of the present disclosure. Referring to FIGS. 29 and 30, as mentioned above, the MFMIS FET memory structures 300d to 300g may be formed in a BEOL interconnect structure 506. In some embodiments, a metal-ferroelectric-semiconductor (MFS) FET structure 200 such as shown in FIG. 19 may be formed in a BEOL interconnect structure 506. In some embodiments, the forming of the MFMIS FET memory structures 300d to 300g and/or MFS FET structures 200 may be integrated with BEOL manufacturing operations. In some embodiments, the buried gate electrode 120, 320 may be an Mn metal layer of the BEOL interconnect structure 506, and the dielectric layer 110, 304 may be an Nth inter-metal dielectric (IMDn) layer. Further, the optional seed layer(s) 135, 335, 336, the buffer/stress layer 130, 330, the ferroelectric layer 140, 340, the floating gate electrode 318, the insulating layer 145, 345, and at least a portion of the source electrode 190, 390 and at least a portion of the drain electrode 191, 391 may be disposed in an Mn+1 inter-metal dielectric layer (IMDn+1) over the dielectric layer 304 and the buried gate electrode 120, 320. An Mn+1 metal layer of the BEOL interconnect structure 506 may be formed in the IMDn+1 layer and electrically connected to the Mn metal layer through a via structure Vn. In some embodiments, a sum of a thickness of the buffer/stress layer 130, 330, a thickness of the seed layer(s) 135, 335, 336, a thickness of the ferroelectric layer 140, 340, a thickness of the floating gate electrode 318, a thickness of the insulating layer 145, 345, and a thickness of the channel layer 350 may be substantially equal to a height of the via structure Vn, but the disclosure is not limited thereto. In such embodiments, a top surface of the channel layer 150, 350 may be aligned with (i.e., coplanar with) a bottom surface of the Mn+1 metal layer, as shown in FIG. 29. Further, in some embodiments, bottom surfaces of the source and drain electrodes 190, 191, 390, 391 may be lower than the bottom surface of the Mn+1 metal layer, while top surfaces of the source and drain electrodes 190, 191, 390, 391 may be aligned with (i.e., coplanar with) a top surface of the Mn+1 metal layer.

Referring to FIG. 30, in some embodiments, a sum of a thickness of the buffer/stress layer 130, 330, a thickness of the seed layer(s) 135, 335, 336, and a thickness of the ferroelectric layer 140, 340, may be substantially equal to the height of the via structure Vn, but the disclosure is not limited thereto. In the embodiment MFMIS FET memory structure shown in FIG. 30, the lower surface of the floating gate electrode 318, and the lower surface of the dielectric fill structure 405, may be co-planar with a lower surface of the Mn+1 metal layer. Further, top surfaces of the source and drain electrodes 190, 191, 390, 391 may be aligned with (i.e., coplanar with) a top surface of the Mn+1 metal layer.

Figure 31:
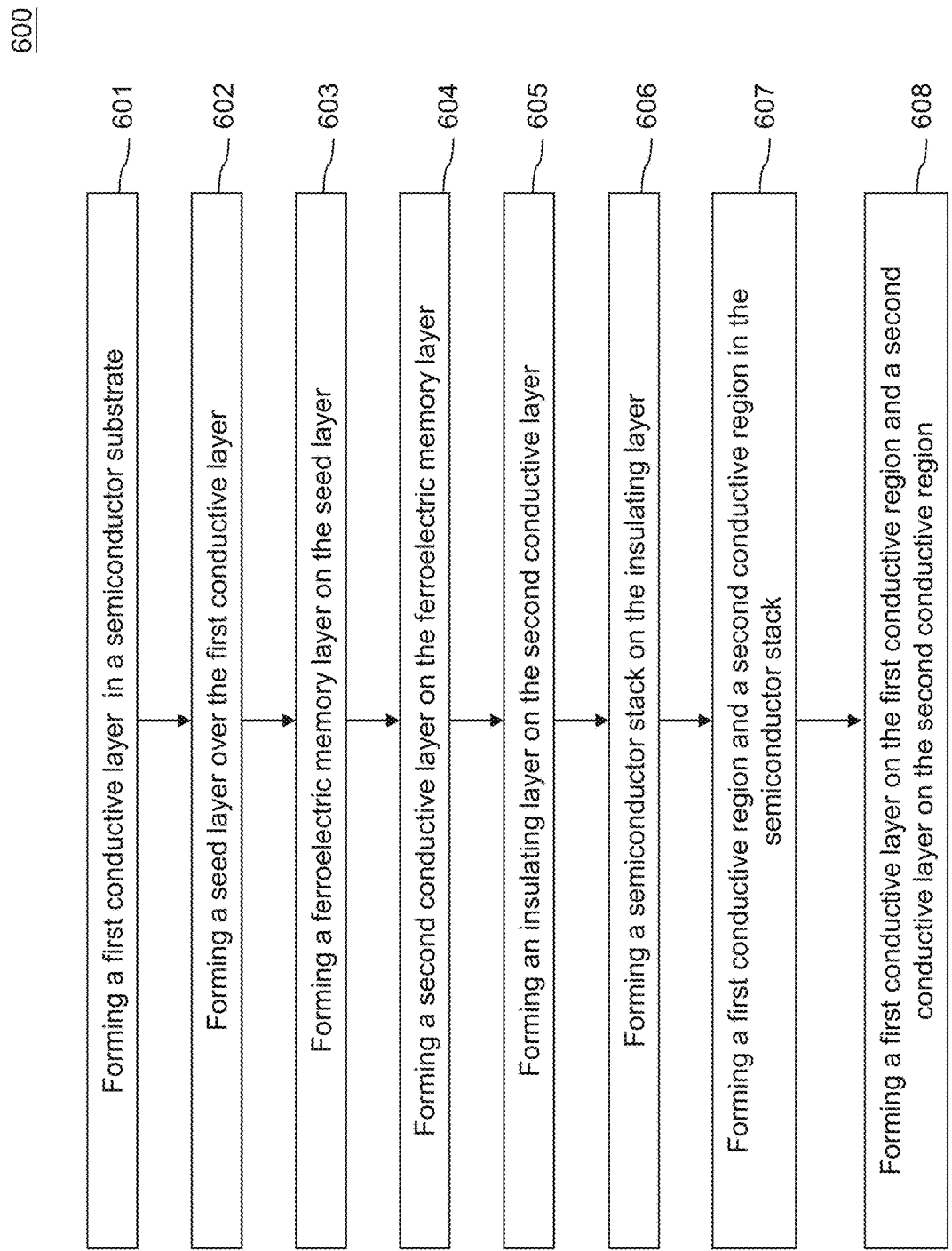
FIG. 31 is a flowchart illustrating a method for forming a semiconductor memory structure according to an embodiment of the present disclosure.

FIG. 31 is a flowchart illustrating a method 600 for forming a semiconductor memory structure 300 according to aspects of the present disclosure. The method 20 includes a number of operations (601, 602, 603, 604, 605, 606, 607, and 608). The method 600 will be further described according to one or more embodiments. It should be noted that the operations of the method 600 may be rearranged or otherwise modified within the scope of the various aspects. It should be further noted that additional processes may be provided before, during, and after the method 600, and that some other processes may just be briefly described herein. Thus, other implementations are possible within the scope of the various aspects described herein.

Figure 32A:
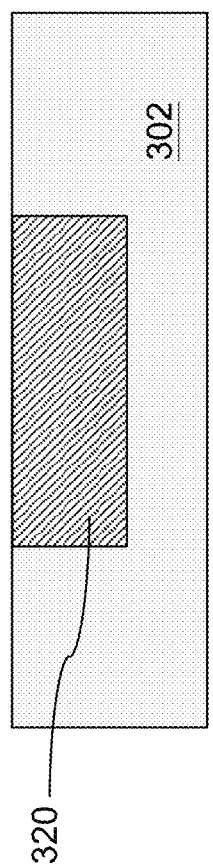
FIGS. 32A-32I are sequential vertical cross-sectional views showing a method for forming a semiconductor memory structure according to an embodiment of the present disclosure.

Referring to FIGS. 31 and 32A, in some embodiments, the method 600 includes forming a first conductive layer 320 in a semiconductor substrate 302 in operation 601. For example, a trench (not shown) may be formed in the semiconductor substrate 302. The trench may be filled with the first conductive layer 320, and a planarization operation may be performed to remove a superfluous portion of the first conductive layer 320 to form the first conductive layer 320 in the semiconductor substrate 302. In some embodiments, the first conductive layer 320 may be formed using chemical vapor deposition (CVD), physical vapor deposition (PVD) or atomic layer deposition (ALD), but the disclosure is not limited thereto. In some embodiments, a top surface of the first conductive layer 320 may be substantially aligned with a top surface of the semiconductor substrate 302, as shown in FIG. 32A. In some embodiments, the first conductive layer 320 serves as a buried gate electrode of an MFMIS FET memory structure.

Figure 32B:
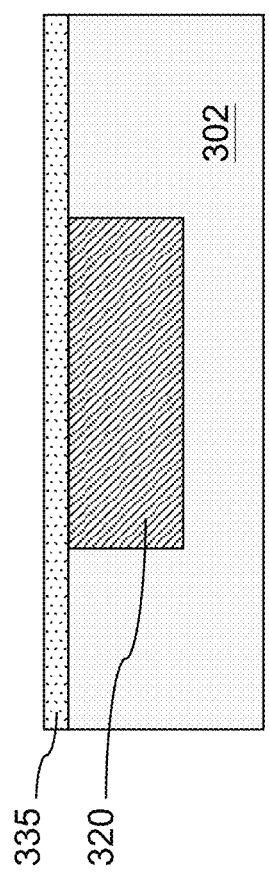

Referring to FIGS. 31 and 32B, in some embodiments, the method 600 includes forming a seed layer 335 over the first conductive layer 320 in operation 602. The seed layer 335 may be formed over the semiconductor substrate 302 and the first conductive layer 320 by ALD or a pulse layer deposition (PLD) process, but the disclosure is not limited thereto. Further, a width of the seed layer 335 may be greater than a width of the first conductive layer 320; thus the top surface of the first conductive layer 320 may be entirely covered by the seed layer 335.

In some embodiments, a buffer layer (not shown) may be formed prior to the forming of the seed layer 335. In such embodiments, a width of the buffer layer may be greater than the width of the first conductive layer 320; thus the first conductive layer 320 may be entirely separated from the seed layer 335 by the buffer layer. The buffer layer may be formed over the semiconductor substrate 302 and the first conductive layer 320 by an ALD or a PLD process, but the disclosure is not limited thereto.

In some embodiments, an in-situ thermal anneal may be performed after deposition of the seed layer 335 and/or the buffer layer. A temperature of the anneal may be between approximately 300° C. and approximately 700° C., and a process duration of the anneal may be between approximately 30 seconds and approximately 10 minutes. In some embodiments, crystallinity of the seed layer 335 and/or the buffer layer may be improved by the anneal.

Figure 32C:
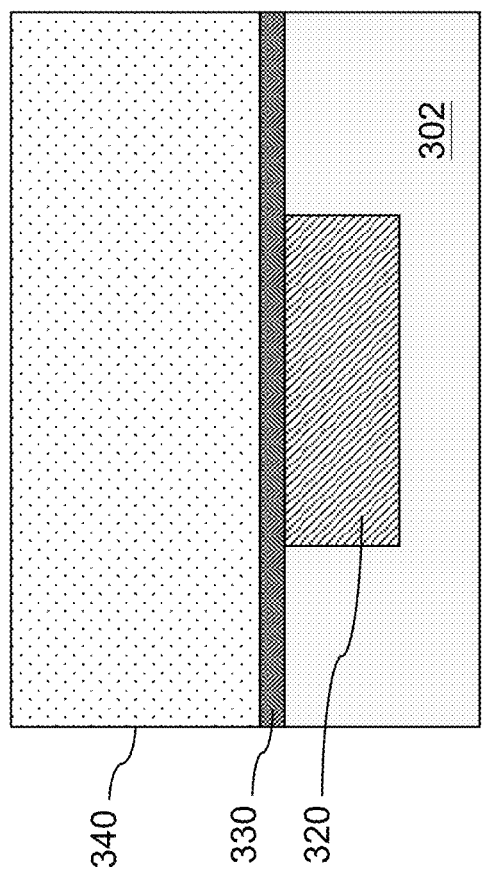

Referring to FIGS. 31 and 32C, in some embodiments, the method 600 includes forming a ferroelectric memory layer 340 on the seed layer 335 in operation 603. In embodiments, the ferroelectric memory layer 340 may be formed by ALD, although other deposition methods are within the contemplated scope of disclosure. In some embodiments, a polarization hysteresis of the ferroelectric memory layer 340 may be improved by between approximately 2 cat % and approximately 20 cat %, which may be at least partially due to the presence of the seed layer 335. Further, in some embodiments, a hafnium zirconium oxide HfZrO-based memory ferroelectric memory layer may be formed by ALD deposition on the seed layer 335. A thickness of the ferroelectric memory layer 340 may be less than a thickness of a PZT layer or an SBT layer that would be formed by PLD.

In some embodiments, another seed layer (not shown) may be formed directly after the forming of the ferroelectric memory layer 340. In such embodiments, the ferroelectric memory layer 340 is disposed between two seed layers, which may further improve the crystallinity and the polarization hysteresis of the ferroelectric memory layer 340.

Figure 32D:
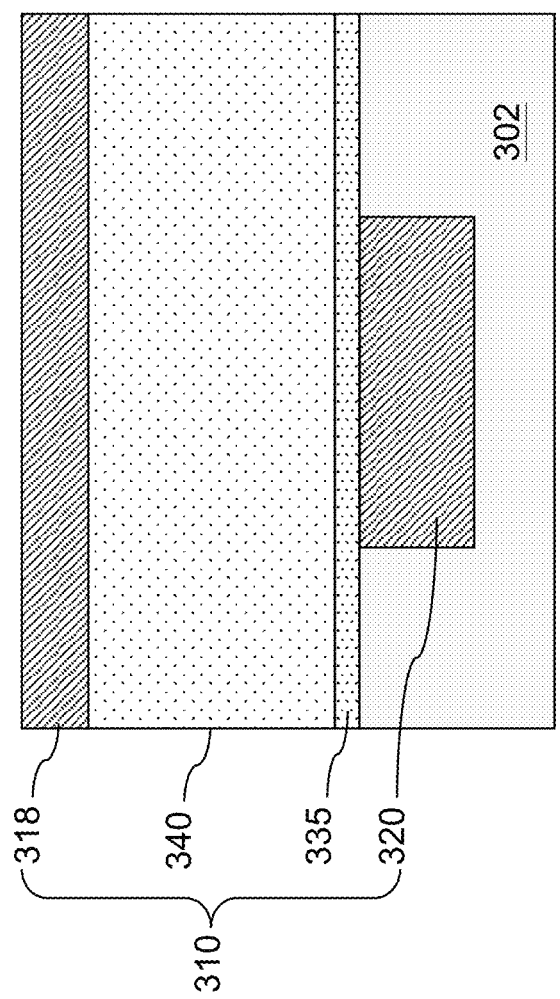

Referring to FIGS. 31 and 32D, in some embodiments, the method 600 includes forming a second conductive layer 318 over the ferroelectric memory layer 340 in operation 604. The second conductive layer 318 may be formed by ALD, PVD or CVD, but the disclosure is not limited thereto. In some embodiments, the second conductive layer 318 serves as a floating gate electrode of an MFMIS FET memory structure. Further, the first conductive layer 320, the seed layer 335, the ferroelectric memory layer 340 and the second conductive layer 318 may be referred to as an MFM gate structure 310.

Figure 32E:
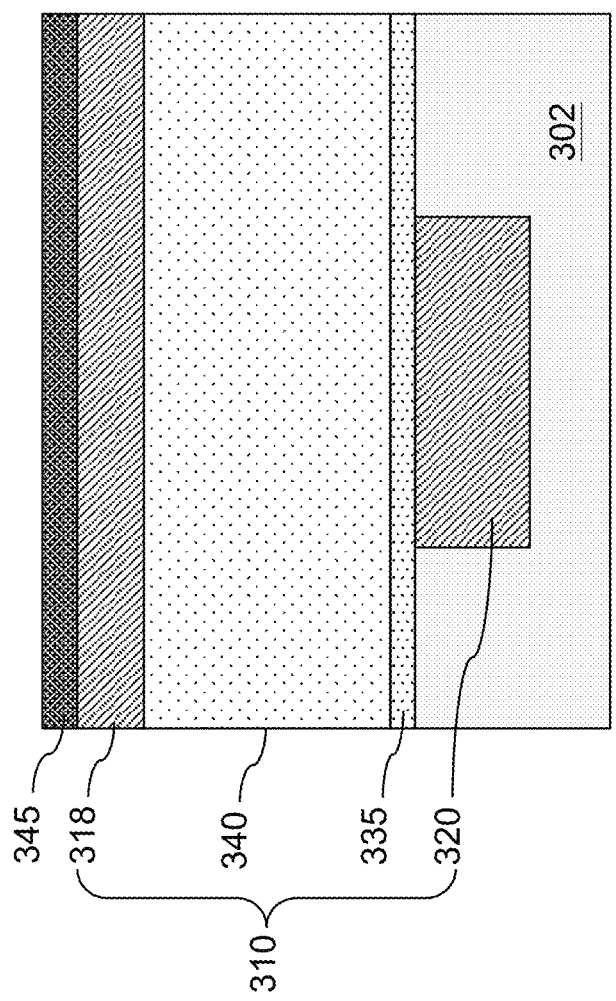

Referring to FIGS. 31 and 32E, in some embodiments, the method 600 includes forming an insulating layer 345 over the second conductive layer 318 in operation 605. The insulating layer 345 may be formed by ALD, but the disclosure is not limited thereto.

Figure 32F:
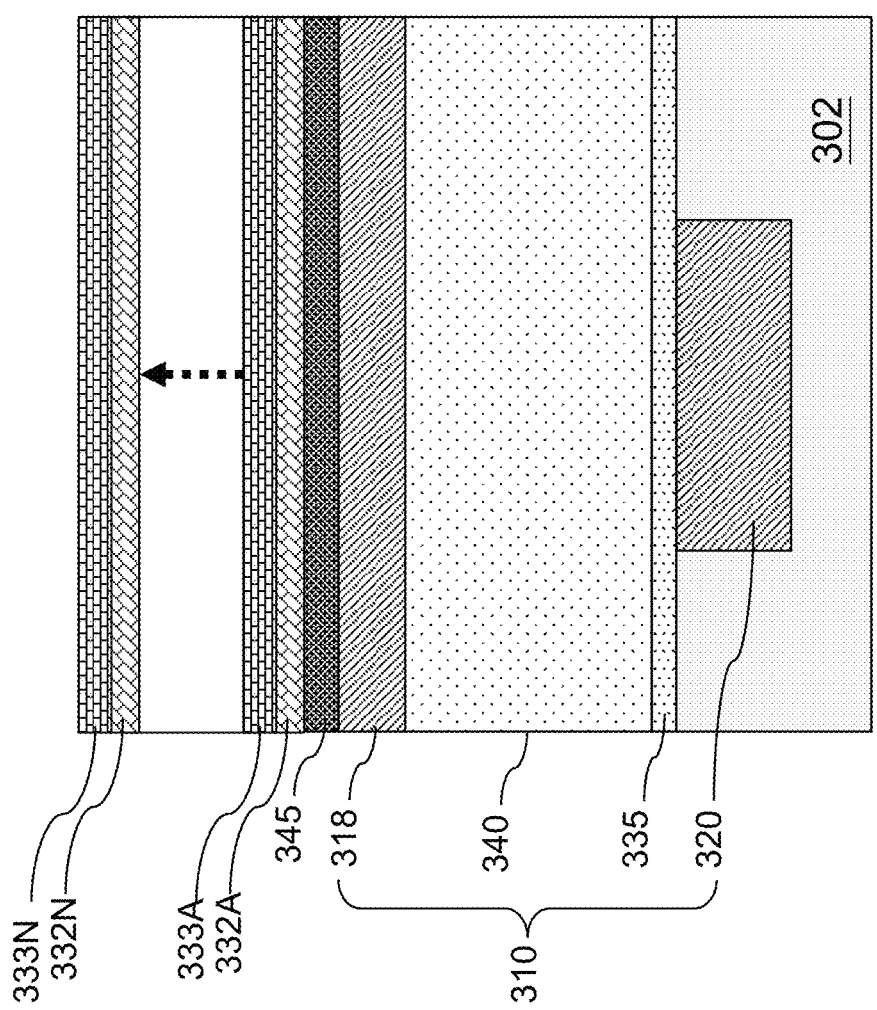

In some embodiments, the method 600 includes forming a channel layer 350, which may also be referred to as a semiconductor stack, over the insulating layer 345 in operation 606. Referring to FIGS. 31 and 32F, in some embodiments, the forming of the channel layer/semiconductor stack 340 includes following operations. A first semiconductor layer 332 and a second semiconductor layer 333 may be alternately formed on the insulating layer 345. In some embodiments, the first semiconductor layer 332 is the bottommost layer and is in contact with the insulating layer 345, while the second semiconductor layer 333 is formed over the first semiconductor layer 332. The first semiconductor layer 332 and the second semiconductor layer 333 may include different materials. Further, the materials used to form the first and second semiconductor layers 332 and 333 may be same as those used to form the first and second semiconductor layers 332 and 333 as described above; thus repeated descriptions of details are omitted.

In an alternative embodiment, the channel layer/semiconductor stack 350 may be formed using a method as described above with reference to FIGS. 9A and 9B. In embodiments, this may include mixing different precursors, such as solid precursors of GaOx and InOx, using a low-pressure vessel (LPV), and introducing a "cocktail" of the different precursors into an ALD reaction chamber. In other embodiments, different precursors, such as precursors of GaOx and InOx, may be introduced into the ALD reaction chamber simultaneously using a co-pulse process setting. The channel layer/semiconductor stack 350 may include layers containing GaOx and InOx alternated with layers containing ZnOx.

Figure 32G:
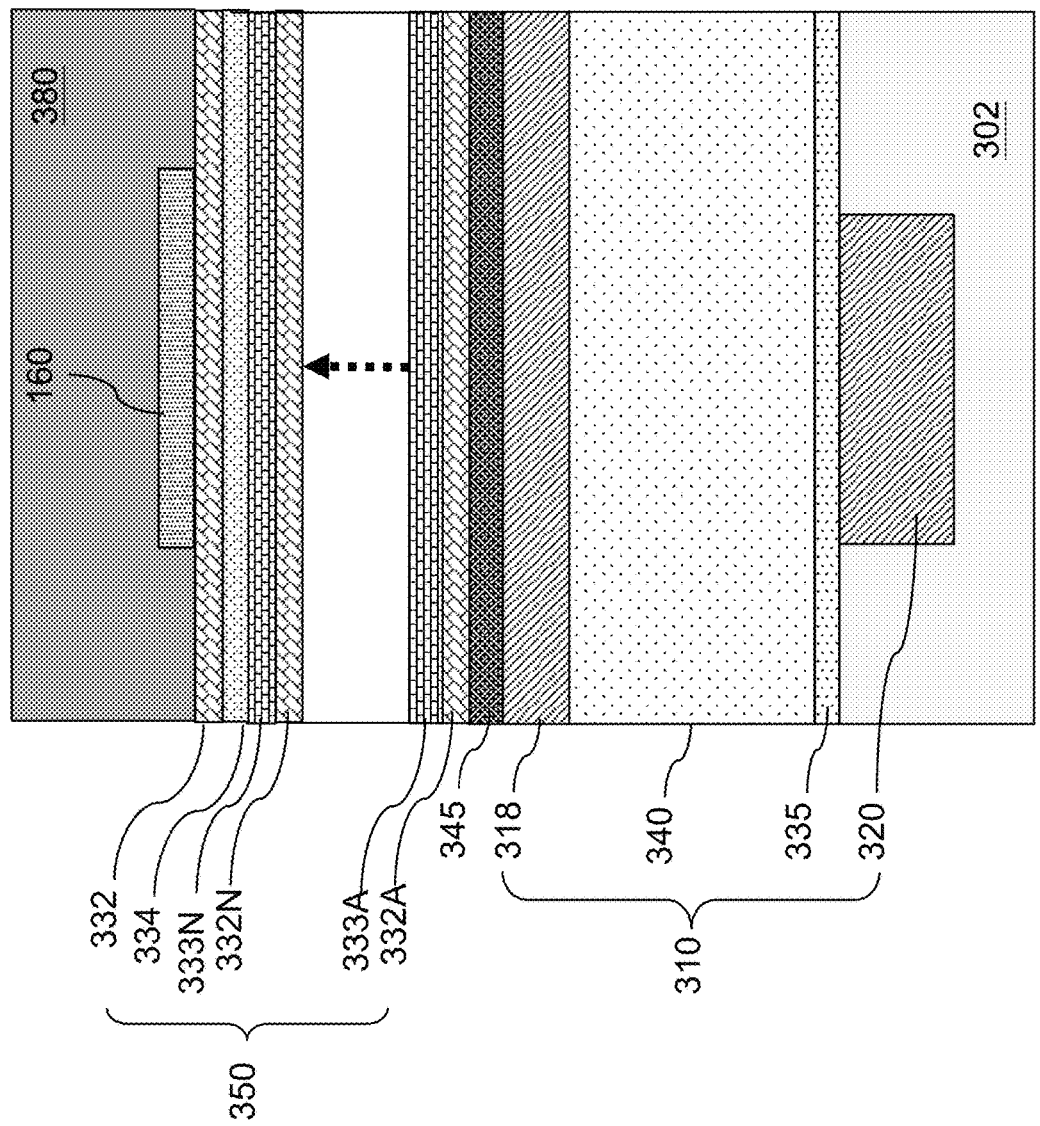

Referring to FIGS. 31 and 32G, in some embodiments, forming the channel layer/semiconductor stack 350 may include depositing a third semiconductor layer 334 over a topmost second semiconductor layer 333. The third semiconductor layer 334 may include materials different from those of the first and second semiconductor layers 332 and 333. Further, the materials used to form the third semiconductor layer 334 may be same as those used to form the third semiconductor layer 334 as described above; thus repeated descriptions of details are omitted.

Referring again to FIGS. 31 and 32G, in some embodiments, an uppermost semiconductor layer 332 of the channel layer/semiconductor stack 350 may be formed over the third semiconductor layer 334. In some embodiments, the uppermost semiconductor layer 332 may include a material that is same as that of the first semiconductor layer 332; thus the uppermost semiconductor layer 332 may be referred to as another first semiconductor layer 332 formed on the third semiconductor layer 336.

Referring again to FIGS. 31 and 32G, in some embodiments, a patterned capping layer 360 may be formed on the channel layer/semiconductor stack 350. In some embodiments, the capping layer 360 may be a dual layer, such as an Al/Ca dual layer, but the disclosure is not limited thereto. The capping layer 360 may help to increase electron mobility. In some embodiments, the first semiconductor layer 332 and the capping layer 360 may together help reduce surface defects and oxygen vacancies. In embodiments, dielectric material may be formed over an upper surface of the capping layer 360 and laterally surrounding the patterned capping layer 360. The dielectric material may include a mask layer 336 over an upper surface of the capping layer 360, and a passivation layer 380 laterally surrounding the capping layer 360 and contacting an upper surface of the channel layer/semiconductor stack 350. In embodiments, the patterned capping layer 360, the mask layer 336 and the passivation layer 380 may be formed using a method as described above with reference to FIGS. 11-13, thus repeated description of the method is omitted for brevity.

Figure 32H:
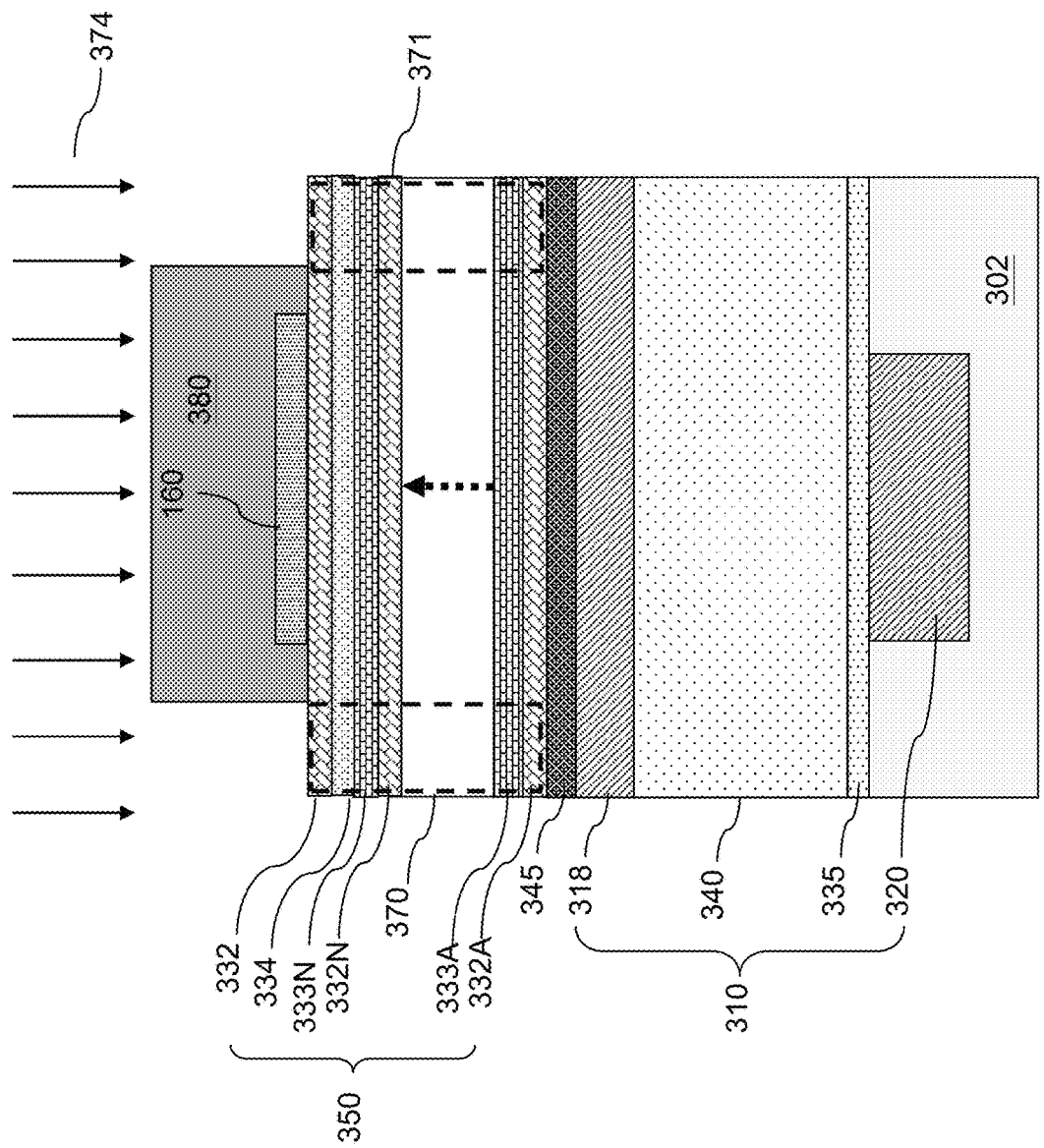

Referring to FIGS. 31 and 32H, in some embodiments, the method 600 includes forming first and second conductive regions 370, 371 in the channel layer/semiconductor stack 350 in operation 607. In some embodiments, a plasma treatment 374 may be performed to form the conductive regions 370, 371. In some embodiments, the plasma treatment 374 may include a helium (He) plasma treatment. Further, locations and dimensions of the conductive regions 370, 371 may be defined by an etching process through the passivation layer 380 to expose regions of the upper surface of the channel layer/semiconductor stack 350. By performing the plasma treatment 374 (i.e., the He plasma treatment), In-rich and oxygen-vacancy rich regions may be formed in regions 370 and 371 of the channel layer/semiconductor stack 350. A contact resistance of the channel layer/semiconductor stack 350 may be reduced in regions 370 and 371, and a series resistance through the channel layer/semiconductor stack 350 may also be reduced. In embodiments, the conductive regions 370 and 371 may be formed using a method as described above with reference to FIGS. 16-18, thus repeated description of the method is omitted for brevity.

Figure 32I:
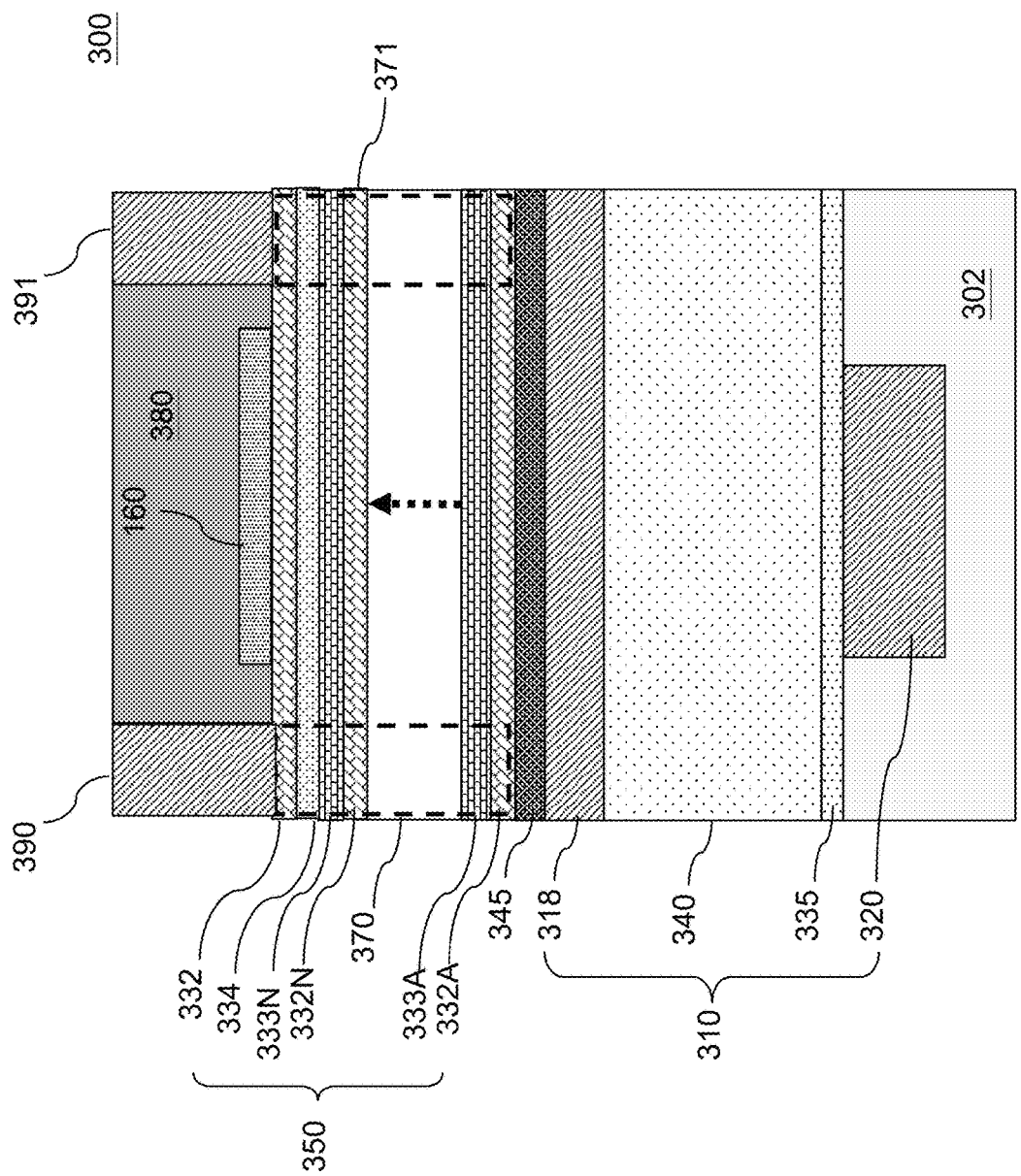

Referring to FIGS. 31 and 32I, in some embodiments, the method 600 includes forming a first electrode 390 contacting the first conductive region 370 and a second electrode 391 contacting the second conductive region 371 in operation 608. The first electrode 390 may be a source electrode, and the second electrode 391 may be a drain electrode. In embodiments, the first electrode 390 and the second electrode 391 may be formed using a method as described above with reference to FIG. 19, thus repeated description of the method is omitted for brevity.

In some embodiments, the method for forming the semiconductor memory structure 300 is integrated with FEOL operations. Further, the forming of the first and second electrodes 390 and 391 may be integrated with middle end of line (MEOL) operations, but the disclosure is not limited thereto.

Figure 33:
FIG. 33 is a flowchart illustrating a method for forming a semiconductor memory structure according to another embodiment of the present disclosure.

FIG. 33 is a flowchart representing a method 700 for forming a semiconductor memory structure 300 according to aspects of the present disclosure. The method 700 includes a number of operations (701, 702, 703, 704, 705, 706, 707, 708, 709 and 710). The method 700 will be further described according to one or more embodiments. It should be noted that the operations of the method 700 may be rearranged or otherwise modified within the scope of the various aspects. It should be further noted that additional processes may be provided before, during, and after the method 700, and that some other processes may just be briefly described herein. Thus, other implementations are possible within the scope of the various aspects described herein.

Figure 34A:
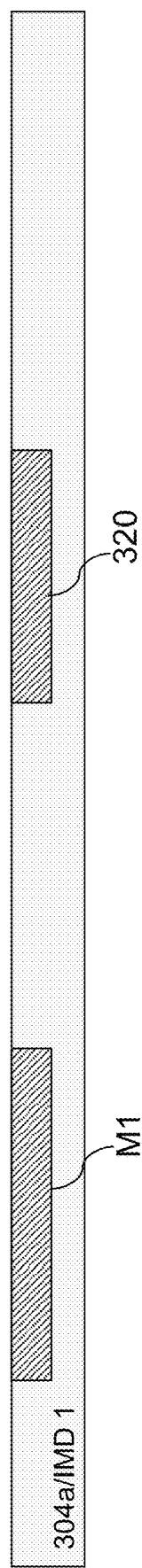
FIGS. 34A-34I are sequential vertical cross-sectional views showing a method for forming a semiconductor memory structure according to an embodiment of the present disclosure.

Referring to FIGS. 33 and 34A, in some embodiments, the method 700 includes forming a first conductive layer 320 in a first dielectric layer 304 in operation 701. For example, a trench (not shown) may be formed in the first dielectric layer 304a. The first conductive layer 320 may be deposited to fill the trench, and a planarization operation may be performed to remove a superfluous portion of the conductive layer 320 to form the first conductive layer 320 in the first dielectric layer 304a. In some embodiments, the method 700 is integrated with a forming of a BEOL interconnect structure. Accordingly, the first dielectric layer 304a may be a first inter-metal dielectric (IMD) layer, but the disclosure is not limited thereto. Further, another conductive layer may be formed in the first IMD layer and serve as a metal layer such as a first metal layer M1. The deposition for forming the first conductive layer 320 (and the first metal layer M1) may be similar to those described above; therefore, repeated descriptions of details are omitted for brevity. In some embodiments, a top surface of the first conductive layer 320 is substantially aligned with a top surface of the first dielectric layer 304a and a top surface of the first metal layer M1. In some embodiments, the first conductive layer 320 serves as a buried gate electrode of an MFMIS FET memory structure.

Figure 34B:
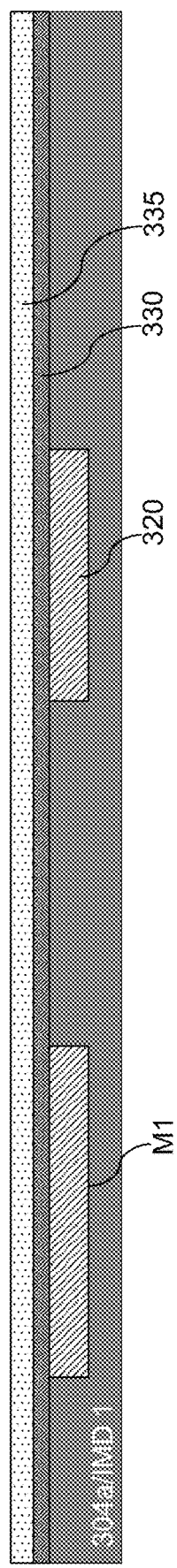

Referring to FIGS. 33 and 34B, in some embodiments, the method 700 includes forming a seed layer 335 over the first dielectric layer 304a, the first conductive layer 320 and the first metal layer M1 in operation 702. The method for forming the seed layer 335 may be similar to those described above; therefore, repeated descriptions of details are omitted for brevity.

The seed layer 335 may entirely cover the first conductive layer 320 and the first metal layer M1. In some embodiments, the seed layer 335 may be formed to be in contact with the first conductive layer 320, but the disclosure is not limited thereto. For example, in some alternative embodiments, a buffer layer 330 is formed prior to the forming of the seed layer 335. In such embodiments, the buffer layer 330 may entirely cover the first conductive layer 320 and the first metal layer M1. Further, the buffer layer 330 may be in contact with the first conductive layer 320. In other words, the first conductive layer 320 may be entirely separated from the seed layer 335 by the buffer layer 330. A method for forming the buffer layer 330 may be similar to those described above; therefore, repeated descriptions of details are omitted for brevity.

As mentioned above, in some embodiments an in-situ thermal anneal may be performed after deposition of the seed layer 335 and/or the buffer layer 330. In such embodiments, crystallinity of the seed layer 335 and/or the buffer layer 330 may be improved by the anneal.

Figure 34C:
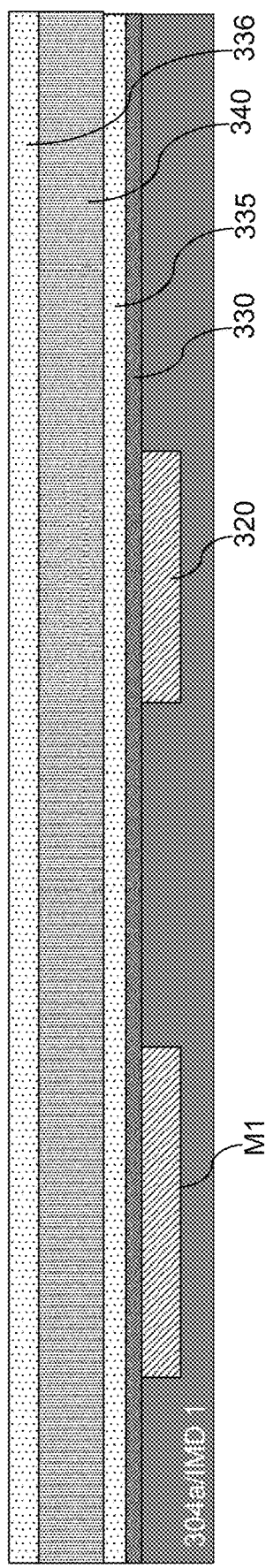

Referring to FIGS. 33 and 34C, in some embodiments, the method 700 includes forming a ferroelectric memory layer 340 over the seed layer 335 in operation 703. In some embodiments, another seed layer 336 may be formed directly after the forming of the ferroelectric memory layer 340. Thus, the ferroelectric memory layer 340 may be disposed between the two seed layers 335 and 336, as shown in FIG. 34C, but the disclosure is not limited thereto. Methods for forming the ferroelectric memory layer 340 and the seed layer 336 may be similar to those described above; therefore, repeated descriptions of details are omitted for brevity.

Figure 34D:
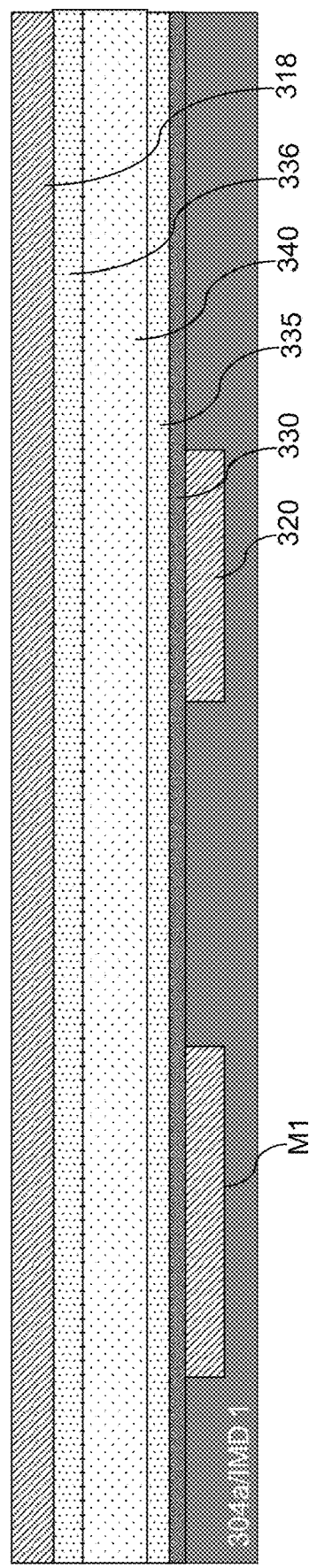

Referring to FIGS. 33 and 34D, in some embodiments, the method 700 includes forming a second conductive layer 318 over the ferroelectric memory layer 340 in operation 704. A method for forming the second conductive layer 318 may be similar to those described above; therefore, repeated descriptions of details are omitted for brevity. In some embodiments, the second conductive layer 318 serves as a floating gate electrode of an MFMIS FET memory structure.

Figure 34E:
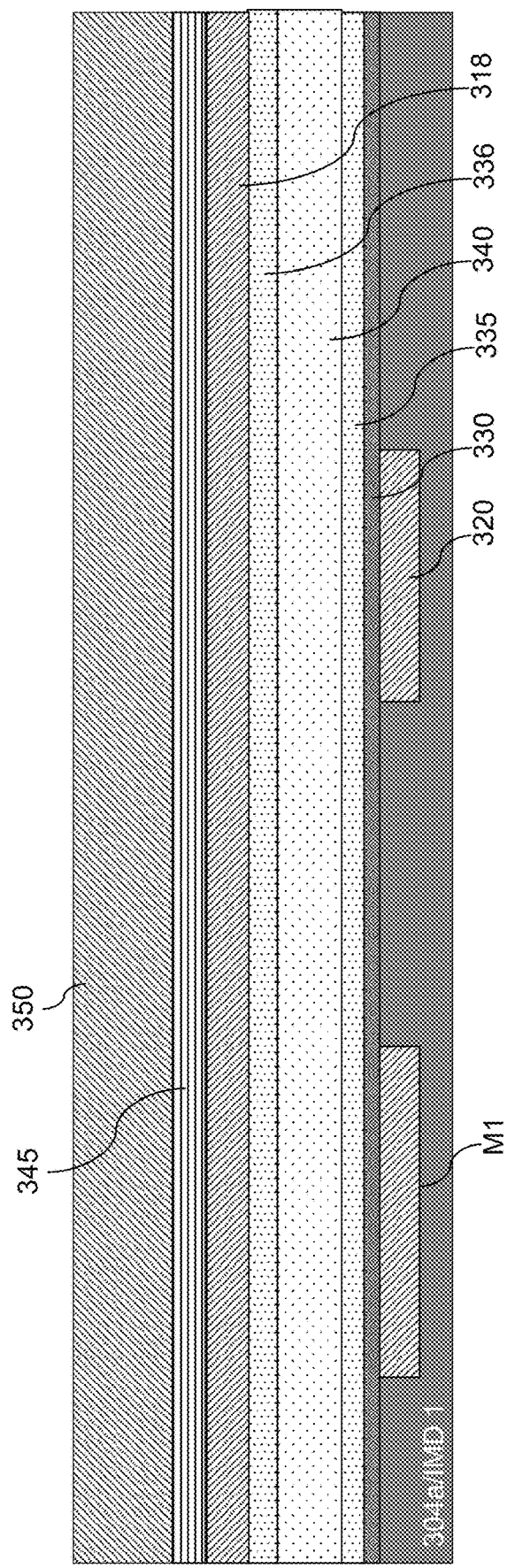

Referring to FIGS. 33 and 34E, in some embodiments, the method 700 includes forming an insulating layer 345 over the second conductive layer 318 in operation 705. In some embodiments, the method 700 includes forming a channel layer/semiconductor stack 350 over the insulating layer 345 in operation 706. Methods for forming the insulating layer 345 and the channel layer/semiconductor stack 350 may be similar to those described above; therefore, repeated description of such details are omitted for brevity.

Figure 34F:
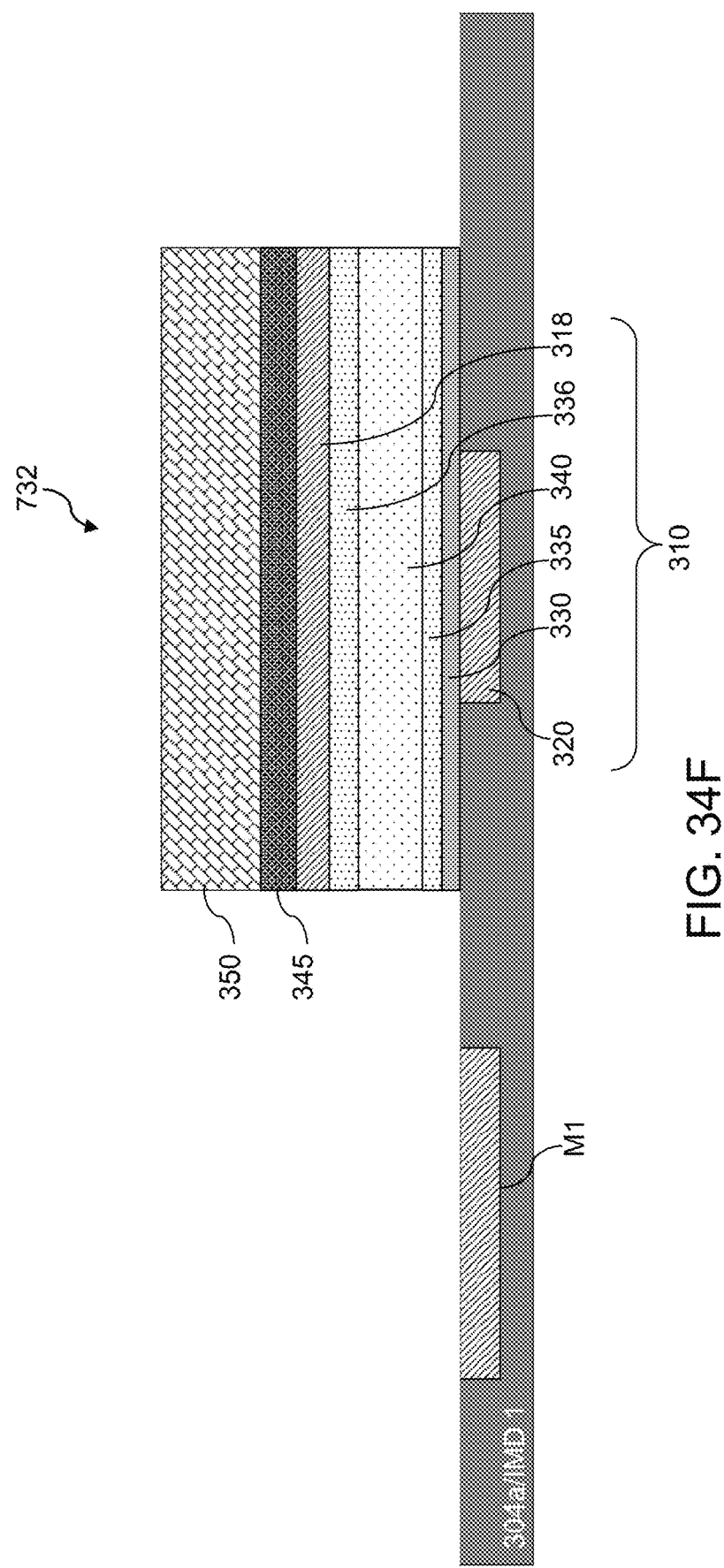

Referring to FIGS. 33 and 34F, in some embodiments, the method 700 includes patterning the buffer layer 330, the seed layer 335, the ferroelectric memory layer 340, the seed layer 336, the second conductive layer 318, the insulating layer 345 and the channel layer/semiconductor stack 350 in operation 707. Consequently, a multilayer structure 732 is obtained over the first dielectric layer 304a. The multilayer structure 732 may be formed by etching through a patterned mask to remove portions of the buffer layer 330, the seed layer 335, the ferroelectric memory layer 340, the seed layer 336, the second conductive layer 318, the insulating layer 345 and the channel layer/semiconductor stack 350 that are exposed through the mask from above the first dielectric layer 304a and the first metal layer M1. The remaining portion(s) of the buffer layer 330, the seed layer 335, the ferroelectric memory layer 340, the seed layer 336, the second conductive layer 318, the insulating layer 345 and the channel layer/semiconductor stack 350 may form one or more discrete multilayer structures 732 over the first dielectric layer 304a. As shown in FIG. 34F, the multilayer structure 732 may be in contact with the first conductive layer 320. In embodiments, the multilayer structure 732 may not contact the first metal layer M1. Further, the first conductive layer 320 in the first dielectric layer 504a, the buffer layer 330, the seed layer 335, the ferroelectric memory layer 340, the seed layer 336, and the second conductive layer 318 of the multilayer structure 732 may be referred to as an MFM gate structure 310.

Figure 34G:
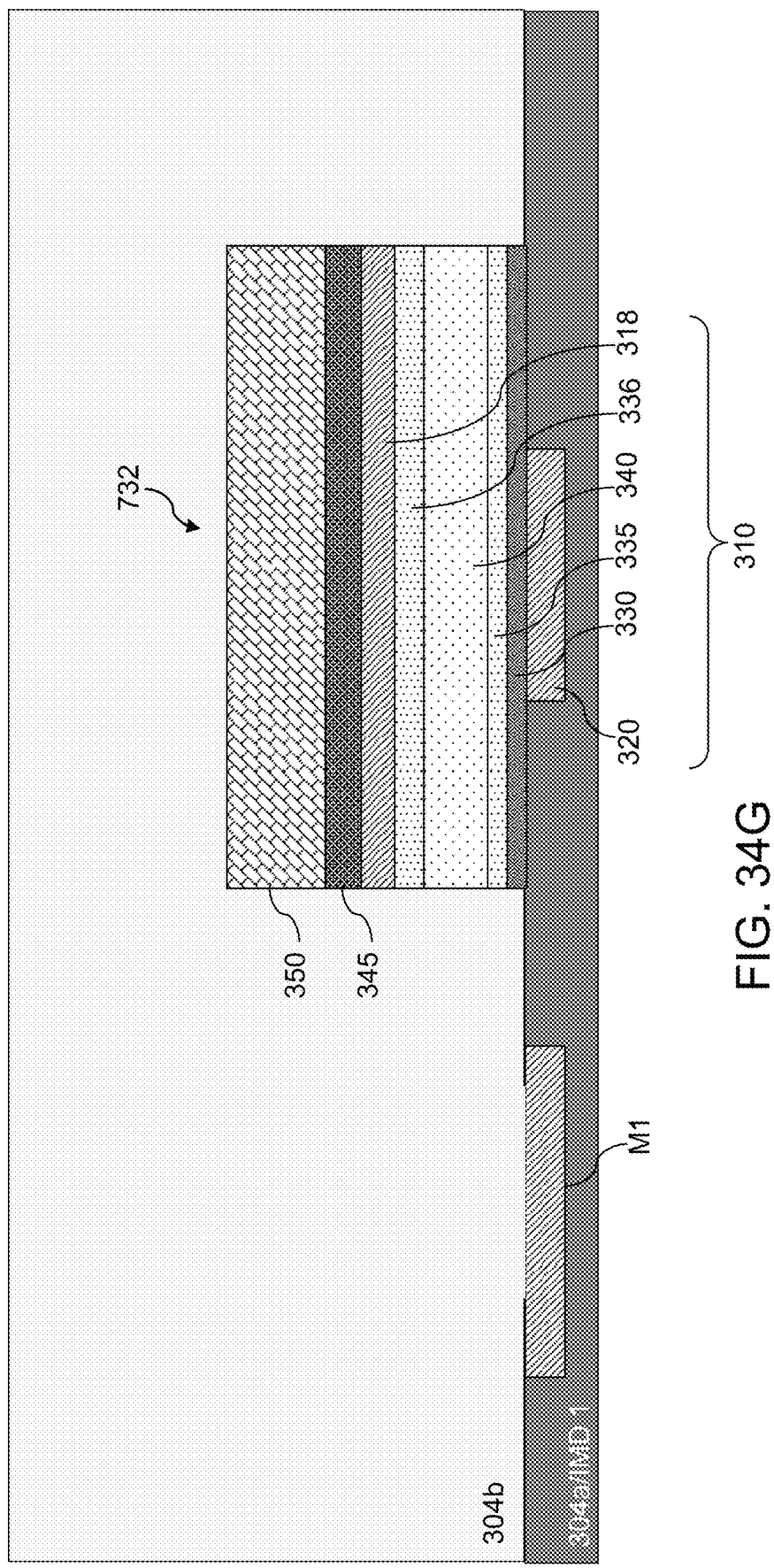

Referring to FIGS. 33 and 34G, in some embodiments, the method 700 includes forming a second dielectric layer 504b over the multilayer structure 532 in operation 708. In some embodiments, a material used to form the second dielectric layer 304b may similar to that of the first dielectric layer 304a, but the disclosure is not limited thereto. Further, a thickness of the second dielectric layer 304b may be greater than a thickness (or a height) of the multilayer structure 732, such that the multilayer structure 732 may be entirely embedded in the second dielectric layer 304b.

Figure 34H:
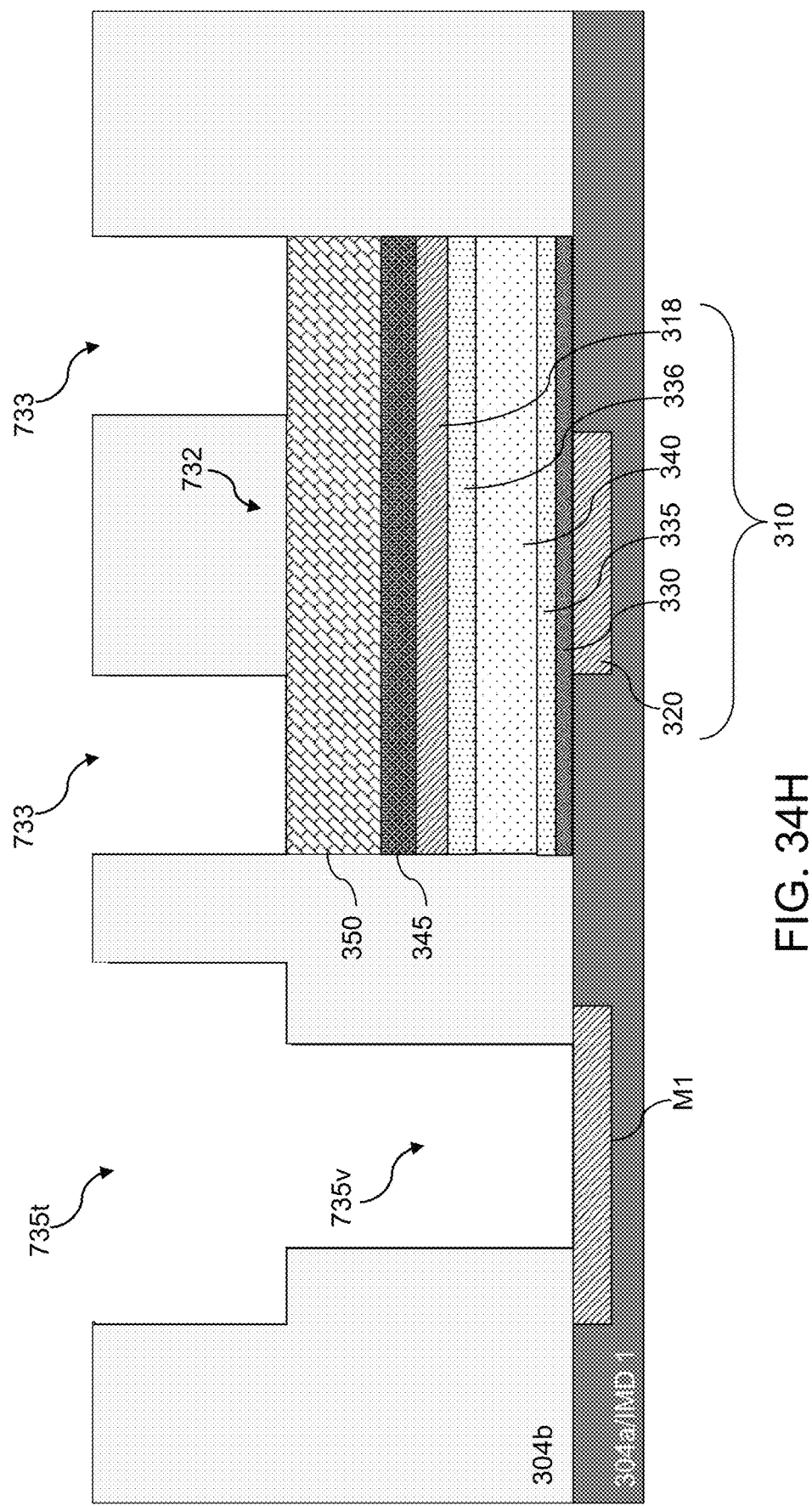

Referring to FIGS. 33 and 34H, in some embodiments, in operation 709 the method 700 includes forming first trenches 733, a second trench 735t and a via opening 735v coupled to the second trench 735t in the second dielectric layer 704b. The first trenches 733 may be separated from each other. Further, the first trenches 733 may be separated from the second trench 735t and the via opening 735v. In some embodiments, a bottom of the second trench 735t may be aligned with (i.e., coplanar with) bottoms of the first trenches 733, as shown in FIG. 34H, but the disclosure is not limited thereto. In some embodiments, portions of the multilayer structure 732 are exposed through the first trenches 733. For example, portions of the channel layer/semiconductor stack 350 may be exposed through the bottoms of the first trenches 733. In some embodiments, the first metal layer M1 may be exposed through a bottom of the via opening 735v.

Figure 34I:
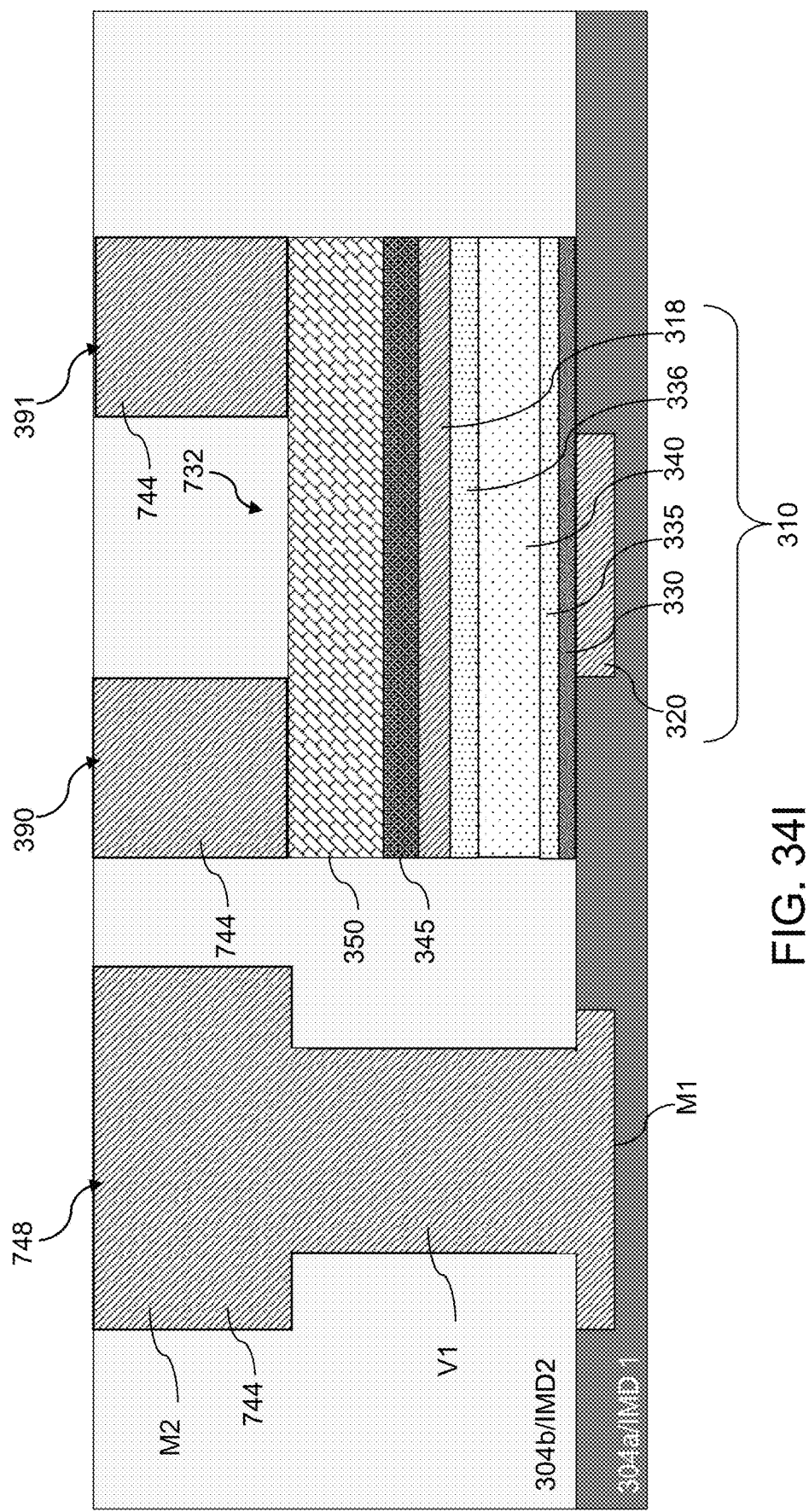

Referring to FIGS. 33 and 34I, in some embodiments, the method 700 includes forming a source electrode 390 and a drain electrode 391 in the first trenches 533, and forming a metal interconnect structure 748 in the second trench 735t and the via opening 735v in operation 710. In some embodiments, the forming of the source electrode 390, the drain electrode 391 and the metal interconnect structure 748 may include further operations. For example, a conductive layer 744 may be formed to fill the first trenches 733, the second trenches 735t and the via opening 735v. A planarization operation such as a CMP may be performed to remove superfluous portions of the conductive layer 744 to form the source electrode 390 in one of the first trenches 733, the drain electrode in another first trench 733, and the metal interconnect structure 748 in the second trench 735t and the via opening 735v. In some embodiments, a bottom of the source electrode 390 and a bottom of the drain electrode 391 may be in contact with a top surface of the channel layer/semiconductor stack 350. A bottom surface of the metal interconnect structure 748 may be in contact with first metal layer M1. Further, a top surface of the source electrode 390, a top surface of the drain electrode 391, and a top surface of the metal interconnect structure 748 may be aligned with (i.e., coplanar with) each other.

In some embodiments, the gate structure 310, the insulating layer 345 and the channel layer/semiconductor stack 350 of the multilayer structure 732, together with the source electrode 390 and the drain electrode 391 may serve as an MFMIS FET structure in a BEOL interconnect structure. The second dielectric layer 304b may serve as a second inter-metal dielectric layer IMD2. The metal interconnect structure 748 may include a second metal layer M2, which is disposed in the previously mentioned second trench 735t, and a first via structure V1, which is disposed in the previously mentioned via opening 735v. The second metal layer M2 may be electrically connected to the first metal layer M1 by the first via structure V1. Further, the first metal layer M1, the second metal layer M2 and the first via structure V1 may serve as a portion of the BEOL interconnect structure. Additionally, a bottom surface of the second metal layer M2 may be aligned with (i.e, coplanar with) the bottom surfaces of the source and drain electrodes 390 and 391, as shown in FIG. 34I.

Figure 35A:
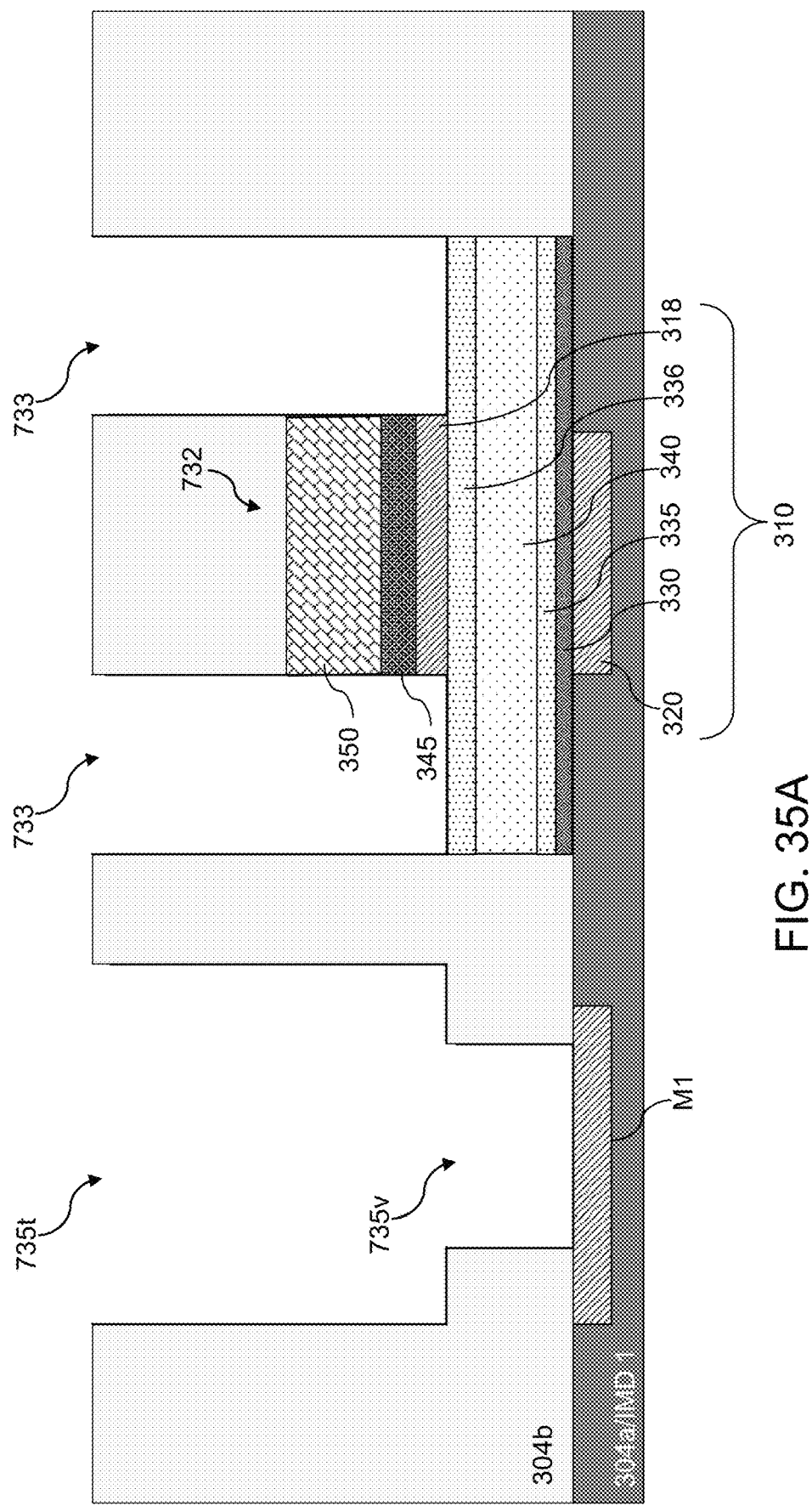
FIG. 35A-35C are sequential vertical cross-sectional views showing a method for forming a semiconductor memory structure according to another embodiment of the present disclosure.

The method for forming the semiconductor memory structure may include other operations. Referring to FIG. 35A, in some embodiments, the method 700 includes forming a first conductive layer 320 in a first dielectric layer 304a in operation 701. As mentioned above, the first dielectric layer 304a may be a first inter-metal dielectric (IMD1) layer, but the disclosure is not limited thereto. Further, another conductive layer serving as a first metal layer M1 may be formed in the first IMD layer, as shown in FIG. 35A. The methods for forming the first conductive layer 320 and the first metal layer M1 may be similar to those described above; therefore, repeated descriptions of details are omitted for brevity. A seed layer 335 may be formed over the first dielectric layer 304a and the first conductive layer 320 in operation 702. Further, a buffer layer 330 may be formed prior to the forming of the seed layer 335. In such embodiments, the buffer layer 330 and the seed layer 335 may entirely cover the first conductive layer 320 and the first metal layer M1. As mentioned above, an in-situ thermal anneal may be performed in when forming the seed layer 335 or forming the buffer layer 330. A ferroelectric memory layer 340 may be formed over the seed layer 335 in operation 703. As mentioned above, another seed layer 336 may be formed directly after the forming of the ferroelectric memory layer 340. Thus, the ferroelectric memory layer 340 may be disposed between the two seed layers 335 and 336, as shown in FIG. 35A, but the disclosure is not limited thereto. A second conductive layer 318 may be formed over the ferroelectric memory layer 340 in operation 704. An insulating layer 345 may be formed over the second conductive layer 318 in operation 705. A channel layer/semiconductor stack 350 may be formed over the insulating layer 345 in operation 706. A patterning operation may be performed such that a multilayer structure 732 is obtained over the first dielectric layer 304a in operation 707. As mentioned above, the first conductive layer 320 in the first dielectric layer 304a, the buffer layer 330, the seed layer 335, the ferroelectric memory layer 340, the seed layer 336, the second conductive layer 318 of the multilayer structure 732 may be referred to as an MFM gate structure 310. A second dielectric layer 504b may be formed over the multilayer structure 532 in operation 708. Methods for forming the above-mentioned layers may be similar to those described above; therefore, repeated descriptions of details are omitted for brevity.

Referring again to FIG. 35A, in some embodiments, the method 700 includes forming first trenches 733, a second trench 735t and a via opening 735v coupled to the second trench 735t in the second dielectric layer 304b. The first trenches 733, the second trench 735t and the via opening 735v may be formed by etching through a patterned mask. The first trenches 733 may be separated from each other. Further, the first trenches 733 may be separated from the second trench 735t and the via opening 735v. In some embodiments, a bottom of the second trench 735t may be aligned (i.e., coplanar with) with bottoms of the first trenches 733, as shown in FIG. 35A, but the disclosure is not limited thereto.

In some embodiments, portions of the multilayer structure 732 are exposed through the first trenches 733. In the embodiment shown in in FIG. 35A, the first trenches 733 may extend through the second dielectric layer 304b, the channel layer/semiconductor stack 350, the insulating layer 345 and the second conductive layer 318. Thus, side surfaces of the channel layer/semiconductor stack 350, the insulating layer 345 and the second conductive layer 318 may be exposed along the sidewalls of each of the first trenches 733. The upper surface of the additional seed layer 336 may be exposed at the bottom of the first trenches 733. In some embodiments, the first metal layer M1 may be exposed through a bottom of the via opening 735v.

Figure 35B:
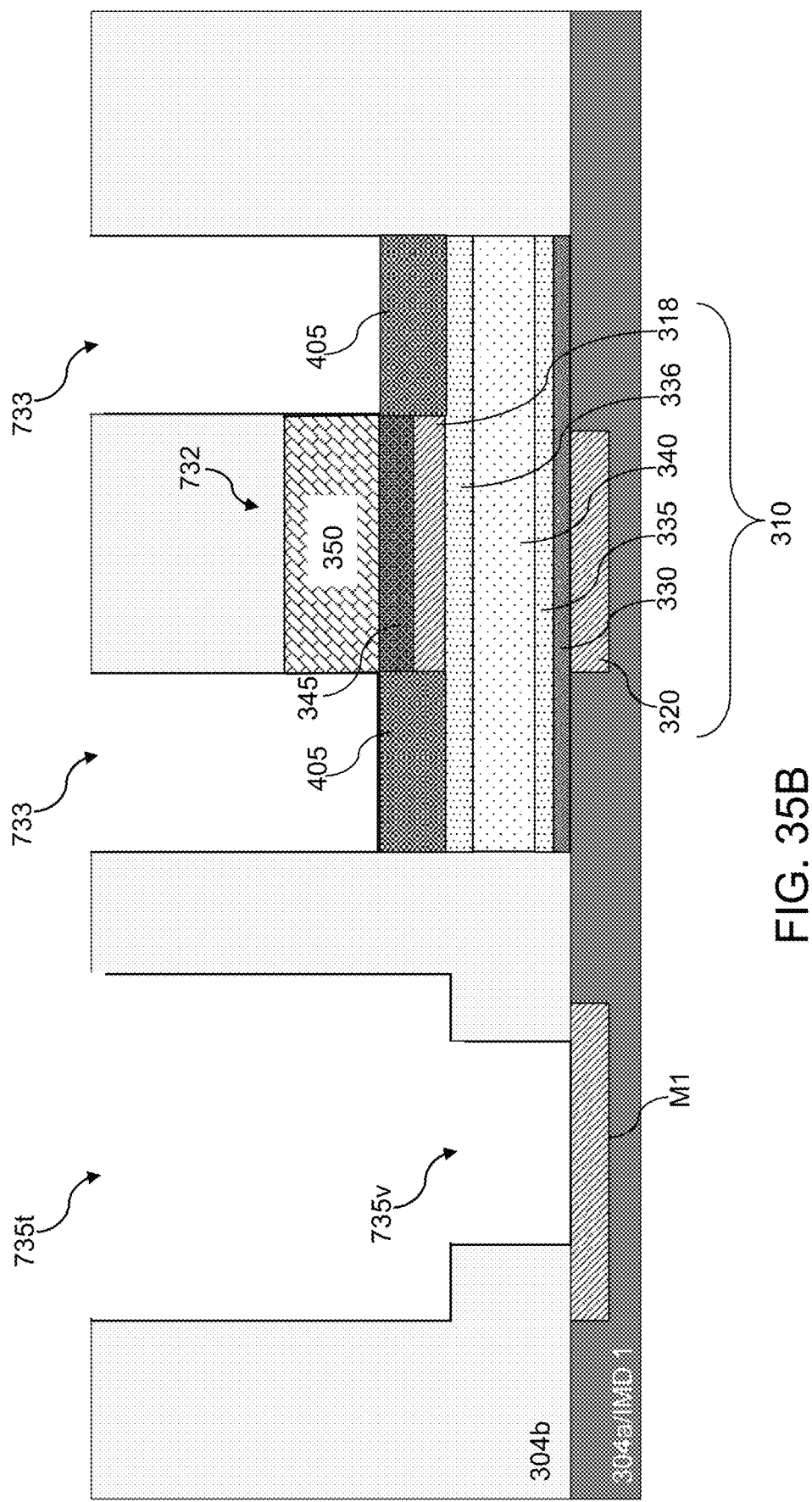

Referring to FIG. 35B, in some embodiments, a dielectric fill structure 405 may be formed in a bottom portion of each of the first trenches 733. In some embodiments, a material used to form the dielectric fill structure 405 may be similar to or different from that of the first dielectric layer 304*a* and/or the second dielectric layer 504*b*. In embodiments, the dielectric fill structure 405 may contact the side surfaces of the second conductive layer 318 and the insulating layer 345. In some embodiments, the top surface of the dielectric fill structure 405 may be substantially coplanar with a top surface of the insulating layer 345.

Figure 35C:
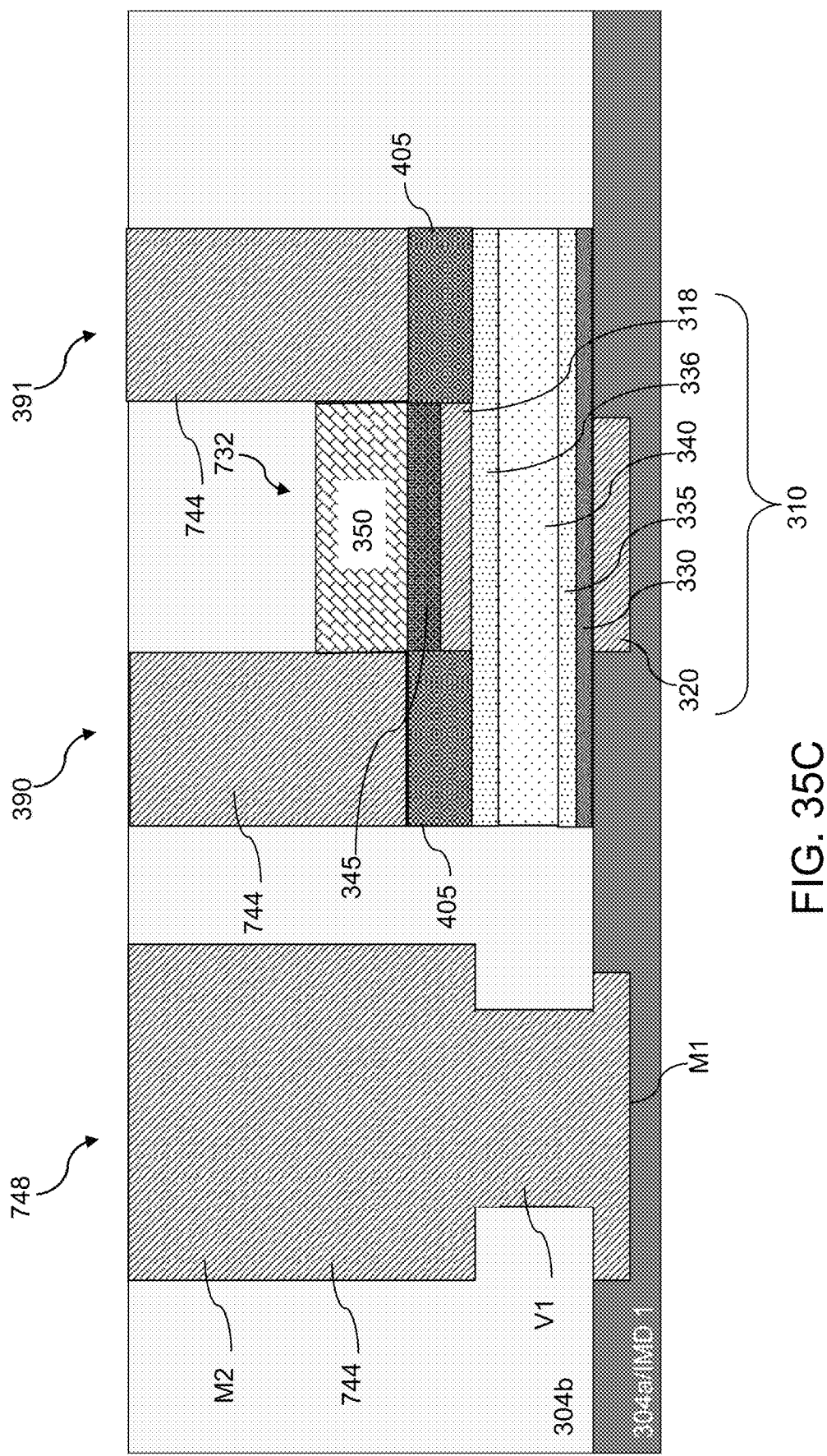

Referring to FIG. 35C, in some embodiments, a source electrode 390 and a drain electrode 391 may be formed in the first trenches 533, and a metal interconnect structure 748 may be formed in the second trench 735*t* and the via opening 735*v* in operation 710. In some embodiments, the source electrode 390 and the drain electrode 391 may contact an upper surface of the dielectric fill structure 405. The source electrode 390 and the drain electrode 391 may contact the side surface of the channel layer/semiconductor stack 350. A bottom surface of the metal interconnect structure 748 may be in contact with first metal layer M1. Further, a top surface of the source electrode 390, a top surface of the drain electrode 391, and a top surface of the metal interconnect structure 748 may be aligned with (i.e., coplanar with) each other.

In some embodiments, the gate structure 310, the insulating layer 345 and the channel layer/semiconductor stack 350 of the multilayer structure 732, together with the source electrode 390 and the drain electrode 391 may serve as an MFMIS FET structure in a BEOL interconnect structure. The second dielectric layer 304*b* may serve as a second inter-metal dielectric layer IMD2. The metal interconnect structure 748 may include a second metal layer M2, which is disposed in the previously mentioned second trench 735*t*, and a first via structure V1, which is disposed in the previously mentioned via opening 735*v*. The second metal layer M2 may be electrically connected to the first metal layer M1 by the first via structure V1. Further, the first metal layer M1, the second metal layer M2 and the first via structure V1 may serve as a portion of the BEOL interconnect structure. In the exemplary structure shown in FIG. 35C, a bottom surface of the second metal layer M2 may be lower than the bottom surfaces of the source electrode 390 and the drain electrode 391.

In some embodiments, the method for forming the semiconductor memory structure 300 is integrated with BEOL operations.

Accordingly, various embodiments of the present disclosure include a semiconductor memory structure and a method for forming the same. In some embodiments, the semiconductor memory structure may be an MFMIS memory structure. In some embodiments, the semiconductor memory structure includes a bottom-gate structure. In some embodiments, the MFMIS memory structure includes a hafnium zirconium oxide HfZrO-based ferroelectric memory layer that may be formed by ALD. Accordingly, a thinner ferroelectric memory layer is obtained. In some embodiments, the semiconductor memory structure may be a memory structure disposed in a FEOL structure, or a BEOL interconnect structure. Thus a feasibility of the MFMIS memory structure is further improved.

In some embodiments, a semiconductor memory structure is provided. The semiconductor memory structure includes a gate structure, an insulating layer over the gate structure, a channel layer/semiconductor stack over the insulating layer, and a source electrode and a drain electrode contacting the channel layer/semiconductor stack. The gate structure may include a buried gate electrode, a ferroelectric memory layer disposed over the buried gate electrode, a seed layer between the buried gate electrode and the ferroelectric memory layer, and a floating gate electrode disposed over the ferroelectric memory layer.

In some embodiments, a semiconductor structure is provided. The semiconductor structure includes a first dielectric layer, a first conductive layer and a second conductive layer disposed in the first dielectric layer, a multilayer structure disposed over the first conductive layer, a second dielectric layer over the first conductive layer, the second conductive layer and the multilayer structure, and a first conductive structure and a second conductive structure disposed in the second dielectric layer and in contact with the semiconductor stack. The first conductive layer and the second conductive layer are separated from each other. The multilayer structure further includes a ferroelectric memory layer disposed over the first conductive layer, a first seed layer between the first conductive layer and the ferroelectric memory layer, a third conductive layer disposed over the ferroelectric memory layer, an insulating layer over the third conductive layer, and a channel layer/semiconductor stack over the insulating layer.

In some embodiments, a method for forming an isolation structure is provided. The method includes following operations. A first conductive layer is formed. A seed layer is formed over the first conductive layer, and a ferroelectric memory layer is formed on the seed layer. A second conductive layer is formed on the ferroelectric memory layer. An insulating layer is formed on the second conductive layer. A channel layer/semiconductor stack is formed on the insulating layer. A first conductive region and a second conductive region are formed in the semiconductor stack. A first conductive electrode is formed on the first conductive region, and a second conductive electrode is formed on the second conductive region.

Referring to all drawings and according to various embodiments of the present disclosure, a field effect transistor device 200 includes a gate electrode 120, a source electrode 190, a drain electrode 191, a gate dielectric material 140, 145, and a channel layer 150, where the source and drain electrodes 190 and 191 contact the channel layer 150 and the gate dielectric material 140, 145 is located between the gate electrode 120 and the channel layer 150, and where the channel layer 150 includes an oxide semiconductor material having a formula $M_xM'_yZn_zO$ where $0<(x, y, z)<1$, M is a first metal selected from the group consisting of indium (In) and tin (Sn) and combinations thereof, M' is a second metal selected from the group consisting of gallium (Ga), hafnium (Hf), zirconium (Zr), titanium (Ti), aluminum (Al), strontium (Sr), barium (B a), scandium (Sc), magnesium (Mg), lanthanum (La), and gadolinium (Gd) and combinations thereof, and the channel layer 150 extends between a first surface 157 contacting the gate dielectric material 140, 145 and a second surface 159 opposite the first surface 157, and the channel layer 150 includes a first region 152A adjacent to the first surface 157 that includes both the first metal, M, and the second metal, M', and the atomic percentages of the first metal, M, and the second metal, M', in the first region 152A are each greater than the atomic percentage of zinc in the first region 152A, and the channel layer 150 includes a second region 156 adjacent to the second surface 159 that includes the second metal, M', and the atomic percentage of the second metal, M', in the second region 159 is greater than the atomic percentages of either the first metal, M, or zinc in the second region 159.

In an embodiment, the channel layer 150 includes a third region 154A between the first region 152A and the second region 156, and the atomic percentage of zinc in the third region 154A is greater than the atomic percentages of either the first metal, M, or the second metal, M', within the third region 154A.

In another embodiment, the channel layer 150 includes an alternating stack of first and second sublayers between the first surface and the second surface, and wherein each of the first sublayers 152A, 152B, 152N include the first metal, M, and the second metal, M', and each of the second sublayers 154A, 154B, 154N include zinc, and in each of the first sublayers 152A, 152B, 152N the atomic percentages of each of the first metal, M, and the second metal, M', is greater than the atomic percentage of zinc, and in each of the second sublayers 154A, 154B, 154N the atomic percentage of zinc is greater than the atomic percentages of each of the first metal, M, and the second metal, M'.

In another embodiment, the gate dielectric material 140, 145 comprises a layer of ferroelectric (FE) material 140 between the gate electrode 120 and the channel layer 150.

In another embodiment, the ferroelectric (FE) material includes a hafnium oxide-based ferroelectric material.

In another embodiment, the layer of ferroelectric (FE) material 140 is under a tensile strain of between 1.5% and 3.0% in a direction that is parallel to a top and/or bottom surface of the layer of ferroelectric (FE) material 140.

In another embodiment, the field effect transistor device 200 further includes an insulating layer 145 between the layer of ferroelectric (FE) material 140 and the channel layer 150, wherein the first region 152A of the channel layer 150 contacts the insulating layer 145.

In another embodiment, the insulating layer 145 includes a material having a larger band gap than the material of the channel layer 150, and a conduction band offset (ECBO) and a valence band offset (EVBO) between the material of the insulating layer 145 and the material of the channel layer 150 are each greater than 1 eV.

In another embodiment, the gate electrode 120 is embedded in a dielectric material 110, the layer of ferroelectric (FE) material 140 is located over the gate electrode, the channel layer 150 is located over the layer of ferroelectric material 140, and the source and drain electrodes 190 and 191 are located over the channel layer 150.

In another embodiment, the field effect transistor device 200 further includes at least one of a stress layer 130 and a ferroelectric material seed layer 135 between the gate electrode 120 and the layer of ferroelectric (FE) material 140.

In another embodiment, the channel layer 150 includes source and drain regions 176 and 177 beneath the source and drain electrodes 190 and 191, respectively, and the channel layer 150 further includes oxygen-vacancy rich regions 178 and 179 beneath each of the source and drain regions 176 and 177 having a higher concentration of oxygen vacancies than the concentration of oxygen vacancies within a central region 161 of the channel layer 150 located between the oxygen-vacancy rich regions 178 and 179.

In another embodiment, the field effect transistor device 200 further includes a capping layer contacting an upper surface of the channel layer, the capping layer including a metal material selected from calcium (Ca), aluminum (Al), hafnium (Hf), zirconium (Zr), titanium (Ti), tantalum (Ta), strontium (Sr), barium (Ba), scandium (Sc), magnesium (Mg), lanthanum (La), gadolinium (Gd), and combinations thereof, and a passivation layer contacting the upper surface of the channel layer and laterally surrounding the capping layer, where the passivation layer is located between the capping layer and the source and drain electrodes.

An additional embodiment is drawn to a ferroelectric field effect transistor device (FeFET) 200 having a gate electrode 120, a layer of ferroelectric (FE) material 140 over the gate electrode 120, a channel layer 150 over the layer of ferroelectric (FE) material 140, and source and drain electrodes 190 and 191 over the channel layer 150, where the channel layer 150 includes an oxide semiconductor material having a formula $M_xM'_yZn_zO$, where $0<(x, y, z)<1$, M is a first metal selected from the group consisting of indium (In) and tin (Sn) and combinations thereof, M' is a second metal selected from the group consisting of gallium (Ga), hafnium (Hf), zirconium (Zr), titanium (Ti), aluminum (Al), strontium (Sr), barium (Ba), scandium (Sc), magnesium (Mg), lanthanum (La), and gadolinium (Gd) and combinations thereof, and the channel layer 150 extends between a first surface 157 facing the layer of ferroelectric (FE) material 140, and a second surface 159 opposite the first surface 157 that contacts the source and drain electrodes 190 and 191, and the channel layer 150 includes a first region 152A adjacent to the first surface 157 that includes both the first metal, M, and the second metal, M', and the atomic percentages of the first metal, M, and the second metal, M', in the first region 152A are each greater than the atomic percentage of zinc in the first region 152A.

In another embodiment, the FeFET device 200 is a memory cell of an array 95 of memory cells.

In another embodiment, the layer of ferroelectric (FE) material 140 is under a tensile strain induced by at least one of (i) a lattice mismatch between a material of the layer of ferroelectric (FE) material 140 and a material of a stress layer 130 located between the gate electrode 120 and the layer of ferroelectric (FE) material 140, and (ii) a mismatch in the coefficient of thermal expansion (CTE) between a material of the layer of ferroelectric (FE) material 140 and a material of the gate electrode 120.

In another embodiment, the ferroelectric (FE) material layer 140 includes hafnium zirconium oxide (HZO), and an insulating layer 145 including silicon-doped hafnium oxide is located between the ferroelectric (FE) material layer 140 and the channel layer 150, and within an interface region 146 having a thickness of at least 2 nm located at an interface between the ferroelectric (FE) material layer 140 and the insulating layer 145, a ratio of the atomic percentage of oxygen to the atomic percentage of zirconium is at least 1, and a ratio of the atomic percentage of oxygen to the atomic percentage of hafnium is greater than one.

An additional embodiment is drawn to a method of fabricating a field effect transistor device 200 that includes forming a gate electrode 120, forming a gate dielectric layer 140, 145, and forming a channel layer 150, the gate dielectric layer 140, 145 located between the gate electrode 120 and the channel layer 150, where forming the channel layer 150 includes forming a first sublayer 152A of the channel layer 150 over the gate dielectric layer 140, 145, where the first sublayer 152A includes a first metal oxide material, MOx, and a second metal oxide material, M'Ox, where M is at least one of indium (In) and tin (Sn), and M' is at least one of gallium (Ga), hafnium (Hf), zirconium (Zr), titanium (Ti), aluminum (Al), strontium (Sr), barium (Ba), scandium (Sc), magnesium (Mg), lanthanum (La), and gadolinium (Gd), and forming a second sublayer 154A of the channel layer 150 over the first sublayer 152A, where the second sublayer 154A includes zinc oxide. The method further includes forming source and drain electrodes 190 and 191 over the channel layer 150.

In another embodiment, forming the channel layer 150 further includes forming an alternating stack of sublayers, where a first group of sublayers 152A, 152B, 152N of the alternating stack of sublayers include the first metal oxide material, MOx, and the second metal oxide material, M'Ox, and a second group of sublayers 154A, 154B, 154N of the alternating stack include zinc oxide, forming a final sublayer 156 of the channel layer 150 over the alternating stack, where the final sublayer 156 includes the second metal oxide material, M'Ox.

In another embodiment, forming the channel layer includes introducing a precursor mixture 901-1, 905-1, 907-1 including precursors containing the first metal, M, and the second metal, M', into an atomic layer deposition (ALD) reaction chamber to deposit the first sublayer 152A over the gate dielectric layer 140, 145, and introducing a precursor 903-1 containing zinc into the atomic layer deposition (ALD) reaction chamber to deposit the second sublayer 154A over the first sublayer 152A.

In another embodiment, the method further includes subjecting source and drain regions 176 and 177 of the channel layer 150 to a helium plasma treatment, where the source and drain electrodes 190, 191 are formed on the helium plasma treated source and drain regions 176 and 177 of the channel layer 150.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A field effect transistor device, comprising:
a gate electrode;
a source electrode;
a drain electrode;
a gate dielectric material; and
a channel layer, wherein the source electrode and the drain electrode contact the channel layer and the gate dielectric material is located between the gate electrode and the channel layer, and wherein the channel layer comprises an oxide semiconductor material having a formula $M_xM'_yZn_zO$ where $0<(x, y, z)<1$, M is a first metal selected from a group consisting of indium (In) and tin (Sn) and combinations thereof, M' is a second metal selected from a group consisting of gallium (Ga), hafnium (Hf), zirconium (Zr), titanium (Ti), aluminum (Al), strontium (Sr), barium (Ba), scandium (Sc), magnesium (Mg), lanthanum (La), and gadolinium (Gd) and combinations thereof, and the channel layer extends between a first surface contacting the gate dielectric material and a second surface opposite the first surface, and the channel layer comprises a first region adjacent to the first surface that comprises both the first metal, M, and the second metal, M', and atomic percentages of the first metal, M, and the second metal, M', in the first region are each greater than an atomic percentage of zinc in the first region, and the channel layer comprises a second region adjacent to the second surface that includes the second metal, M', and the atomic percentage of the second metal, M', in the second region is greater than the atomic percentages of either the first metal, M, or zinc in the second region.

2. The field effect transistor device of claim 1, wherein the channel layer comprises a third region between the first region and the second region, and the atomic percentage of zinc in the third region is greater than the atomic percentages of either the first metal, M, or the second metal, M', within the third region.

3. The field effect transistor device of claim 2, wherein the channel layer comprises an alternating stack of first sublayers and second sublayers between the first surface and the second surface, and wherein each of the first sublayers comprise the first metal, M, and the second metal, M', and each of the second sublayers comprise zinc, and in each of the first sublayers the atomic percentages of each of the first metal, M, and the second metal, M', is greater than the atomic percentage of zinc, and in each of the second sublayers the atomic percentage of zinc is greater than the atomic percentages of each of the first metal, M, and the second metal, M'.

4. The field effect transistor device of claim 1, wherein the gate dielectric material comprises a layer of ferroelectric (FE) material between the gate electrode and the channel layer.

5. The field effect transistor device of claim 4, wherein the ferroelectric (FE) material comprises a hafnium oxide-based ferroelectric material.

6. The field effect transistor device of claim 5, wherein the layer of ferroelectric (FE) material is under a tensile strain of between 1.5% and 3.0% in a direction that is parallel to a top and/or bottom surface of the layer of ferroelectric (FE) material.

7. The field effect transistor device of claim 4, further comprising an insulating layer between the layer of ferroelectric (FE) material and the channel layer, wherein the first region of the channel layer contacts the insulating layer.

8. The field effect transistor device of claim 7, wherein the insulating layer comprises a material having a larger band gap than the material of the channel layer, and a conduction band offset ($E_{CBO}$) and a valence band offset ($E_{VBO}$) between the material of the insulating layer and the material of the channel layer are each greater than 1 eV.

9. The field effect transistor device of claim 4, wherein the gate electrode is embedded in at least one of a semiconductor substrate and a dielectric material, the layer of ferroelectric (FE) material is located over the gate electrode, the channel layer is located over the layer of ferroelectric material, and the source and drain electrodes are located over the channel layer.

10. The field effect transistor device of claim 9, further comprising at least one of a stress layer and a ferroelectric material seed layer between the gate electrode and the layer of ferroelectric (FE) material.

11. The field effect transistor device of claim 1, wherein the channel layer comprises source and drain regions beneath the source and drain electrodes, respectively, and the channel layer further comprises oxygen-vacancy rich regions beneath each of the source and drain regions having a higher concentration of oxygen vacancies than the concentration of oxygen vacancies within a central region of the channel layer located between the oxygen-vacancy rich regions.

12. The field effect transistor device of claim 1, further comprising:
a capping layer contacting an upper surface of the channel layer, the capping layer comprising a metal material selected from calcium (Ca), aluminum (Al), hafnium (Hf), zirconium (Zr), titanium (Ti), tantalum (Ta), strontium (Sr), barium (Ba), scandium (Sc), magnesium (Mg), lanthanum (La), gadolinium (Gd), and combinations thereof; and a passivation layer contacting the upper surface of the channel layer and laterally surrounding the capping layer, where the passivation layer is located between the capping layer and the source and drain electrodes.

13. A ferroelectric field effect transistor (FeFET) device, comprising:

a gate electrode;

a layer of ferroelectric (FE) material over the gate electrode;

a channel layer over the layer of ferroelectric (FE) material; and source and drain electrodes over the channel layer, wherein the channel layer comprises an oxide semiconductor material having a formula $M_xM'_yZn_zO$ where $0<(x, y, z)<1$, M is a first metal selected from a group consisting of indium (In) and tin (Sn) and combinations thereof, M' is a second metal selected from a group consisting of gallium (Ga), hafnium (Hf), zirconium (Zr), titanium (Ti), aluminum (Al), strontium (Sr), barium (Ba), scandium (Sc), magnesium (Mg), lanthanum (La), and gadolinium (Gd) and combinations thereof, and the channel layer extends between a first surface facing the layer of ferroelectric (FE) material, and a second surface opposite the first surface that contacts the source and drain electrodes, and the channel layer comprises a first region adjacent to the first surface that comprises both the first metal, M, and the second metal, M', and atomic percentages of the first metal, M, and the second metal, M', in the first region are each greater than an atomic percentage of zinc in the first region.

14. The ferroelectric field effect transistor (FeFET) device of claim 13, wherein the FeFET device comprises a memory cell of an array of memory cells.

15. The ferroelectric field effect transistor (FeFET) device of claim 13, wherein the layer of ferroelectric (FE) material is under a tensile strain induced by at least one of (i) a lattice mismatch between a material of the layer of ferroelectric (FE) material and a material of a stress layer located between the gate electrode and the layer of ferroelectric (FE) material, and (ii) a mismatch in a coefficient of thermal expansion (CTE) between a material of the layer of ferroelectric (FE) material and a material of the gate electrode.

16. The ferroelectric field effect transistor (FeFET) device of claim 13, wherein the ferroelectric (FE) material layer comprises hafnium zirconium oxide (HZO), and an insulating layer comprising silicon-doped hafnium oxide is located between the ferroelectric (FE) material layer and the channel layer, and within an interface region having a thickness of at least 2 nm located at an interface between the ferroelectric (FE) material layer and the insulating layer, a ratio of an atomic percentage of oxygen to an atomic percentage of zirconium is at least 1, and a ratio of the atomic percentage of oxygen to an atomic percentage of hafnium is greater than one.

17. A method of fabricating a field effect transistor device, comprising:

forming a gate electrode;

forming a gate dielectric layer;

forming a channel layer, the gate dielectric layer located between the gate electrode and the channel layer, wherein forming the channel layer comprises:

forming a first sublayer of the channel layer over the gate dielectric layer, wherein the first sublayer comprises a first metal oxide material, $MO_x$, and a second metal oxide material, $M'O_x$, where M is at least one of indium (In) and tin (Sn), and M' is at least one of gallium (Ga), hafnium (Hf), zirconium (Zr), titanium (Ti), aluminum (Al), strontium (Sr), barium (Ba), scandium (Sc), magnesium (Mg), lanthanum (La), and gadolinium (Gd); and forming a second sublayer of the channel layer over the first sublayer, wherein the second sublayer comprises zinc oxide; and forming source and drain electrodes over the channel layer.

18. The method of claim 17, wherein forming the channel layer further comprises:

forming an alternating stack of sublayers, wherein a first group of sublayers of the alternating stack of sublayers comprise the first metal oxide material, $MO_x$, and the second metal oxide material, $M'O_x$, and a second group of sublayers of the alternating stack comprises zinc oxide; and forming a final sublayer of the channel layer over the alternating stack, wherein the final sublayer comprises the second metal oxide material, $M'O_x$.

19. The method of claim 17, wherein forming the channel layer comprises:

introducing a precursor mixture including precursors containing a first metal, M, and a second metal, M', into an atomic layer deposition (ALD) reaction chamber to deposit the first sublayer over the gate dielectric layer; and introducing a precursor containing zinc into the atomic layer deposition (ALD) reaction chamber to deposit the second sublayer over the first sublayer.

20. The method of claim 17, further comprising:

subjecting a source region and a drain region of the channel layer to a helium plasma treatment, wherein a source electrode and a drain electrode are each formed on a helium plasma treated source region and a helium plasma treated drain region of the channel layer.

* * * * *